United States Patent
Schafer et al.

(10) Patent No.: US 10,275,563 B2
(45) Date of Patent: Apr. 30, 2019

(54) SYSTEM AND METHOD FOR MODELING A LIGHTING CONTROL SYSTEM

(71) Applicant: Crestron Electronics, Inc., Rockleigh, NJ (US)

(72) Inventors: William Schafer, Hewitt, NJ (US); Evan Robert Ackmann, Hoboken, NJ (US); Doug Jacobson, Oradell, NJ (US); Nathan Dietrich, River Vale, NJ (US); Dennis Stanisljevic, Little Ferry, NJ (US); Claudia Barbiero, Emerson, NJ (US)

(73) Assignee: CRESTRON ELECTRONICS, INC., Rockleigh, NJ (US)

( * ) Notice: Subject to any disclaimer, the term of this patent is extended or adjusted under 35 U.S.C. 154(b) by 833 days.

(21) Appl. No.: 14/862,761

(22) Filed: Sep. 23, 2015

(65) Prior Publication Data

US 2016/0180016 A1    Jun. 23, 2016

Related U.S. Application Data

(60) Provisional application No. 62/054,197, filed on Sep. 23, 2014, provisional application No. 62/056,261, filed on Sep. 26, 2014.

(51) Int. Cl.
| | |
|---|---|
| *G06G 7/48* | (2006.01) |
| *G06F 17/50* | (2006.01) |
| *G06Q 30/06* | (2012.01) |
| *G05B 17/02* | (2006.01) |
| *H05B 37/02* | (2006.01) |

(52) U.S. Cl.
CPC ......... *G06F 17/5086* (2013.01); *G05B 17/02* (2013.01); *G06F 17/5004* (2013.01); *G06Q 30/0611* (2013.01); *H05B 37/029* (2013.01); *H05B 37/0272* (2013.01)

(58) Field of Classification Search
None
See application file for complete search history.

(56) References Cited

U.S. PATENT DOCUMENTS

| | | | | |
|---|---|---|---|---|
| 4,885,694 A | * | 12/1989 | Pray | G06F 17/5004 705/400 |
| 7,333,944 B1 | * | 2/2008 | Harris | G06Q 30/00 705/26.43 |
| 7,818,399 B1 | | 10/2010 | Ross, Jr. et al. | |
| 9,251,480 B2 | * | 2/2016 | Faragoi, Jr. | G06Q 10/06 |

(Continued)

*Primary Examiner* — Aniss Chad
*Assistant Examiner* — Nithya J. Moll
(74) *Attorney, Agent, or Firm* — Crestron Electronics, Inc.

(57) ABSTRACT

A system and method for modeling a lighting control system for an enterprise is provided comprising an application (App) on a mobile device, or laptop, or personal computer, or other like device, that can communicate electronically with a webpage accessible by the internet or local area network or wide area network, wherein the webpage represents a program, and the program provides for the receiving, storing, and processing of lighting control system specified information on a space-by-space basis, and further wherein a unique part number for the space-based lighting control system can be generated for the particular space, such that delivery of individual, but substantially integrated space-based lighting control systems, can be delivered to the spaces for installation in the enterprise location.

29 Claims, 42 Drawing Sheets

(56) References Cited

U.S. PATENT DOCUMENTS

| | | | | |
|---|---|---|---|---|
| 2006/0058923 A1* | 3/2006 | Kruk | .................... | G05B 19/042 |
| | | | | 700/275 |
| 2010/0142535 A1* | 6/2010 | Swainston | .......... | H04L 12/2809 |
| | | | | 370/395.3 |
| 2011/0137667 A1* | 6/2011 | Faragoi, Jr. | ............ | G06Q 10/06 |
| | | | | 705/1.1 |
| 2015/0331969 A1* | 11/2015 | Dahlen | .................. | G06F 17/50 |
| | | | | 703/1 |

* cited by examiner

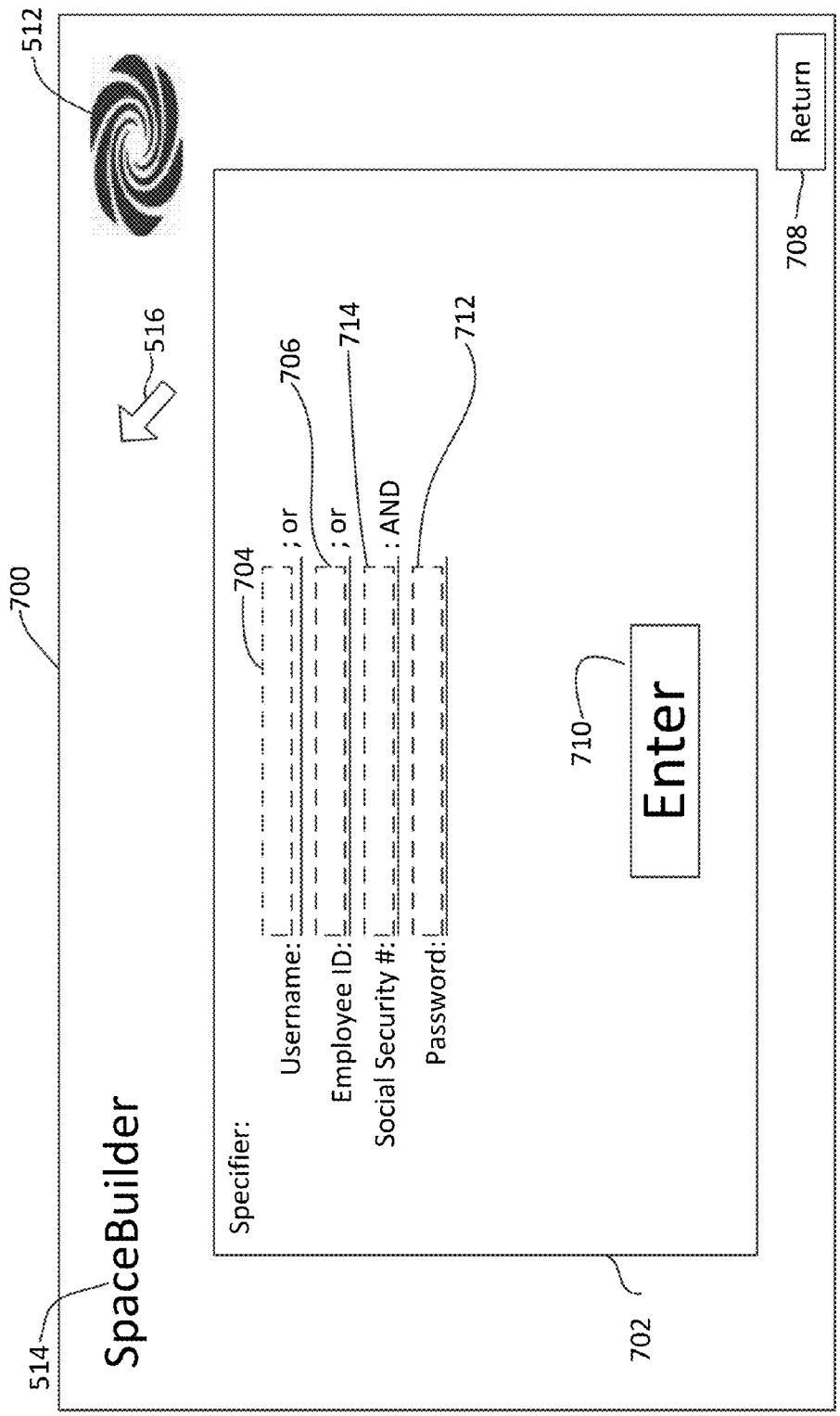

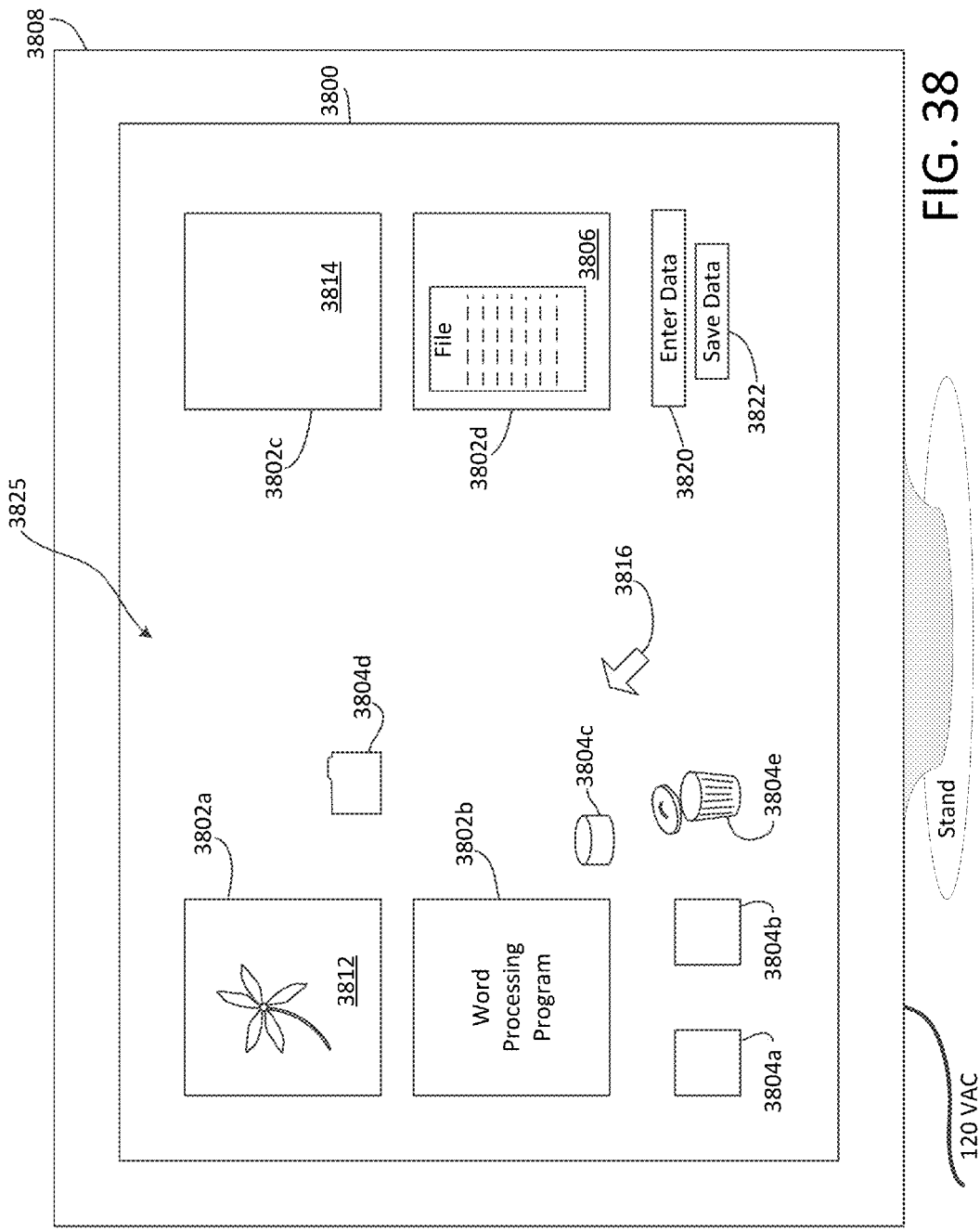

SYSTEM AND METHOD FOR MODELING A LIGHTING CONTROL SYSTEM

CROSS REFERENCE TO RELATED APPLICATIONS

Related subject matter is disclosed in co-pending U.S. Non-provisional patent application Ser. No. 14/862,799, filed 23 Sep. 2015 (Client-Matter No.: CP00313-03), and co-pending U.S. Non-provisional patent application Ser. No. 14/862,864, filed 23 Sep. 2015 (Client-Matter No.: CP00313-04), the entire contents of both of which are expressly incorporated herein by reference.

PRIORITY INFORMATION

The present application claims priority under 35 U.S.C. § 119(e) to U.S. Provisional Patent Application Ser. No. 62/054,197, filed Sep. 23, 2014, and to U.S. Provisional Patent Application Ser. No. 62/056,261, filed Sep. 26, 2014, the entire contents of both of which are expressly incorporated herein by reference.

BACKGROUND OF THE INVENTION

Technical Field

Aspects of the embodiments relate generally to automated specification generation. More specifically, aspects of the embodiments relate to modeling a lighting control system, generating a specification thereof, and delivering the modeled lighting control system to a user thereof.

Background Art

The specification, purchase, and installation of lighting systems in commercial and residential environments can be expensive, and can make the difference between an environment that suits its intended purpose well, or which fails miserably. That is, even if the space is designed as well as it can be, even if it has the most modern conveniences, the perfect furniture, and the most up-to-date computer network technology, and so on, if the lighting is bad, people will be miserable in it, and won't want to be there. Aside from poor HVAC conditions, nothing so frustrates occupants of a commercial or residential space as poor lighting, especially after a significant amount of money has gone into the purchase of a lighting control system. As those of skill in the art can appreciate, lighting control systems include, but are not limited to, the actual lights themselves, the manual or automated control thereof, shading (including shades or curtains), and a system that integrates control of those items, and is tied into the heating/cooling of the same space. Thus, those of skill in the art consider a properly designed lighting control system to be of paramount importance especially when considering the costs of the systems involved, and the overall importance to acceptability of the environment. Thus, the lighting control system needs to be specified, delivered, and installed properly, and be integrated with other systems of the enterprise location.

In addition, a well designed, manufactured, and installed lighting control system is paramount in supporting a life safety code compliant building. As those of skill in the art can appreciate, life safety codes are used as a source for strategies to protect people based on building construction, protection, and occupancy features that minimize the effects of fire and related hazards. As those of skill in the art can appreciate, customers of lighting control systems are very concerned with meeting energy and life safety codes as well as the environmental conditions described above.

Currently, enterprise lighting control systems are specified according to the entire building. These building-wide solutions require a custom submittal and large lighting cabinets which leads to longer startup times and long submittal process.

Additionally, devices are currently delivered with no coordination. Devices required for a certain area may arrive in multiple shipments, in shipments with devices for other areas, or in shipments earlier or later than needed. This may cause confusion to installers and misplaced items. A typical scenario can include the following: a lighting control system is specified for an enterprise that includes several floors of a building, and within each floor there are numerous rooms, of various sizes. Each of the rooms constitute a single space and a single zone, but several rooms are so large that they have two, three or even four zones (e.g., a meeting room, or dance hall). In the conventional manner of ordering lighting control systems, the specifier creates a large bill of materials that, even if automated, creates a substantially large parts list. Even if the parts list is broken into individual parts (e.g., ten of part A, 20 of part B, and so on), all of these components, whether segregated by part number or not, are delivered to one central location. Installers would then go to the central location, and pull the parts that their line and installation drawings tell them that they need, and parts that are not currently being used are cast aside, mishandled, lost, stolen, broken, damaged, and so on. Waste and delays occur, and this wastes time and direct costs of money. In the conventional manner of specifying, ordering, delivering, and installing of lighting control systems, substantial problems abound.

In certain installations, users desire a simpler process where costs can be minimized, waste can be minimized, and installation times lowered.

Thus, there is a need for an improved system and method for modeling, specifying, ordering, delivering, and installing, among other steps, a lighting control system.

SUMMARY OF THE INVENTION

It is to be understood that both the general and detailed descriptions that follow are explanatory only and are not restrictive of the embodiments.

The aspects of the embodiments described herein seek to overcome or at least ameliorate one or more of several problems discussed and described in detail above.

DISCLOSURE OF INVENTION

According to a first aspect of the embodiments, a computer implemented method is provided for specifying two or more lighting control systems (LCS) by a specifier of an enterprise location, the enterprise location including two or more spaces, the method comprising (a) receiving log-in information from the specifier at a first server on a webpage, (b) verifying an identity of the specifier using the received log-in information, (c) receiving enterprise location job information from the specifier, (d) receiving a space number from the specifier, wherein the space number represents a selected space of the two or more total number of spaces of the enterprise location, (e) receiving a controller type part number for the selected space as specified by the specifier, wherein the controller is adapted to control at least one of one or more of zones of the selected space of the enterprise location, (f) receiving a plurality of additional part numbers each of which corresponds to a plurality of additional components that can be used with the controller type, as specified by the specifier, and wherein each of the plurality of options represents a plurality of additional components for the selected space, and further wherein each of the plurality of options are entered separately and independently of each other option, and still further wherein each of the plurality of additional components is adapted to provide additional lighting features for the selected space of the enterprise location, (g) generating a unique LCS space specification part number based, in part, on the received controller type part number, the received space number of the selected space, and the plurality of options that represent the plurality of additional components, (h) repeating each of steps (d)-(g) for each of the total number of spaces of the enterprise location, and (i) creating a job specification package, wherein the job specification package can be used to separately package, by a packaging entity, each of the two or more lighting control systems for the selected two or more spaces of the enterprise location, and further wherein the job specification package can be used to separately deliver, by a delivery entity, each of the two or more lighting control systems for the selected two or more spaces of the enterprise location to the respective spaces of the enterprise location.

According to the first aspect of the embodiments, the job specification package can be further used to quote, order, invoice, and install the lighting control systems for the selected spaces of the enterprise location, and the step of verifying an identity of the specifier comprises using an identity verification application that accesses one or more of additional websites, and databases stored in one or more different servers to determine the identity of the specifier.

According to the first aspect of the embodiments, the enterprise location job information comprises one or more of an enterprise name and address, a job number, agent name, job location, specifier contact information, architect information, electrical engineer information, lighting designer information, and electrical contractor information. Still further according to the first aspect of the embodiments, the step of creating the job specification packages comprises creating a cover sheet, creating a summary bill of materials section, creating an LCS space specification part number section that lists each of the two or LCS space specification part numbers for each of the two or more spaces of the enterprise location, creating a line drawing section for each of the two or more spaces of the enterprise location, creating a construction specifications institute section (CSI) for each of the two or more spaces of the enterprise location, creating a sequence of operations section for each of the two or more spaces of the enterprise location, creating a cut sheets section for each of the two or more spaces of the enterprise location, wherein for each of the steps of creating sections of the job specification package a computer based word processing application is used, and merging each of the respective sections according to a predetermined order into a single job specification package document.

According to the first aspect of the embodiments, the method further comprises saving and printing the job specification package, and the step of creating a bill of materials comprises creating a list of parts as determined by the respective LCS space specification part number, wherein the LCS space specification part number is uniquely associated with a specific one of a plurality of spaces of the enterprise location, such that a substantially complete list of parts for the respective space can be uniquely identified for the space, and can be purchased, programmed, assembled, packaged, and delivered for and to the space.

According to the first aspect of the embodiments, the LCS space specification part number uniquely identifies the physical space of the enterprise location to which it is associated, and the line drawing section of the job specification package comprises a unique line drawing for each of the two or more spaces of the enterprise location, wherein the line drawing illustrates locations of installation of each of the components of the lighting control system, any changes to or installation of power wiring of the space, any changes to or installation of control wiring of the space.

According to the first aspect of the embodiments, the sequence of operations section of the job specification package comprises an order of installation of the parts for the respective space to which it is associated, and the cuts sheet section comprises a list and description thereof of one or more features of a components that is specified in the unique LCS space specification part number.

Still further according to the first aspect of the embodiments, the method further comprises (j) receiving the web-page created job specification package by an LCS manufacturer as an order, and wherein the LCS manufacturer uses the web-page created job specification package to manufacture the specified LCS, as specified in the LCS space specification part number, to deliver the specified LCS, and to invoice a customer of the specified LCS, and further wherein the web-page created job specification package can be used by a project management tool of the LCS manufacturer, wherein the project management tool is adapted to access one or more of a plurality of databases created and modified as the LCS specified by the LCS space specification part number proceeds from a first of a plurality of steps of specification of the LCS, to delivery to a customer, and a last step of payment by the customer.

According to the first aspect of the embodiments, the method still further comprises (k) receiving a zone number from the specifier for the space number (608), wherein the zone number represents a selected zone of one or more total number of zones for the received space number, and wherein the zone number becomes part of the LCS space specification part number.

According to a second aspect of the embodiments, a computer implemented method is provided for providing a lighting control system (LCS) to two or more spaces of an enterprise is provided, the method comprising specifying the LCS for at least two spaces of the two or more spaces of the enterprise to create a set of components for each of the at least two spaces, wherein each of a first and second set of components is identifiable by a unique space specification part number, programming one or more of a plurality of LCS controllers to control one or more of the components of the set of components for the at least two spaces, packaging separately each of the sets of the components for the at least two spaces; and delivering separately each of the packaged sets of components to the at least two spaces.

According to the second aspect of the embodiment, the method further comprises installing the packaged set of components at the respective spaces, and the step of specifying comprises creating the unique space specification part number based on the set of components specified for the space, such that a unique set of LCS components can be assembled, programmed, packaged, and shipped directly to the unique space.

According to the second aspect of the embodiments, the method further comprises performing additional design of one or more of the components of the LCS, and the additional design comprises modifying one or more components according to additional requirements of the at least one space.

According to a third aspect of the embodiments, a computer implemented method for managing quotation, purchase, and installation of a lighting control system (LCS) for a selected space of at least two spaces of an enterprise is provided, the method comprising accessing an LCS procurement website by one of a specifier, agent, and LCS manufacturing representative, using a specification tool by one of the specifier, agent, and LCS manufacturing representative, wherein the specification tool is adapted to create a unique space-centric LCS part number for each of the two or more spaces of the enterprise location, and accessing a quotation tool by one of the agent and LCS manufacturing representative, wherein the quotation tool is adapted to provide a price quotation for the specified space-centric LCS part number, and is further adapted to provide access to an already provided price quotation.

According to third aspect of the embodiments, the step of using the specification tool comprises providing a controller type part number for the selected zone as specified by the specifier, wherein the controller is adapted to control the selected zone of the selected space, and providing a plurality of additional part numbers each of which corresponds to one of a plurality of additional components that can be used with the controller type, as specified by the specifier, and wherein each of the plurality of options represents a plurality of additional components for the selected space, and further wherein each of the plurality of options are entered separately and independently of each other option, and still further wherein each of the plurality of additional components is adapted to provide additional lighting features for the selected zone of the selected space.

According to the third aspect of the embodiments, the step of accessing a quotation tool comprises (a) determining that a new quotation is to be developed, (b) entering enterprise location job information into the quotation tool accessible on the LCS procurement website, (c) entering or finding the unique space-centric LCS part number, and then selecting the same, (d) entering a quantity of the unique space-centric LCS part number to be quoted, (e) determining if additional spaces need to be quoted, (f) finalizing the quotation such that a final price for the quantity of unique space-centric LCS part numbers can be provided, and (g) repeating steps (c) through (f) for each of the two or more spaces of the enterprise location.

According to the third aspect of the embodiments, the method further comprises accessing a design tool by the LCS manufacturing representative, wherein the design tool is adapted to create changes to one or more of one or more components that make up the specified LCS as uniquely identified by the space-centric LCS part number prior to being shipped to the specified space. Still further according to the third aspect of the embodiments, the changes comprise adding a program to control one or more of one or more controllers that are specified in the space-centric LCS part numbers.

According to the third aspect of the embodiments, the method further comprises accessing a project management tool by the LCS manufacturing representative, wherein the project management tool is adapted to access one or more of a plurality of databases created and modified as the LCS specified by the space-centric LCS part number proceeds from a first of a plurality of steps of specification of the LCS, to delivery to a customer, and a last step of payment by the customer.

According to a fourth aspect of the embodiments, a system is provided for specifying two or more lighting control systems (LCS) by a specifier of an enterprise location, the enterprise location including two or more spaces, the system comprising at least two or more computers, each of the two or more computers being network accessible, and wherein a first computer of the two or more computers includes a SpaceBuilder application that is accessible by the second computer through the network, and further wherein the SpaceBuilder application is adapted to (a) receive log-in information from the specifier through a specification tool webpage, (b) verify an identity of the specifier, (c) receive enterprise location job information from the specifier, (d) receive a space number from the specifier, wherein the space number represents a selected space of the two or more total number of spaces of the enterprise location, (e) receive a controller type part number for the selected space as specified by the specifier, wherein the controller is adapted to control at least one of one or more of zones of the selected space of the enterprise location, (f) receive a plurality of additional part numbers each of which corresponds to a plurality of additional components that can be used with the controller type, as specified by the specifier, and wherein each of the plurality of options represents a plurality of additional components for the selected space, and further wherein each of the plurality of options are entered separately and independently of each other option, and still further wherein each of the plurality of additional components is adapted to provide additional lighting features for the selected space of the enterprise location, (g) generate and store a unique LCS space specification part number based, in part, on the received controller type part number, the received space number of the selected space, and the plurality of options that represent the plurality of additional components, (h) repeat each of (d)-(g) for each of the total number of spaces of the enterprise location, and (i) create a job specification package to be used to deliver the two or more lighting control systems for the selected two or more spaces of the enterprise location to respective spaces of the enterprise location.

According to the fourth aspect of the embodiments, the job specification package created by the job specification tool can be further used to order and invoice the lighting control systems for the selected spaces of the enterprise location via other components of the job specification tool and SpaceBuilder application, and the job specification package can be used to install the lighting control systems for the selected spaces of the enterprise location.

According to the fourth aspect of the embodiments, the job specification tool is further adapted to use an identity verification application that accesses one or more additional websites and respective webpages to determine the identity of the specifier, and the enterprise location job information comprises one or more of an enterprise name and address, a job number, agent name, job location, specifier contact information, architect information, electrical engineer information, lighting designer information, and electrical contractor information.

According to the fourth aspect of the embodiments, the job specification tool is further adapted, when creating the job specification package, to create a cover sheet, create a summary bill of materials section, create an LCS space specification part number section that lists each of the two or LCS space specification part numbers for each of the two or more spaces of the enterprise location, create a line drawing section for each of the two or more spaces of the enterprise location, create a construction specifications institute section (CSI) for each of the two or more spaces of the enterprise location, create a sequence of operations section for each of the two or more spaces of the enterprise location, create a cut sheets section for each of the two or more spaces of the enterprise location, wherein for each of the processes of creating sections of the job specification package a computer based word processing application is used, and wherein the job specification tool is further adapted to merge each of the respective sections according to a predetermined order into a single job specification package document.

According to the fourth aspect of the embodiments, the job specification tool is further adapted to save and print the job specification package, and, when creating a bill of materials, to create a list of parts as determined by the respective LCS space specification part number, wherein the LCS space specification part number is uniquely associated with a specific one of a plurality of spaces of the enterprise location, such that a substantially complete list of parts for the respective space can be uniquely identified for the space, and can be purchased, assembled, and delivered for and to the space.

According to the fourth aspect of the embodiments, the LCS space specification part number uniquely identifies the physical space of the enterprise location to which it is associated, and the line drawing section of the job specification package comprises a unique line drawing for each of the two or more spaces of the enterprise location, wherein the line drawing illustrates locations of installation of each of the components of the lighting control system, any changes to or installation of power wiring of the space, any changes to or installation of control wiring of the space.

According to the fourth aspect of the embodiments, the sequence of operations section of the job specification package comprises an order of installation of the parts for the respective space to which it is associated, and the cuts sheet section comprises a list and description thereof of one or more features of a components that is specified in the unique LCS space specification part number.

According to the fourth aspect of the embodiments, the SpaceBuilder application is further adapted to (j) receive the web-page created job specification package by an LCS manufacturer as an order, and wherein the LCS manufacturer uses the web-page created job specification package to manufacture the specified LCS, as specified in the LCS space specification part number, to deliver the specified LCS, and to invoice a customer of the specified LCS, and further wherein the web-page created job specification package can be used by a project management tool of the LCS manufacturer that is part of the SpaceBuilder application, wherein the project management tool is adapted to access one or more of a plurality of databases created and modified as the LCS specified by the LCS space specification part number proceeds from a first of a plurality of steps of specification of the LCS, to delivery to a customer, and a last step of payment by the customer.

According to the fourth aspect of the embodiments, the job specification tool is further adapted to (k) receive a zone number from the specifier for the space number, wherein the zone number represents a selected zone of one or more total number of zones for the received space number, and wherein the zone number becomes part of the LCS space specification part number, and further wherein the network is the Internet. Still further according to the fourth aspect of the embodiments, the SpaceBuilder application further comprises a quotation tool for use by one or more of an agent and factory representative, wherein the quotation tool is in the form of an application accessible via the SpaceBuilder webpage, as a separate webpage, and wherein the quotation tool is adapted to access and utilize the job specification package and the information contained therein stored on the SpaceBuilder server via the Network, and create a quotation document that illustrates a cost for each LCS that is part of the job specification package, a design tool for use by a factory representative, wherein the design tool is in the form of one or more applications accessible via the SpaceBuilder webpage, as separate webpages, and wherein the design tool is adapted to is adapted to access and utilize the job specification package and the information contained therein stored on the SpaceBuilder server via the Network, and create, if necessary, design modification to one or more of the components of one or more of the LCSs that are part of the job specification package, and a project management tool for use by a factory representative, wherein the project management tool is in the form of one or more applications accessible via the SpaceBuilder webpage, as separate webpages, and wherein the project management tool is adapted to access and utilize the job specification package and the information contained therein, as well as information provided by the design tool and quotation tool that is stored on the SpaceBuilder server via the Network, and wherein the project management tool is adapted to According to a fifth aspect of the embodiments, a system is provided for specifying a lighting control system (LCS) to two or more spaces of an enterprise, the system comprising at least two or more computers, each of the two or more computers being network accessible, and wherein a first computer of the two or more computers includes a SpaceBuilder application that is accessible by the second computer through the network, and further wherein the SpaceBuilder application is adapted to specify the LCS for at least two spaces of the two or more spaces of the enterprise to create a set of components for each of the at least two spaces, wherein each of a first and second set of components is identifiable by a unique space specification part number, program one or more of a plurality of LCS controllers to control one or more of the components of the set of components for the at least two spaces, create separate package lists for each of the sets of the components for the at least two spaces, and create a separate delivery order for each of the packaged sets of components to the at least two spaces.

According to the fifth aspect of the embodiments, the SpaceBuilder application is further adapted to create a set of installation instructions for each of the packaged set of components at the respective spaces, and create the unique space specification part number based on the set of components specified for the space, such that a unique set of LCS components can be assembled, packaged, and shipped directly to the unique space.

According to the fifth aspect of the embodiments, the SpaceBuilder application is further adapted to perform additional design of one or more of the components of the LCS, and the additional design comprises a modification of one or more components according to additional requirements of the at least one space, and further wherein the network is the Internet.

According to a sixth aspect of the embodiments, a system is provided for managing purchase and installation of a lighting control system (LCS) for a selected space of at least two spaces of an enterprise, the system comprising at least two or more computers, each of the two or more computers being network accessible, and wherein a first computer of the two or more computers includes a SpaceBuilder application that is accessible by the second computer through the network, and further wherein the SpaceBuilder application is adapted to provide access for use by one or more of a specifier, agent, and LCS manufacturing representative to an LCS procurement website, provide access for use by one or more of the specifier, agent, and LCS manufacturing representative to a specification tool, wherein the specification tool is adapted to create a unique space-centric LCS part number for each of the two or more spaces of the enterprise location, and provide access for use by one or more of the agent and LCS manufacturing representative to a quotation tool, wherein the quotation tool is adapted to provide a price quotation for the specified space-centric LCS part number, and is further adapted to provide access to an already provided price quotation.

According to the sixth aspect of the embodiments, the SpaceBuilder application is further adapted to provide a controller type part number for the selected zone as specified by the specifier, wherein the controller is adapted to control the selected zone of the selected space, and wherein the SpaceBuilder application is still further adapted to provide a plurality of additional part numbers each of which corresponds to one of a plurality of additional components that can be used with the controller type, as specified by the specifier, and wherein each of the plurality of options represents a plurality of additional components for the selected space, and further wherein each of the plurality of options are entered separately and independently of each other option, and still further wherein each of the plurality of additional components is adapted to provide additional lighting features for the selected zone of the selected space.

According to the sixth aspect of the embodiments, wherein, in use of the quotation tool, the SpaceBuilder application is further adapted to (a) determine that a new quotation is to be developed, (b) receive enterprise location job information into the quotation tool accessible on the LCS procurement website, (c) enter or find the unique space-centric LCS part number, and then select the same, (d) enter a quantity of the unique space-centric LCS part numbers to be quoted, (e) determine if additional spaces need to be quoted, (f) finalize the quotation such that a final price for the quantity of unique space-centric LCS part numbers can be provided, and (g) repeat processes (c) through (f) for each of the two or more spaces of the enterprise location.

According to the sixth aspect of the embodiments, the SpaceBuilder application is further adapted to provide access to and use by the LCS manufacturing representative to a design tool, wherein the design tool is adapted to create changes to one or more of one or more components that make up the specified LCS as uniquely identified by the space-centric LCS part number prior to being shipped to the specified space, and wherein the changes comprise adding a program to control one or more of one or more controllers that are specified in the space-centric LCS part numbers.

According to the sixth aspect of the embodiments, the SpaceBuilder application is further adapted to provide access to and use by an LCS manufacturing representative to a project management tool, wherein the project management tool is adapted to access one or more of a plurality of databases created and modified as the LCS specified by the space-centric LCS part number proceeds from a first of a plurality of steps of specification of the LCS, to delivery to a customer, and a last step of payment by the customer, and further wherein the network is the Internet.

According to a seventh aspect of the embodiments, a non-transitory computer-readable medium is provided for specifying two or more lighting control systems (LCS) by a specifier of an enterprise location, the enterprise location including two or more spaces, comprising instructions stored on one or more computers that when executed on one or more processors associated with the one or more computers, perform (a) receiving log-in information from the specifier at a first server on a webpage, (b) verifying an identity of the specifier using the received log-in information, (c) receiving enterprise location job information from the specifier, (d) receiving a space number from the specifier, wherein the space number represents a selected space of the two or more total number of spaces of the enterprise location, (e) receiving a controller type part number for the selected space as specified by the specifier, wherein the controller is adapted to control at least one of one or more of zones of the selected space of the enterprise location, (f) receiving a plurality of additional part numbers each of which corresponds to a plurality of additional components that can be used with the controller type, as specified by the specifier, and wherein each of the plurality of options represents a plurality of additional components for the selected space, and further wherein each of the plurality of options are entered separately and independently of each other option, and still further wherein each of the plurality of additional components is adapted to provide additional lighting features for the selected space of the enterprise location, (g) generating a unique LCS space specification part number based, in part, on the received controller type part number, the received space number of the selected space, and the plurality of options that represent the plurality of additional components, (h) repeating each of steps (d)-(g) for each of the total number of spaces of the enterprise location, and (i) creating a job specification package, wherein the job specification package can be used to separately package, by a packaging entity, each of the two or more lighting control systems for the selected two or more spaces of the enterprise location, and further wherein the job specification package can be used to separately deliver, by a delivery entity, each of the two or more lighting control systems for the selected two or more spaces of the enterprise location to the respective spaces of the enterprise location, and wherein the one or more computers are connected to a network.

According to an eighth aspect of the embodiments, a non-transitory computer-readable medium is provided for providing a lighting control system (LCS) to two or more spaces of an enterprise, comprising instructions stored on one or more computers that when executed on one or more processors associated with the one or more computers, perform specifying the LCS for at least two spaces of the two or more spaces of the enterprise to create a set of components for each of the at least two spaces, wherein each of a first and second set of components is identifiable by a unique space specification part number, programming one or more of a plurality of LCS controllers to control one or more of the components of the set of components for the at least two spaces, packaging separately each of the sets of the components for the at least two spaces, and delivering separately each of the packaged sets of components to the at least two spaces, and wherein the one or more computers are connected to a network.

According to a ninth aspect of the embodiments, a non-transitory computer readable medium is provided for managing purchase and installation of a lighting control system (LCS) for a selected space of at least two spaces of an enterprise, comprising instructions stored on one or more computers, that when executed on one or more processors associated with the computers, perform accessing an LCS procurement website by one of a specifier, agent, and LCS manufacturing representative, using a specification tool by one of the specifier, agent, and LCS manufacturing representative, wherein the specification tool is adapted to create a unique space-centric LCS part number for each of the two or more spaces of the enterprise location, and accessing a quotation tool by one of the agent and LCS manufacturing representative, wherein the quotation tool is adapted to provide a price quotation for the specified space-centric LCS part number, and is further adapted to provide access to an already provided price quotation, and wherein the one or more computers are connected to a network.

According to a tenth aspect of the embodiments, a system and method for modeling a lighting control system for an enterprise is provided comprising an application (App) on a mobile device, or laptop, or personal computer, or other like device, that can communicate electronically with a webpage accessible by the internet or local area network or wide area network, wherein the webpage represents a program, and the program provides for the receiving and storing and processing of lighting control system specified information on a space-by-space basis, and further wherein a unique part number for the space-based lighting control system can be generated for the particular space, such that delivery of individual, but substantially integrated space-based lighting control systems can be delivered to the spaces for installation in the enterprise location.

According to the tenth aspect of the embodiments, the method for modeling a lighting control system for an enterprise can further embody a manual set of forms for storing lighting control system specified information on a space-by-space basis, and further wherein a unique part number for the space-based lighting control system can be generated for the particular space, such that delivery of individual, but substantially integrated space-based lighting control systems can be delivered to the spaces for installation in the enterprise location.

BRIEF DESCRIPTION OF DRAWINGS

The above and other objects and features of the embodiments will become apparent and more readily appreciated from the following description of the embodiments with reference to the following figures. Different aspects of the embodiments are illustrated in reference figures of the drawings. It is intended that the embodiments and figures disclosed herein are to be considered to illustrative rather than limiting. The components in the drawings are not necessarily drawn to scale, emphasis instead being placed upon clearly illustrating the principles of the aspects of the embodiments. In the drawings, like reference numerals designate corresponding parts throughout the several views.

BRIEF DESCRIPTION OF THE SEVERAL VIEWS OF THE DRAWING

Figure 1:
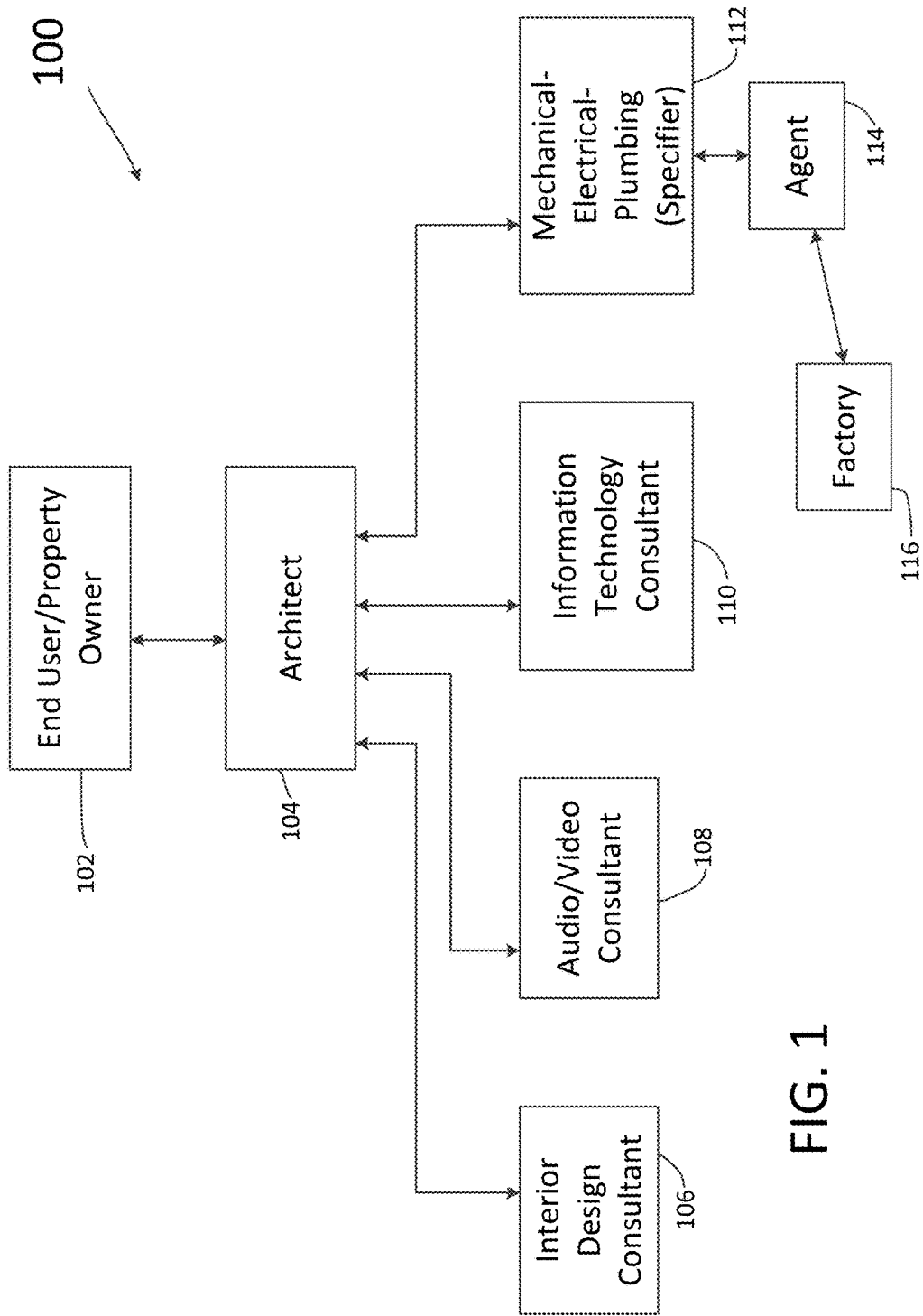

FIG. 1 illustrates a block diagram of several of the entities involved in specifying various systems of an enterprise space.

Figure 2:
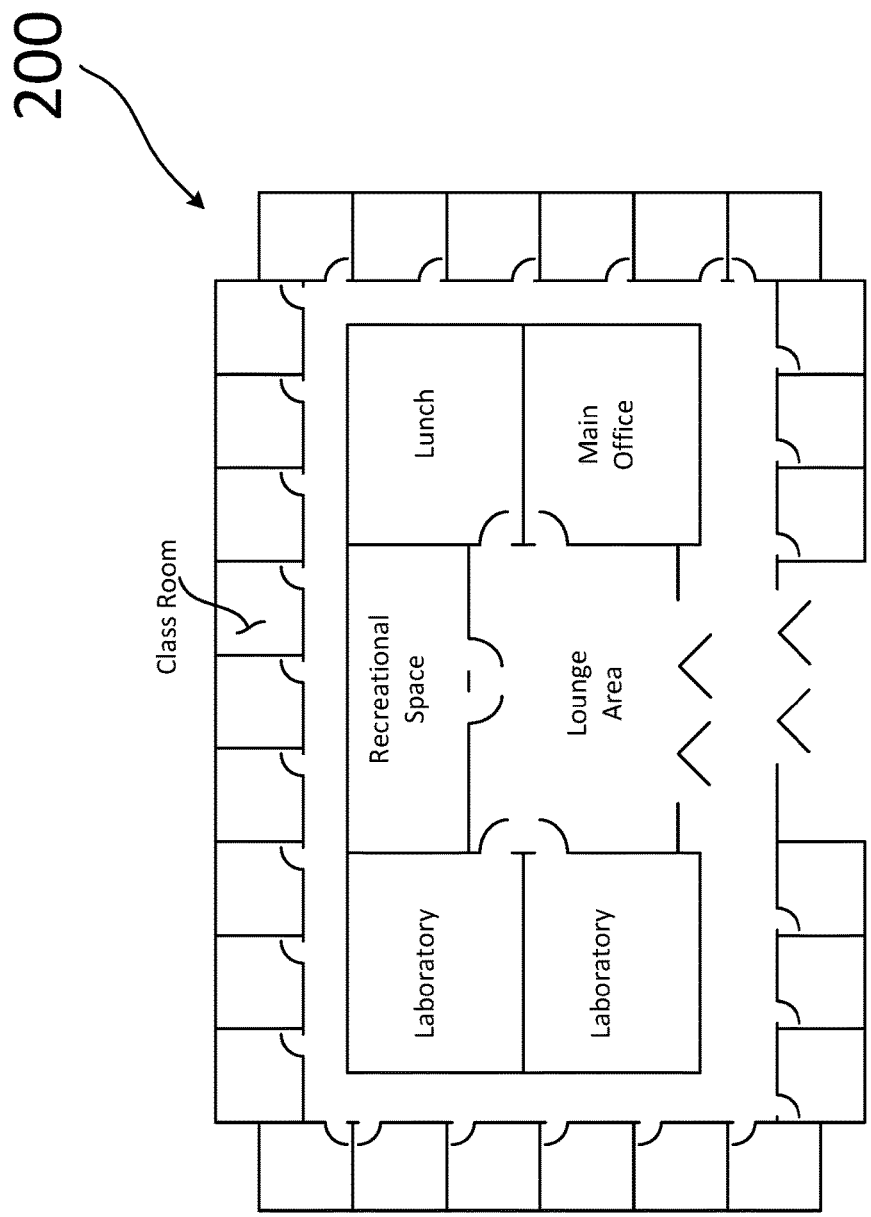

FIG. 2 illustrates a typical building layout that can be used by the entities of FIG. 1 for specifying different aspects of the building, including a lighting control system.

Figure 3:
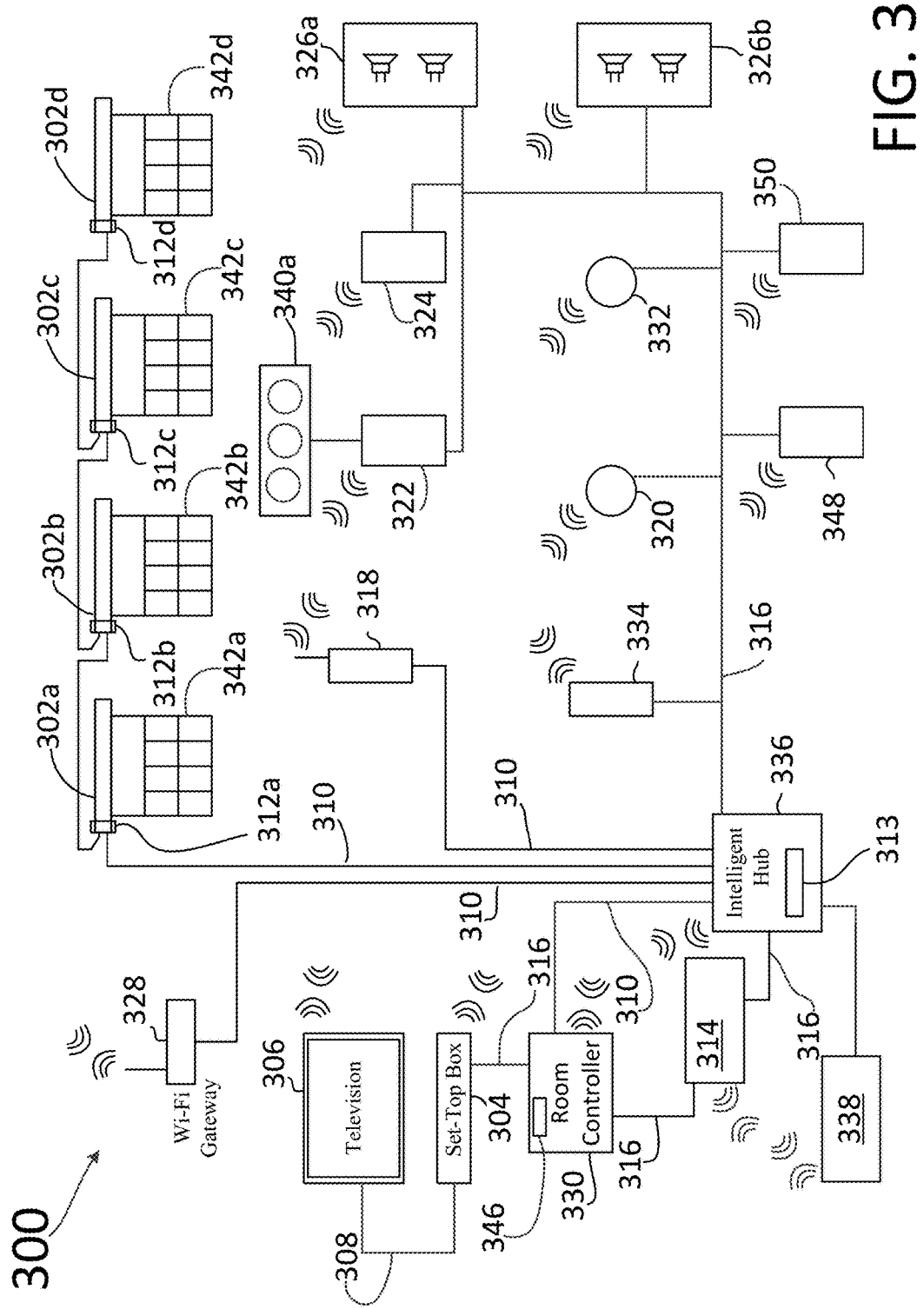

FIG. 3 illustrates a lighting control system that can be specified in accordance with the different aspects of the embodiments described herein.

Figure 4:
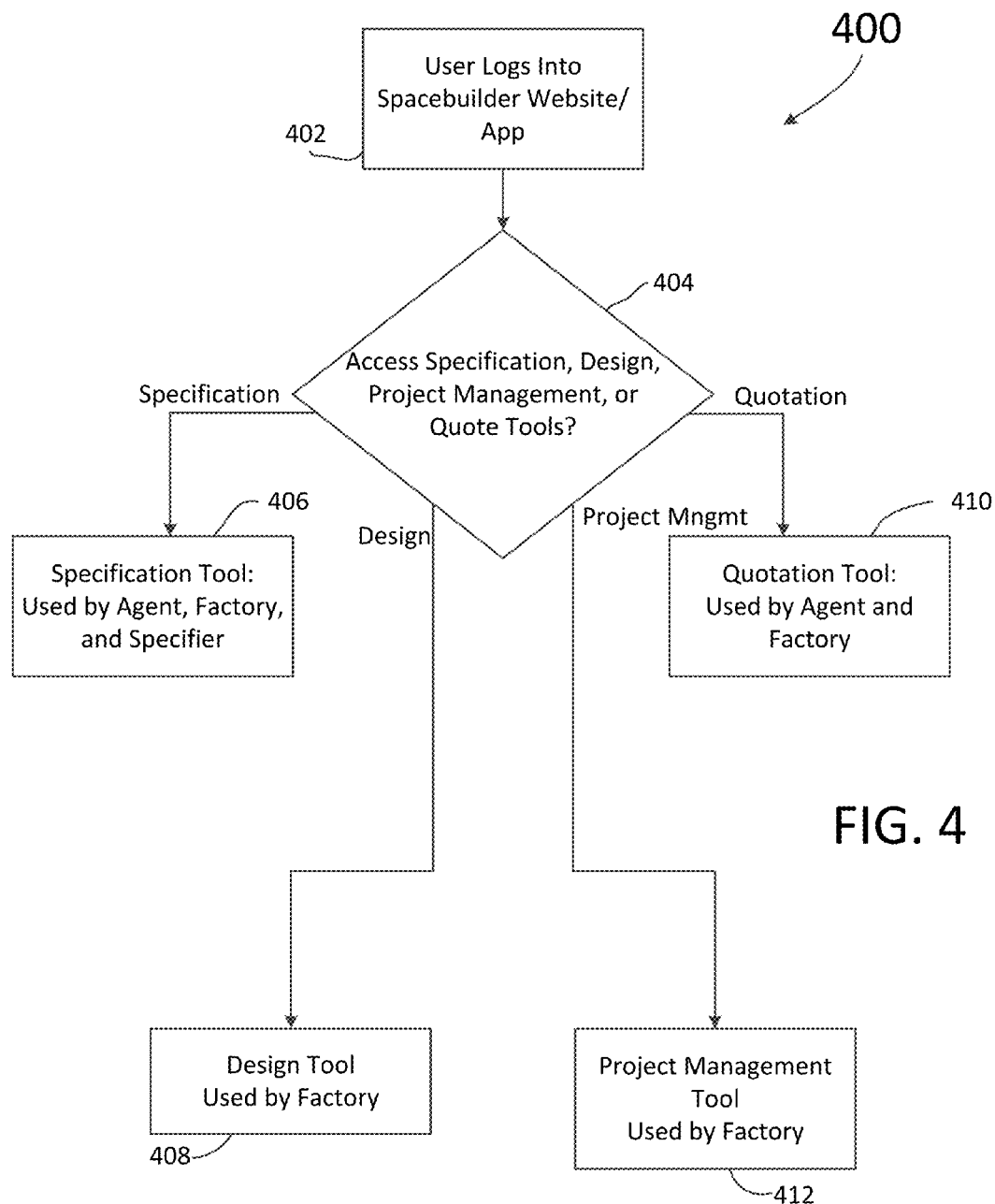

FIG. 4 illustrates a method for accessing software based lighting control system specification, quotation, design, and project management tools using an internet webpage and/or software application according to an embodiment.

Figure 5:
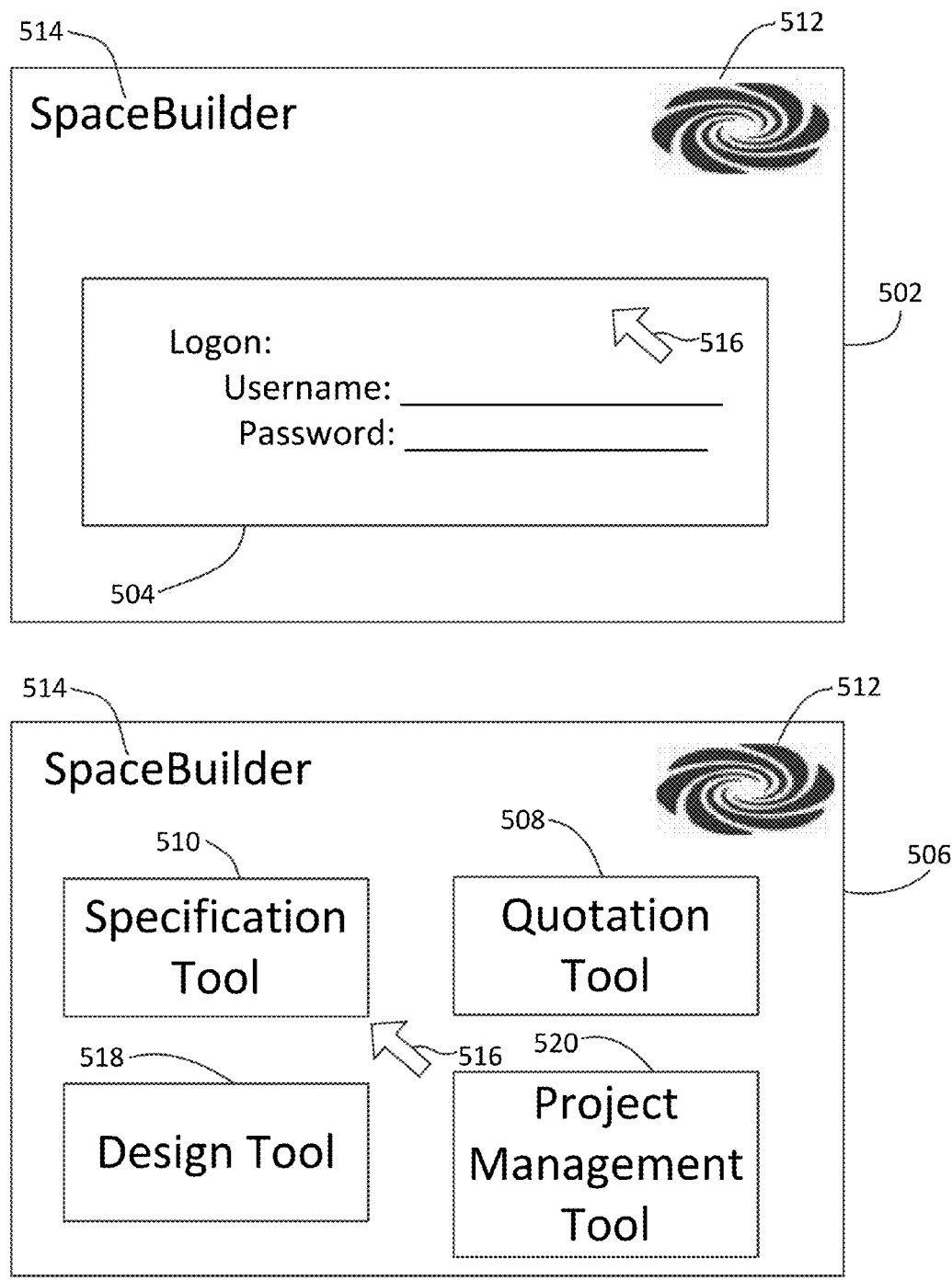

FIG. 5 illustrates a plurality of screenshots associated with the internet webpage of FIG. 4 according to an embodiment.

Figure 6A:
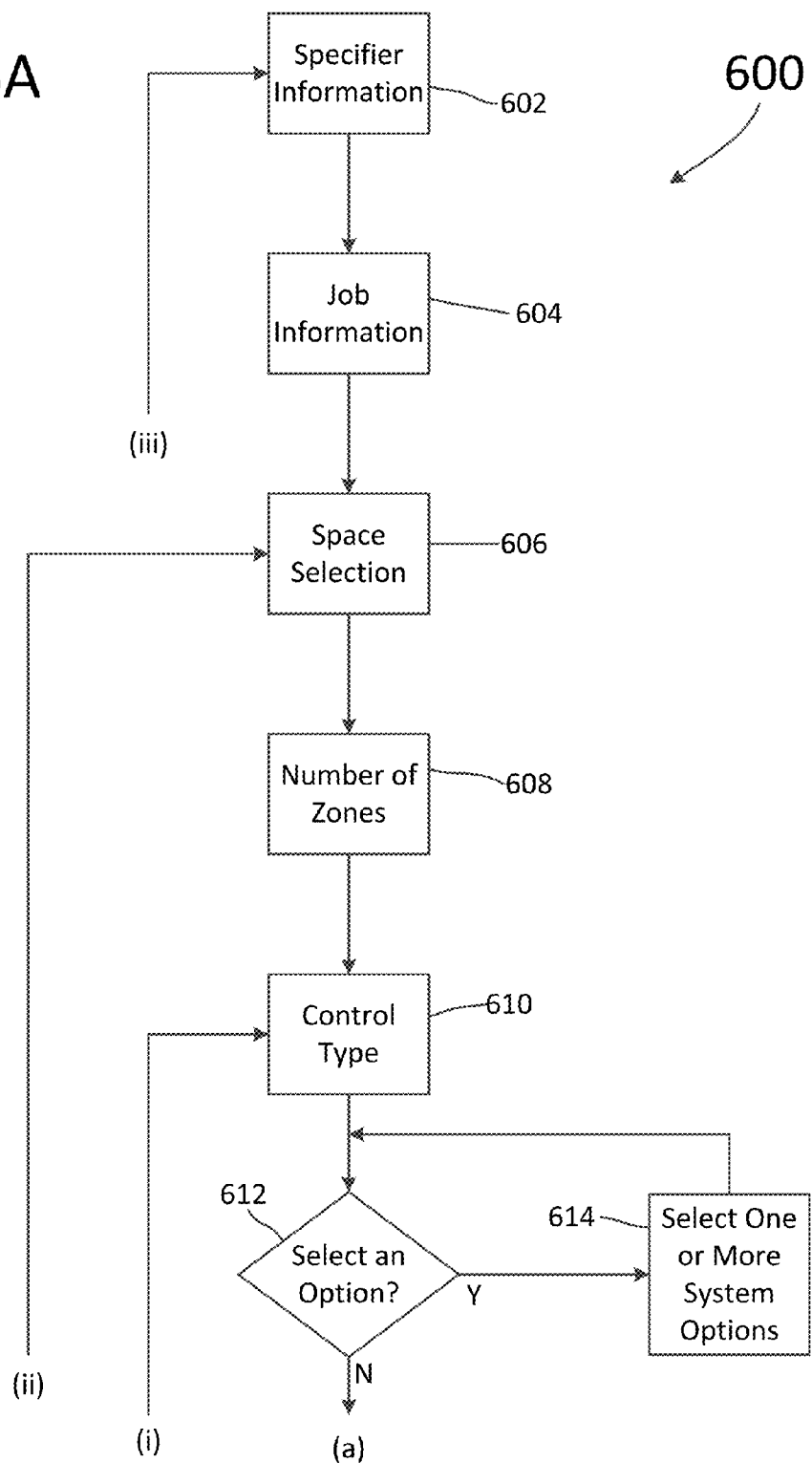
Figure 6B:
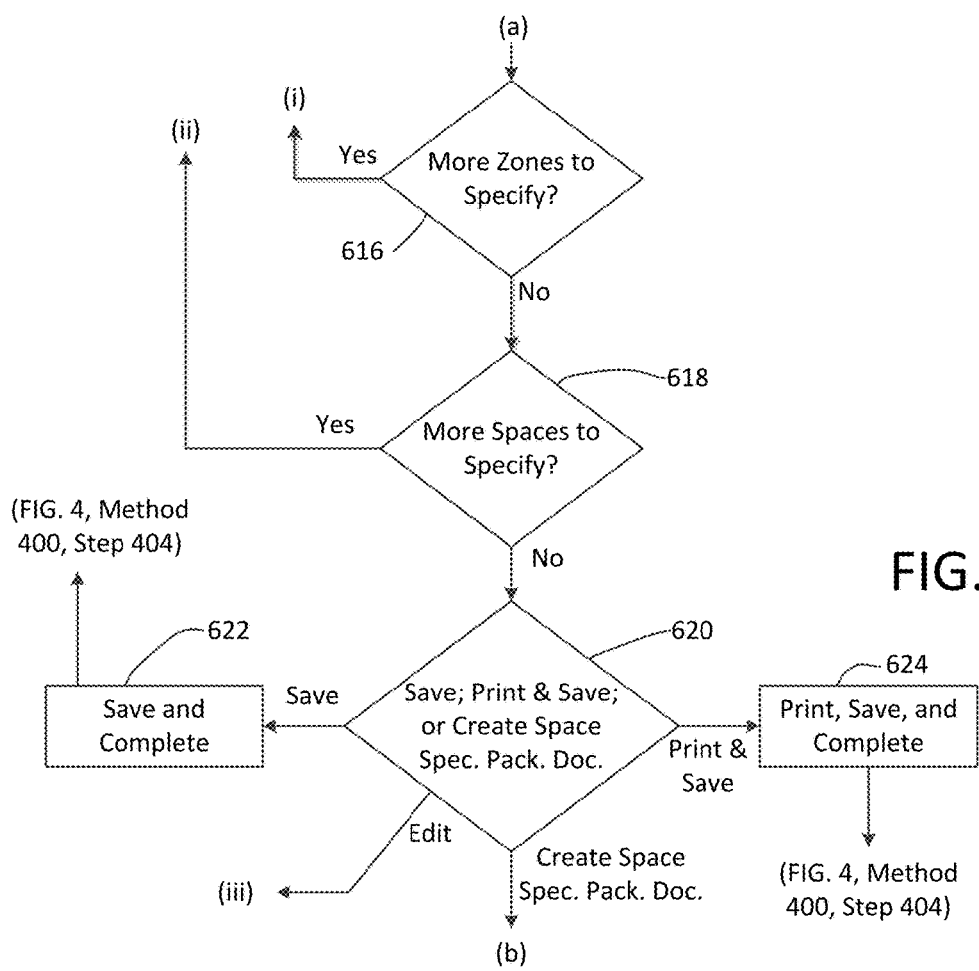
Figure 6C:
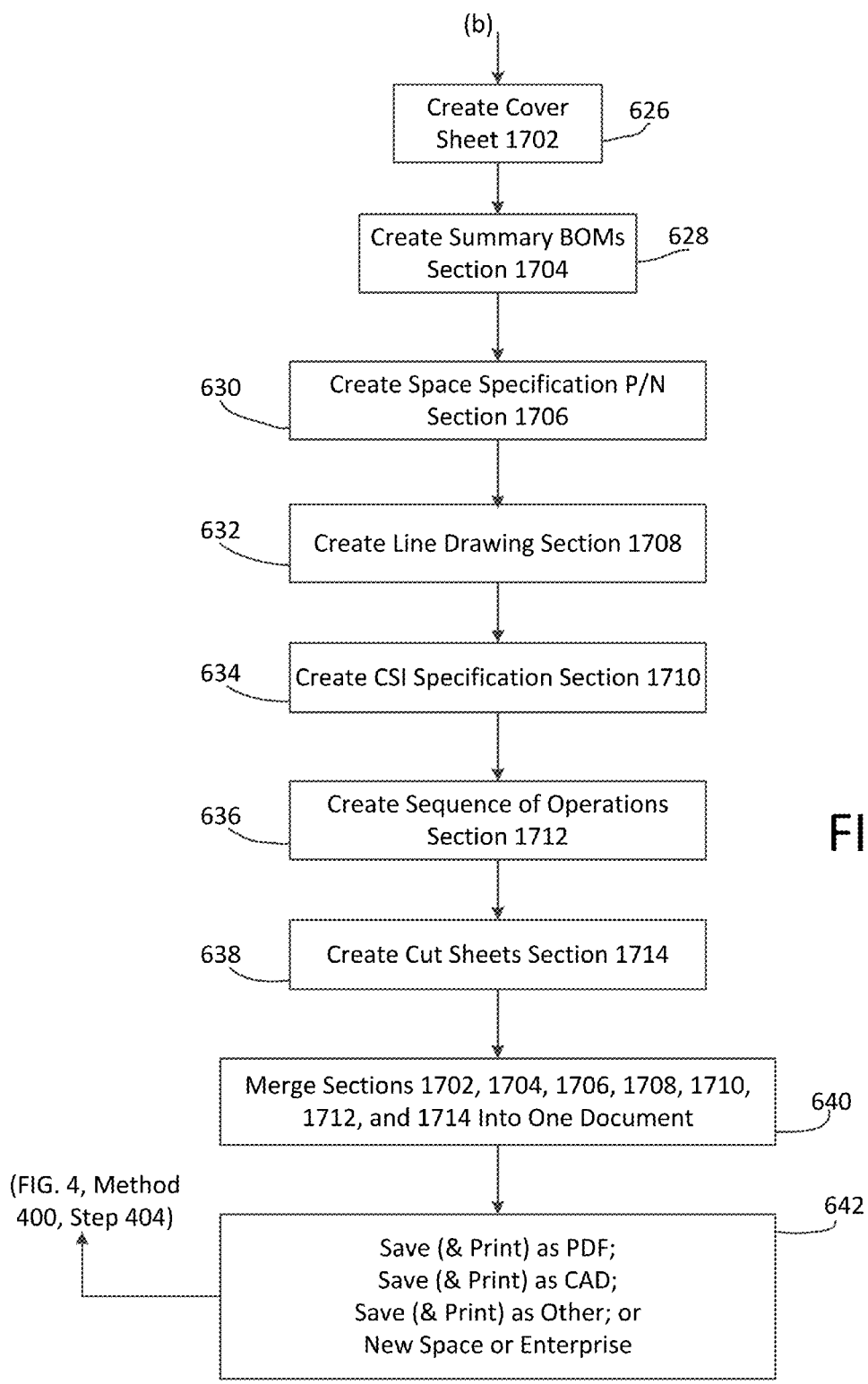

FIGS. 6A, 6B, and 6C illustrate a flow chart of a method for specifying a lighting control system using software tools and an internet webpage according to an embodiment.

FIGS. 7-12 illustrate a plurality of screenshots associated with internet webpages and the method of FIGS. 6A, 6B, and 6C according to an embodiment.

Figure 11:
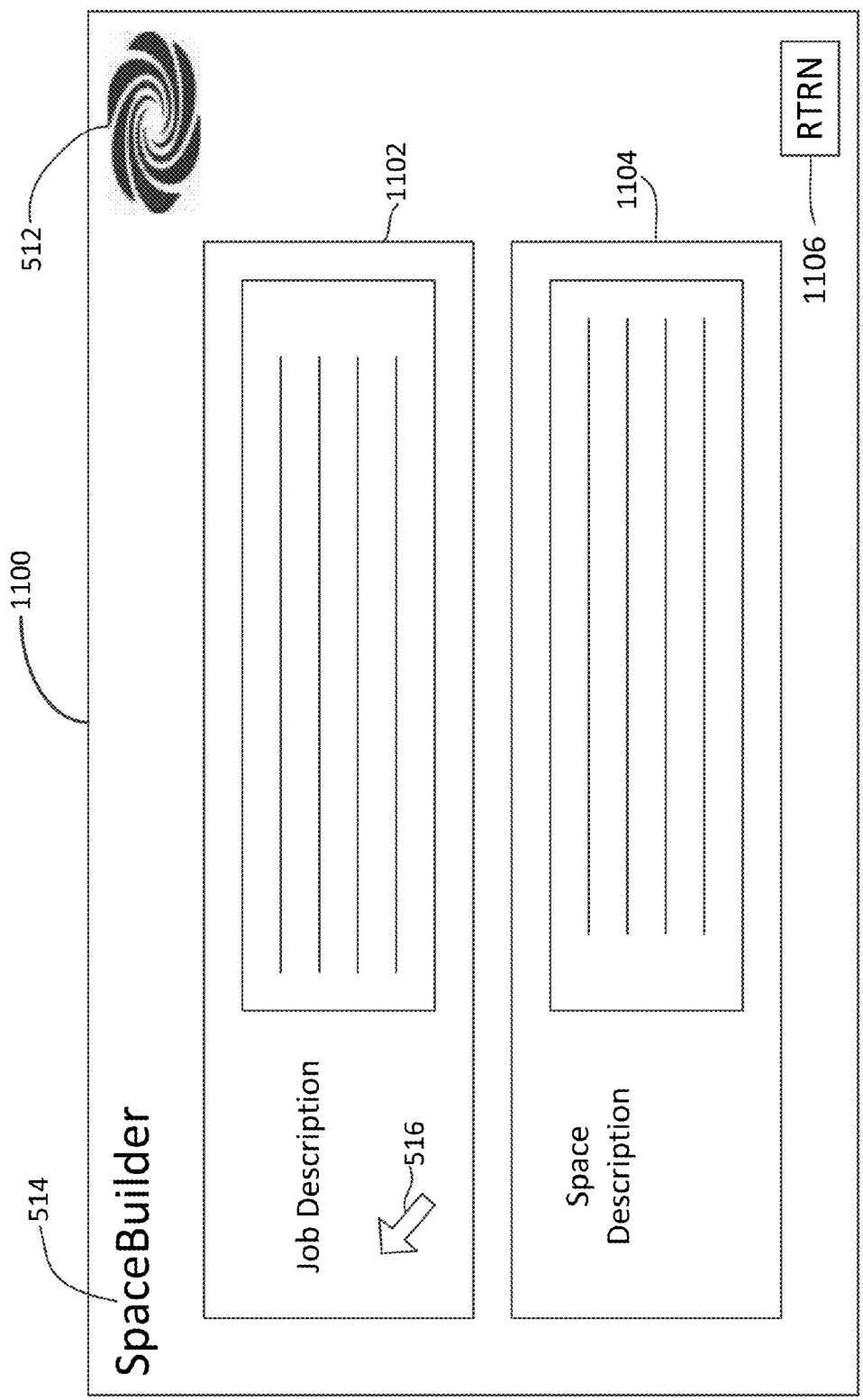
Figure 12:
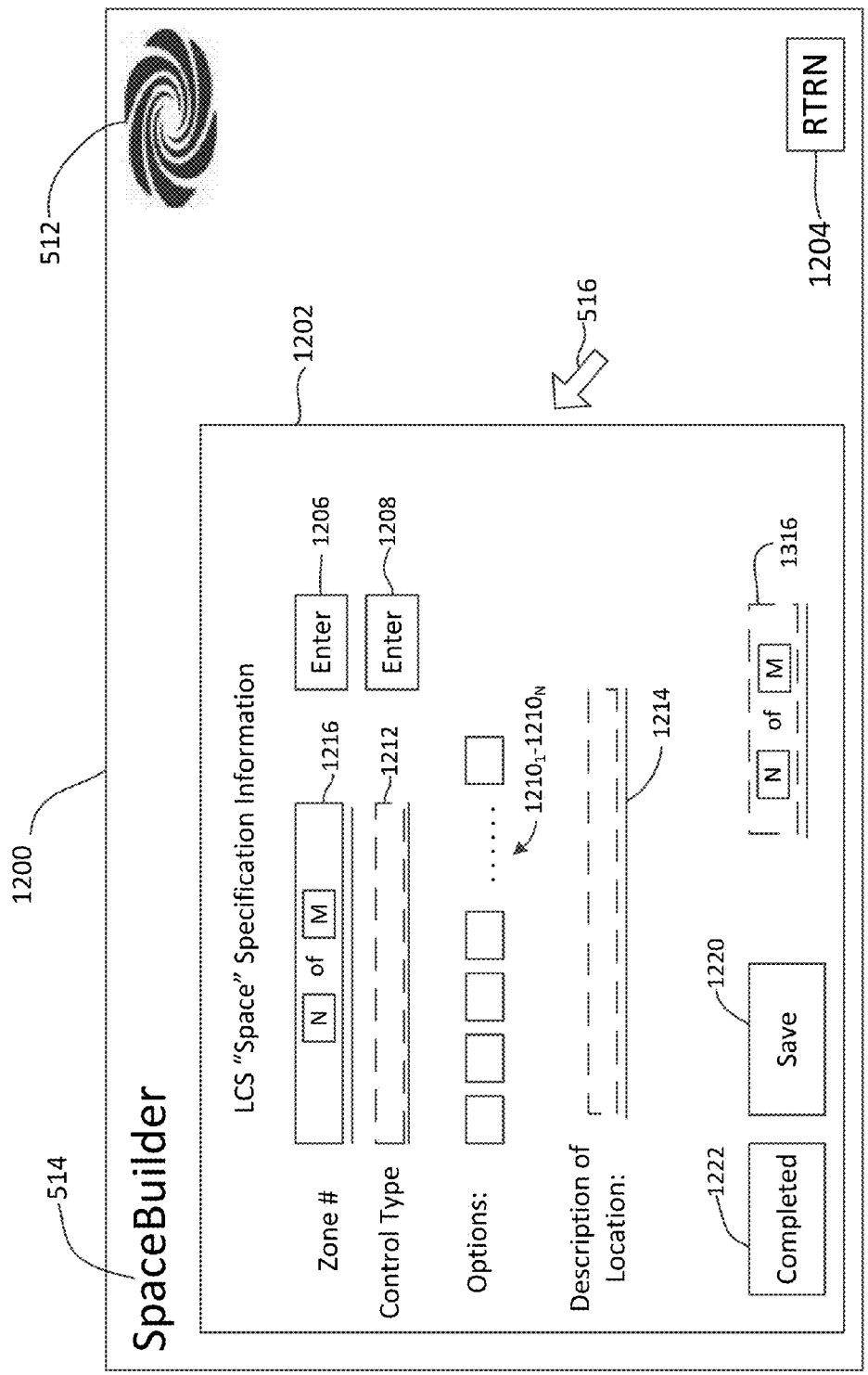
Figure 13:
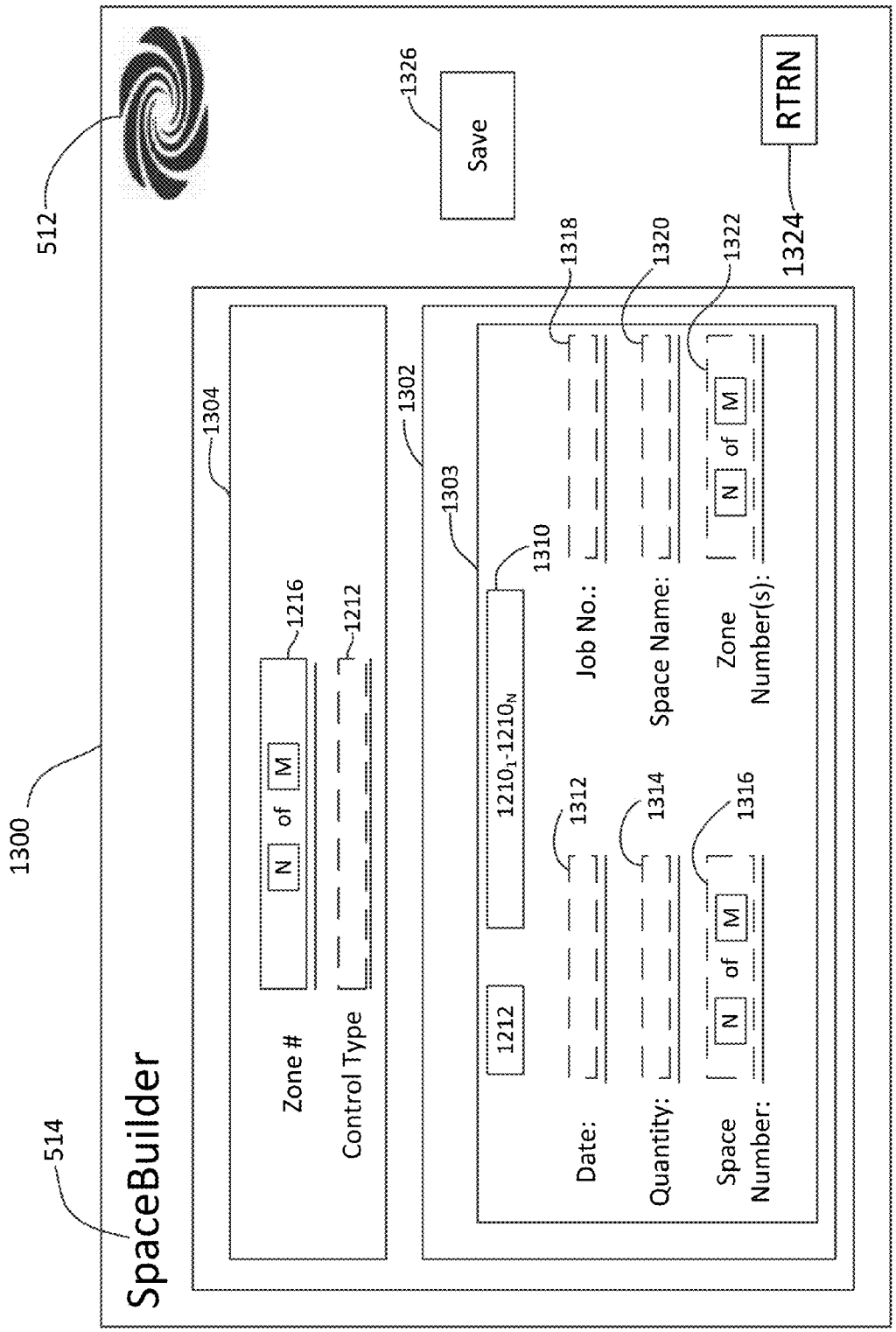

FIG. 13 illustrates a zone controller options entry screenshot that shows all of the fields of a complete part number being specified in accordance with use of the method of FIGS. 6A, 6B, and 6C and the webpages of FIGS. 7-12 according to an embodiment.

Figure 14:
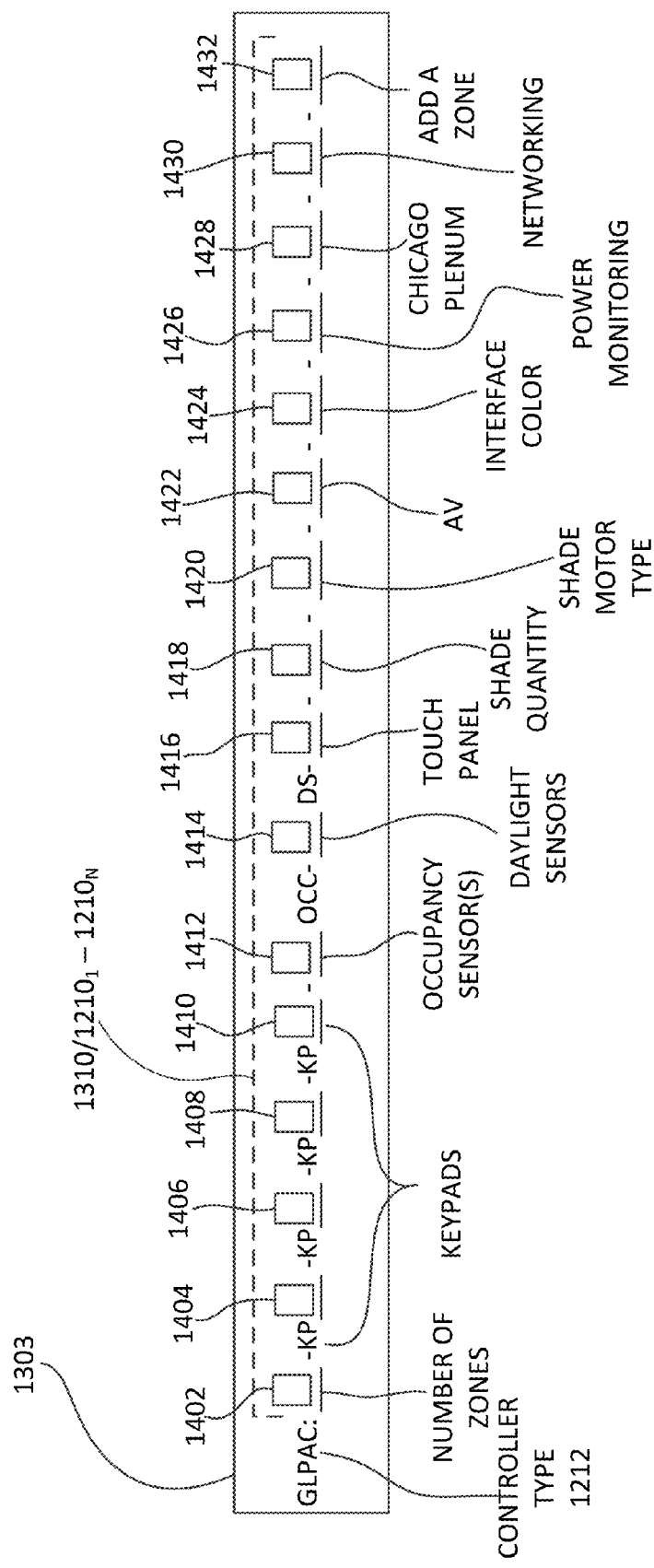

FIG. 14 illustrates a detailed example of a partial part number specified in accordance with use of the method of FIGS. 6A, 6B, and 6C and the screenshots of FIGS. 7-12 according to an embodiment.

Figure 15:
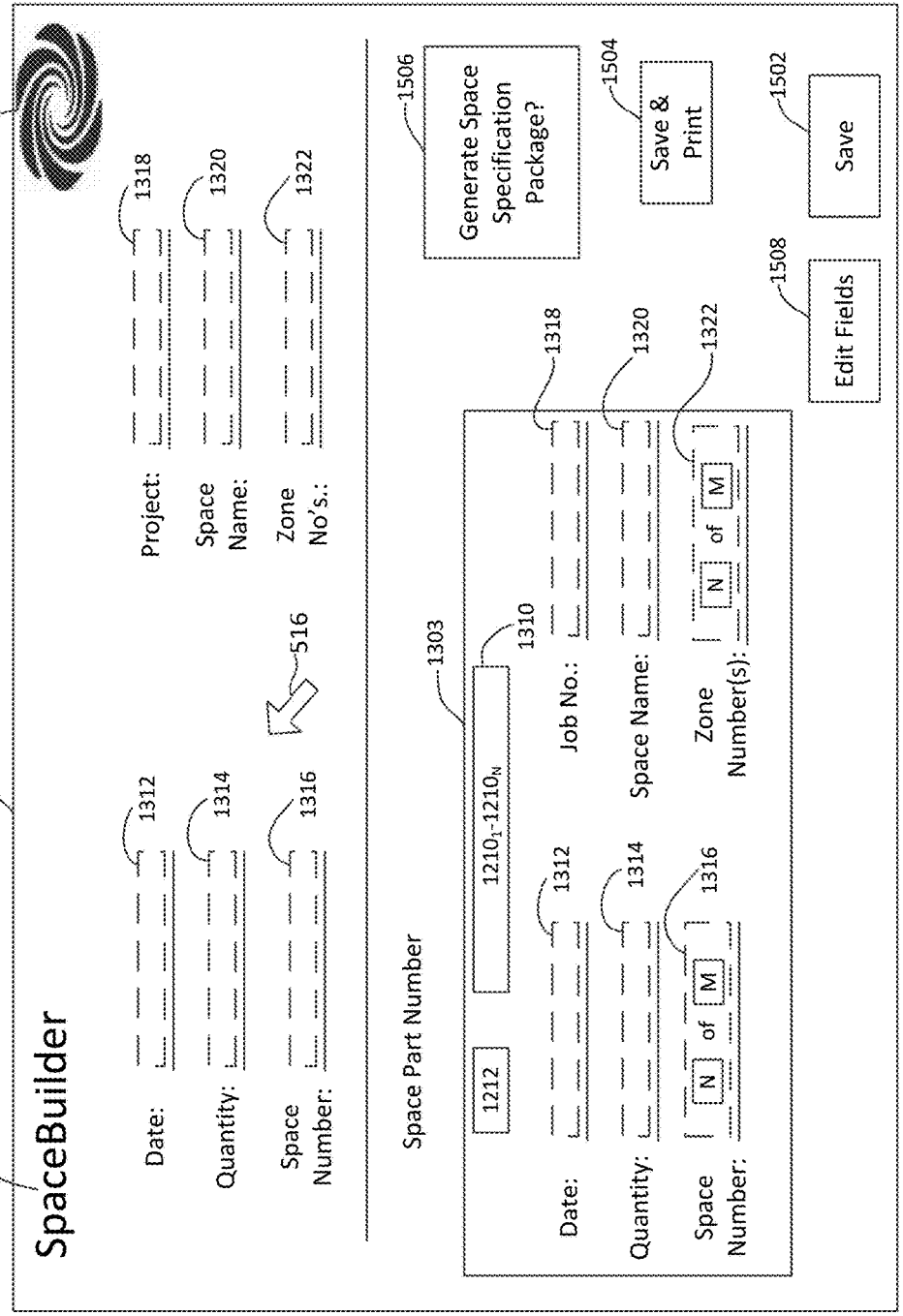

FIG. 15 illustrates a screenshot associated with an internet webpage and the method of FIGS. 6A, 6B, and 6C according to an embodiment.

Figure 16:
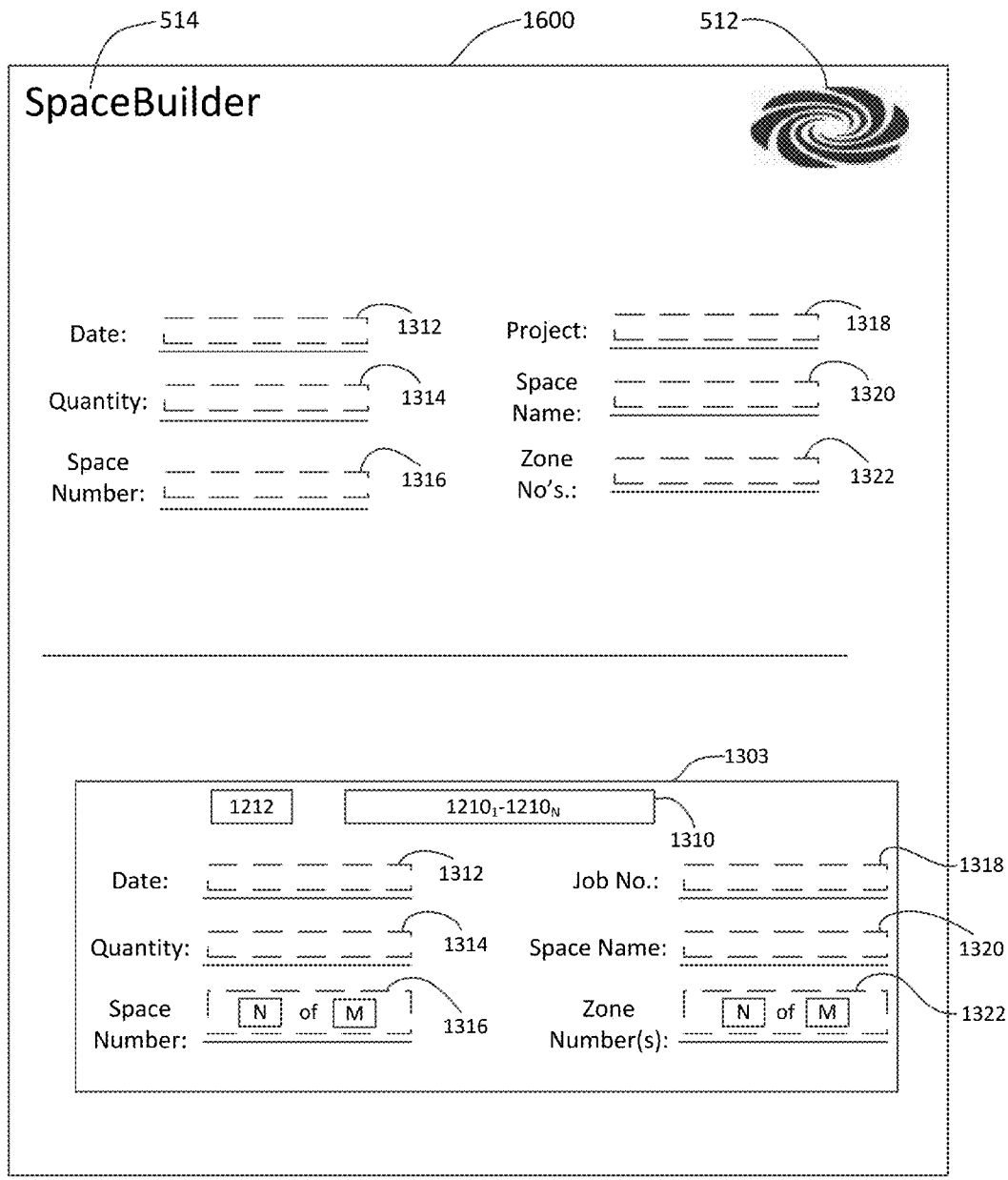

FIG. 16 illustrates a space specification part number sheet created by the method of FIGS. 6A, 6B, and 6C according to an embodiment.

Figure 17:
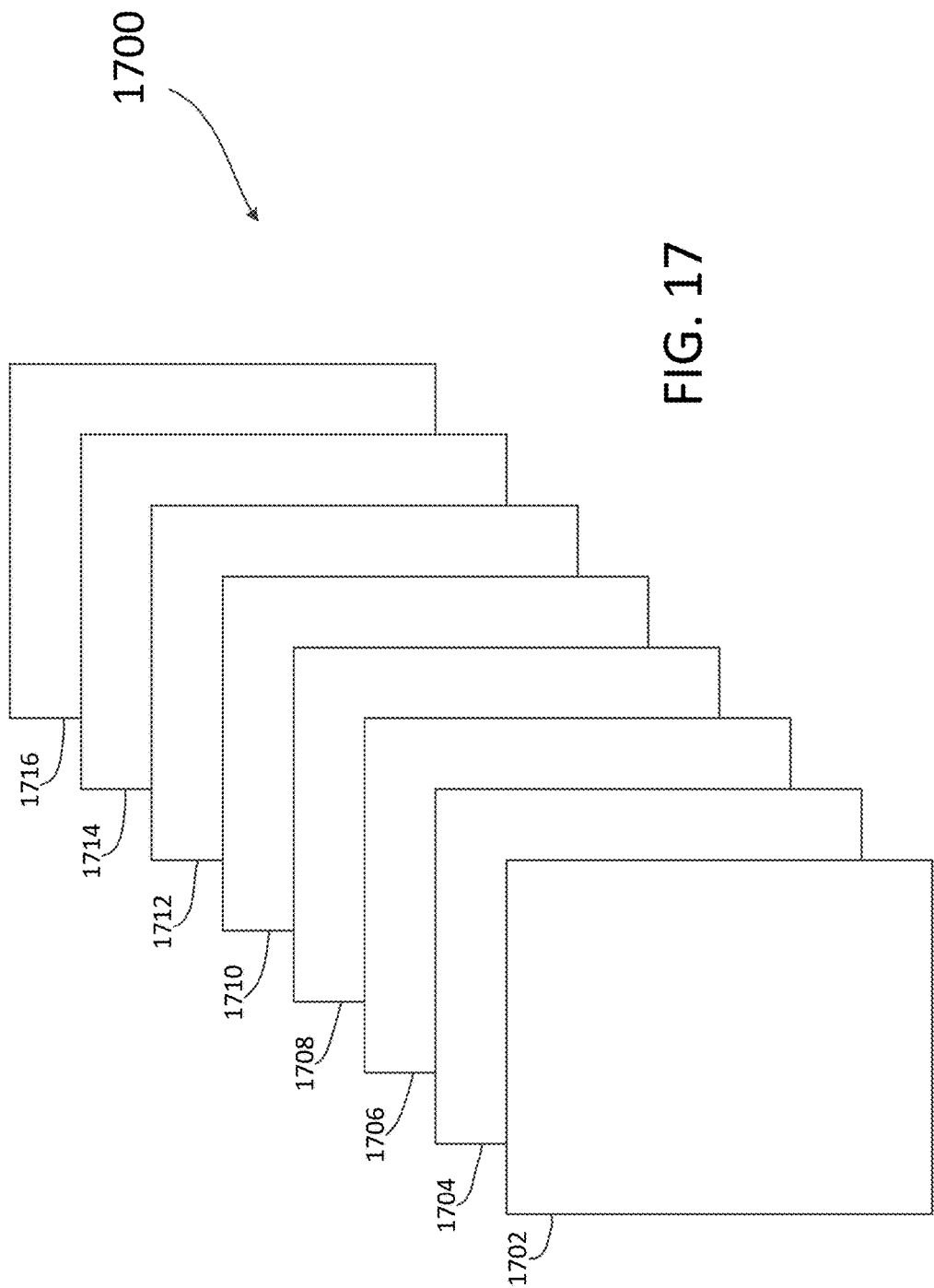
Figure 18:
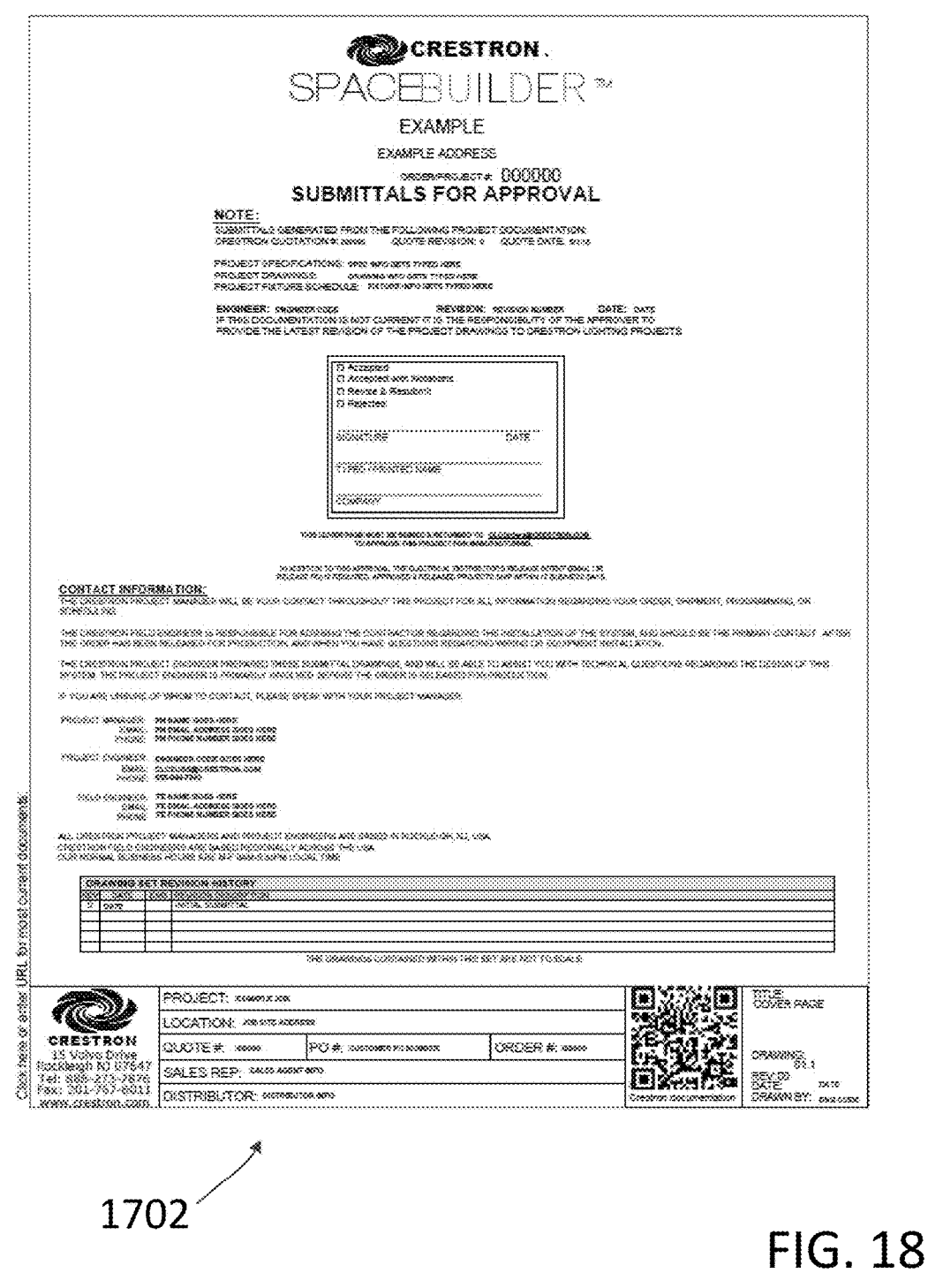

FIG. 17 illustrates a space specification package generated by the method shown in FIGS. 6A, 6B, and 6C according to an embodiment FIG. 18 illustrates an example of a cover sheet for use in a space specification package generated by the method shown in FIGS. 6A, 6B, and 6C according to an embodiment.

Figure 19:

FIG. 19 illustrates an example of a summary of a bill of materials section for use in a space specification package generated by the method shown in FIGS. 6A, 6B, and 6C according to an embodiment.

Figure 20:
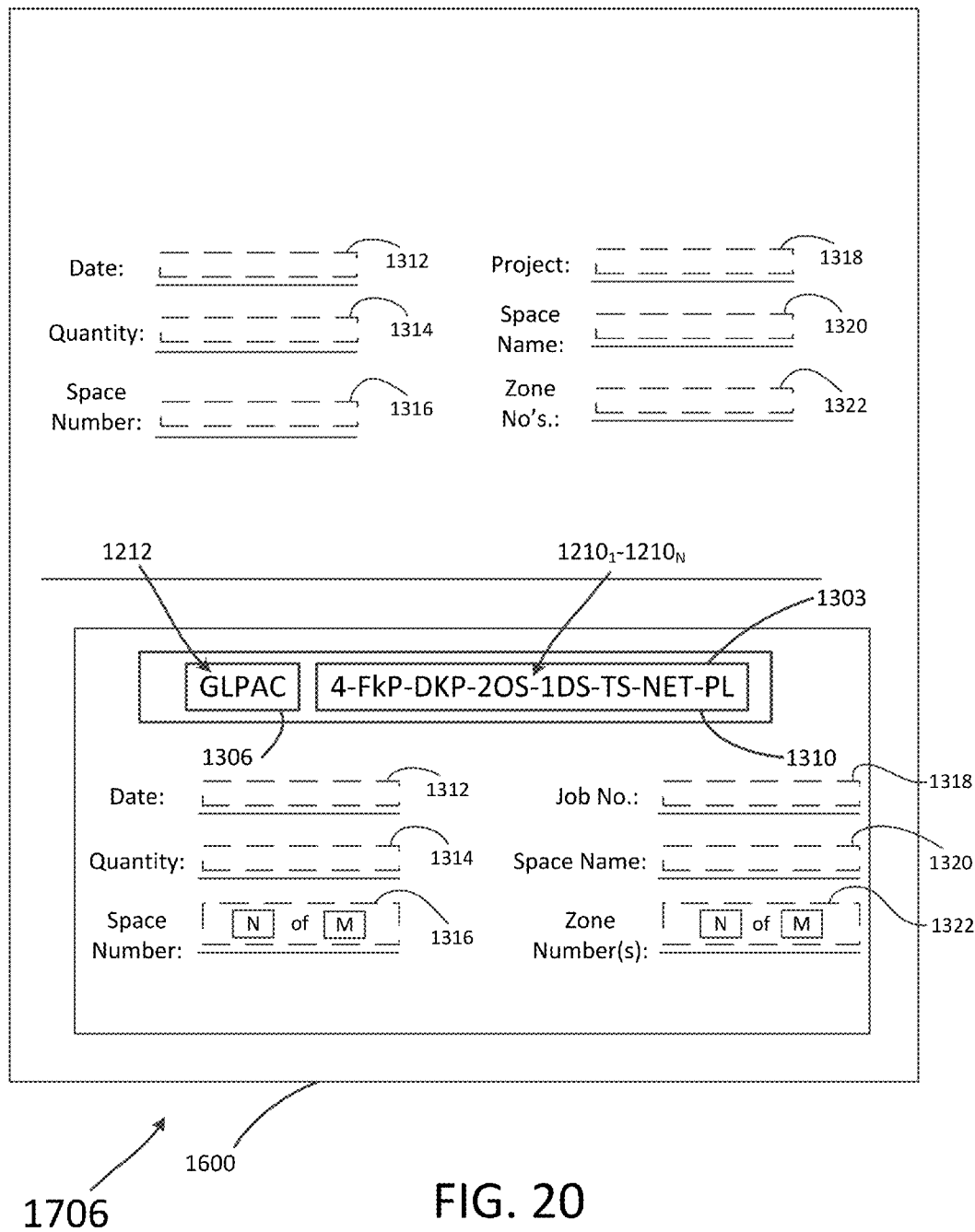

FIG. 20 illustrates an example of a space specification part number section for use in a space specification package generated by the method shown in FIGS. 6A, 6B, and 6C according to an embodiment.

Figure 21:
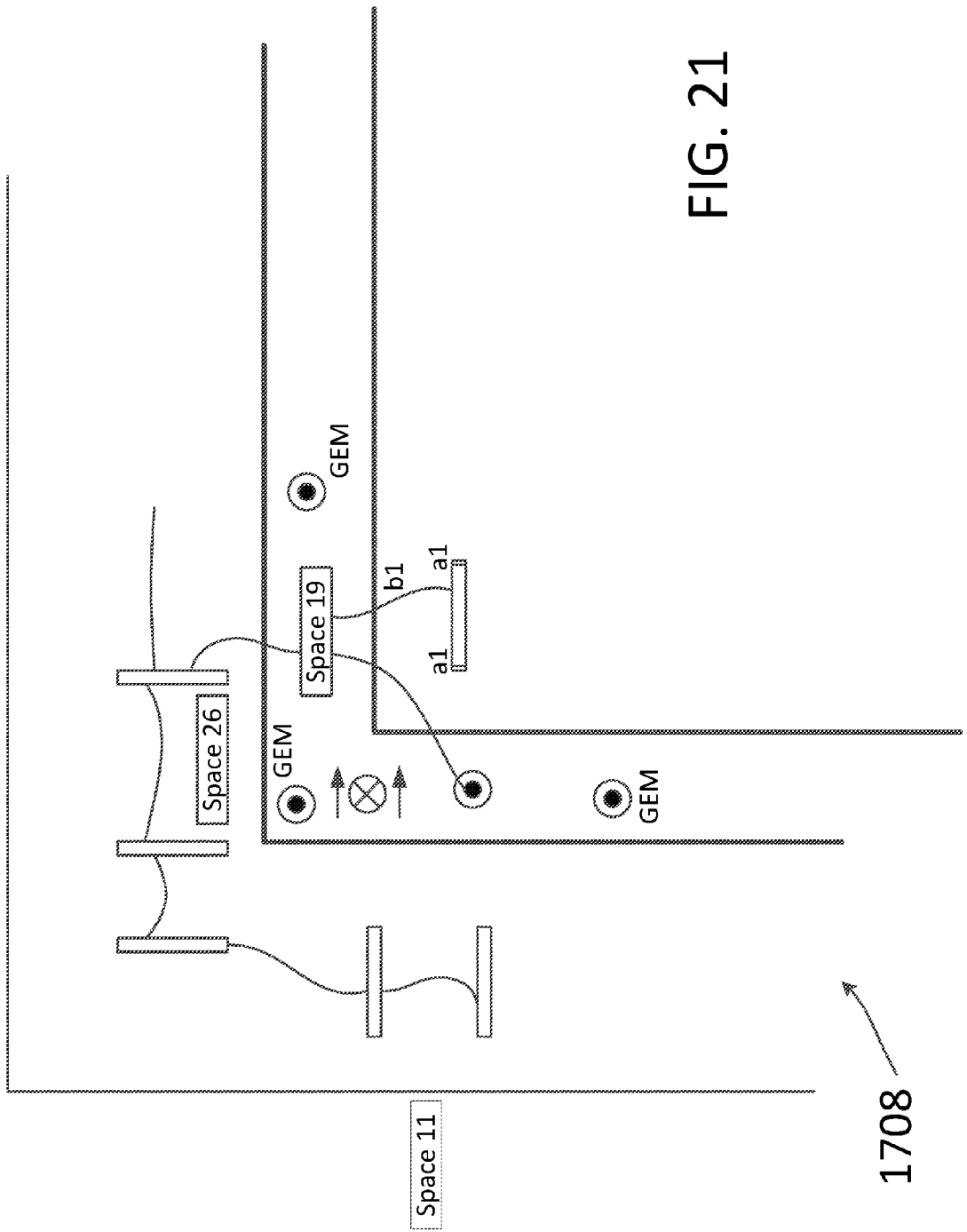

FIG. 21 illustrates an example of a line drawing section for use in a space specification package generated by the method shown in FIGS. 6A, 6B, and 6C according to an embodiment.

Figure 22:
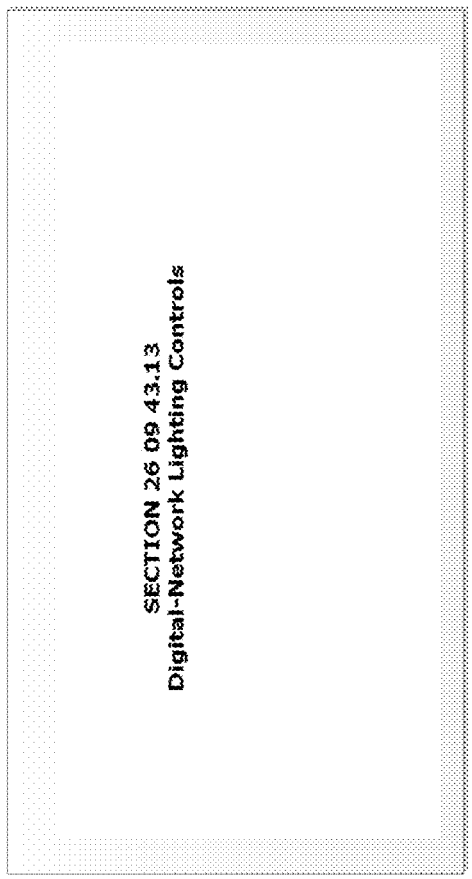

FIG. 22 illustrates an example of a construction specification institute specification section for use in a space specification package generated by the method shown in FIGS. 6A, 6B, and 6C according to an embodiment.

Figure 23:
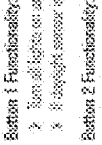

FIG. 23 illustrates an example of a sequence of operations section for use in a space specification package generated by the method shown in FIGS. 6A, 6B, and 6C according to an embodiment.

Figure 24:
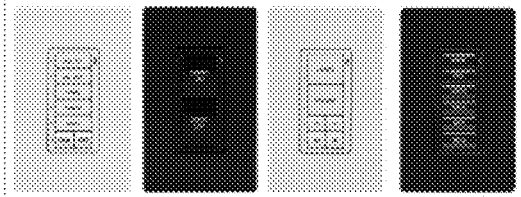

FIG. 24 illustrates an example of a cut sheets section for use in a space specification package generated by the method shown in FIGS. 6A, 6B, and 6C according to an embodiment.

Figure 25:
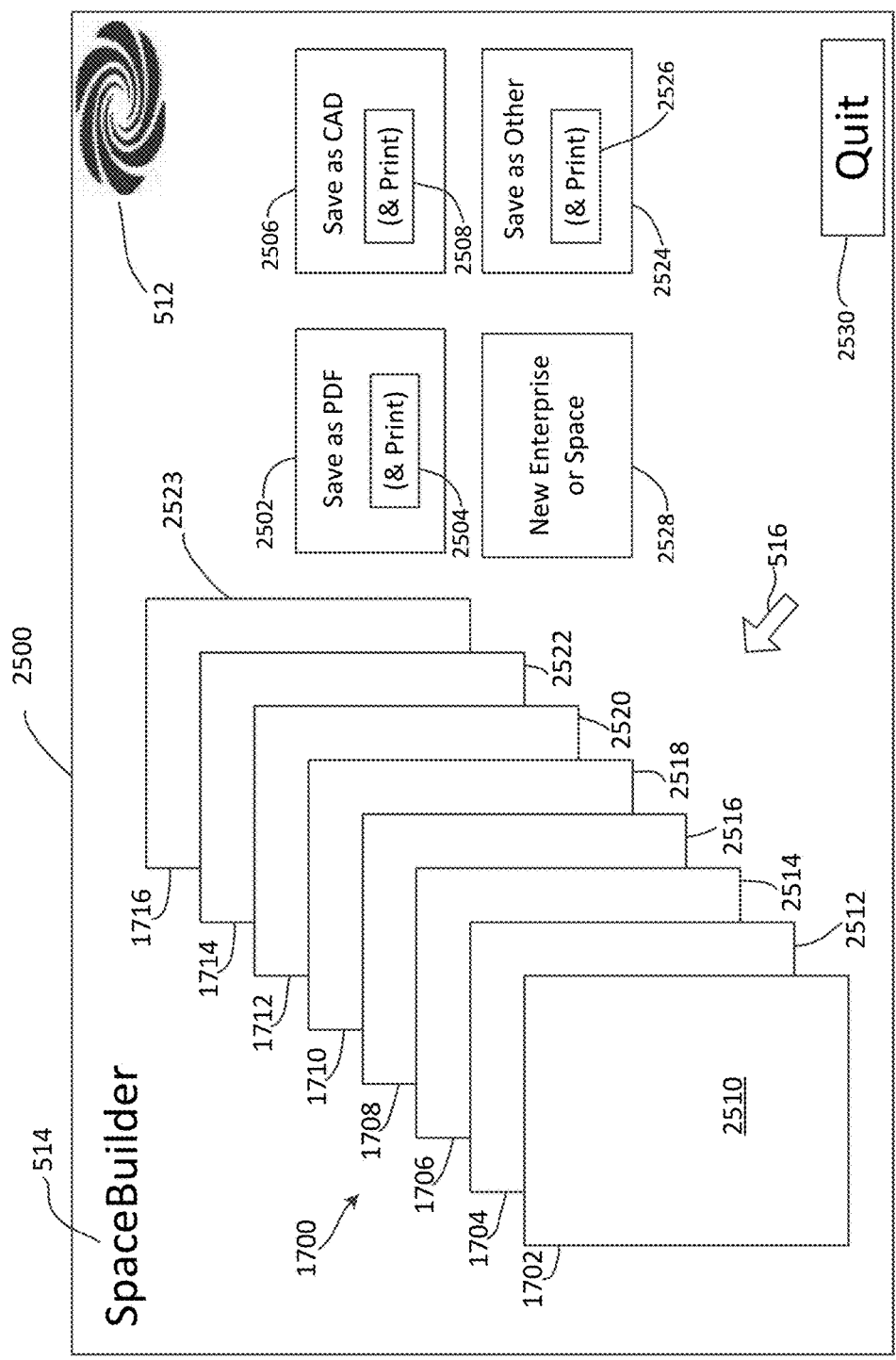

FIG. 25 illustrates a screenshot associated with an internet webpage and the method of FIG. 6 and a generated space specification package according to an embodiment.

Figure 26:
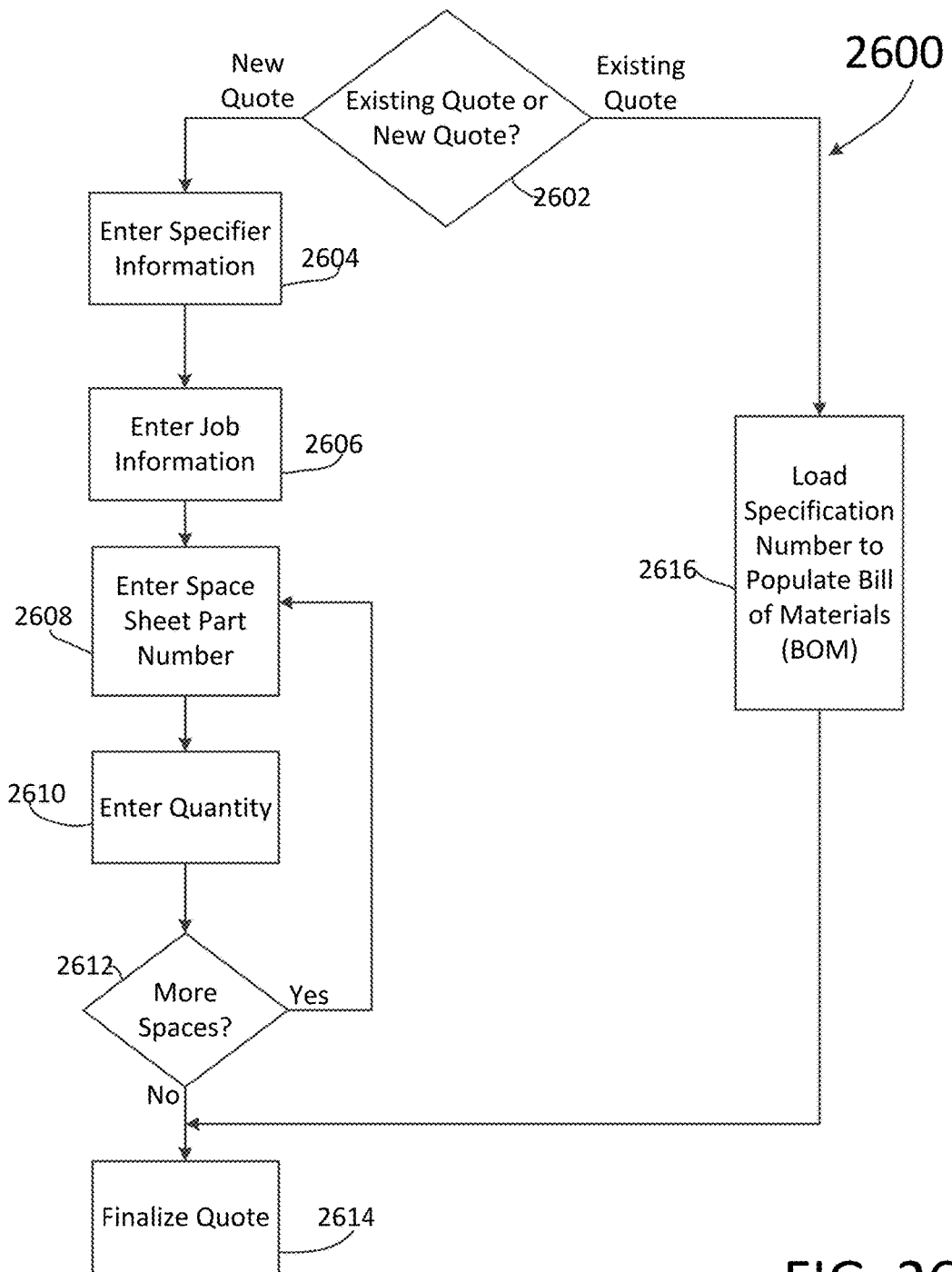

FIG. 26 illustrates a flow chart of a method for providing a quotation to a purchaser of the lighting control system using software tools and an internet webpage according to an embodiment.

Figure 27:
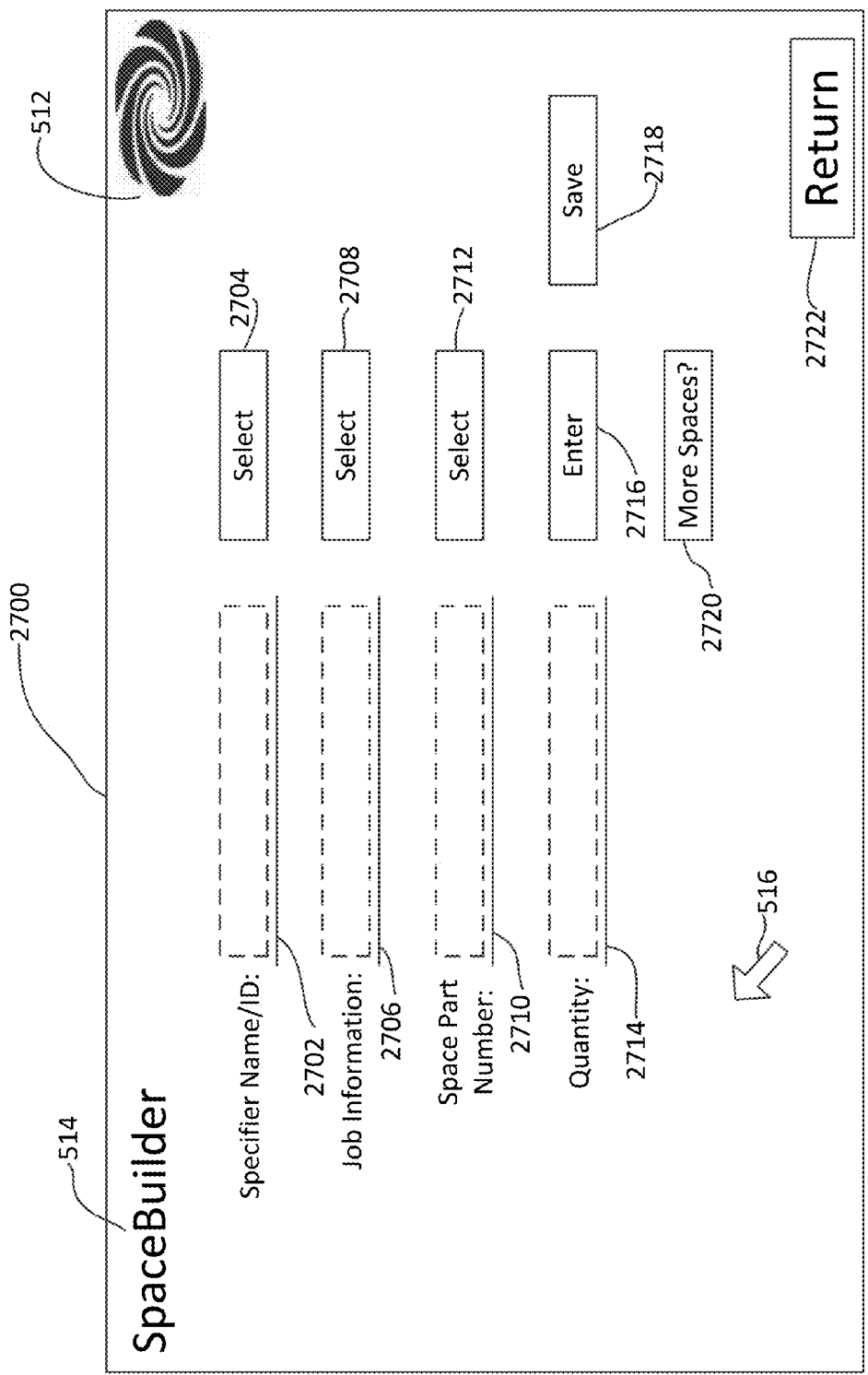

FIG. 27 illustrates a screenshot associated with an internet webpage and the method of FIG. 26 according to an embodiment.

Figure 28:
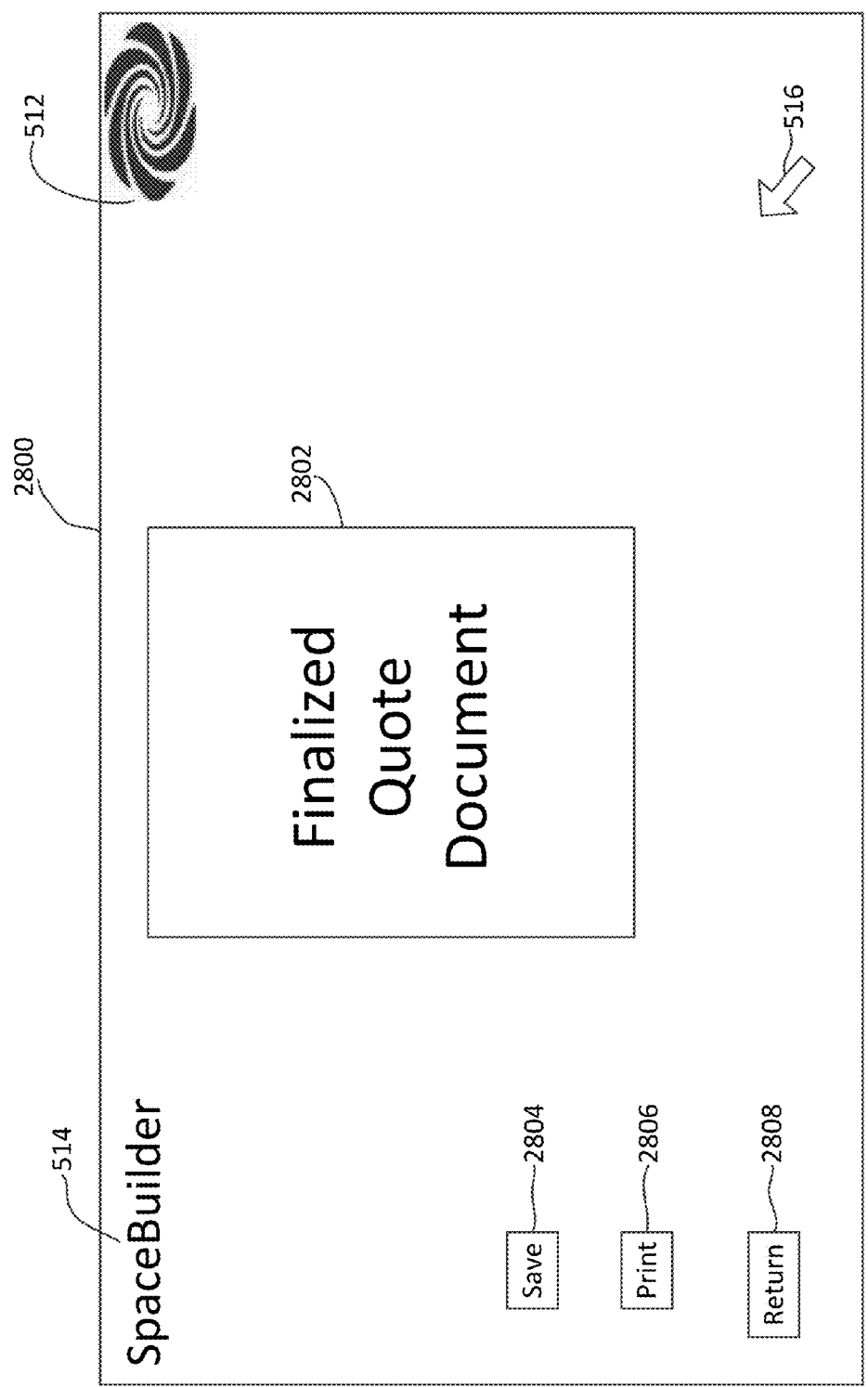

FIG. 28 illustrates a screenshot associated with an internet webpage of a finalized bill of materials/quotation generated in accordance with the method flow chart as illustrated in FIG. 26 according to an embodiment.

Figure 29:
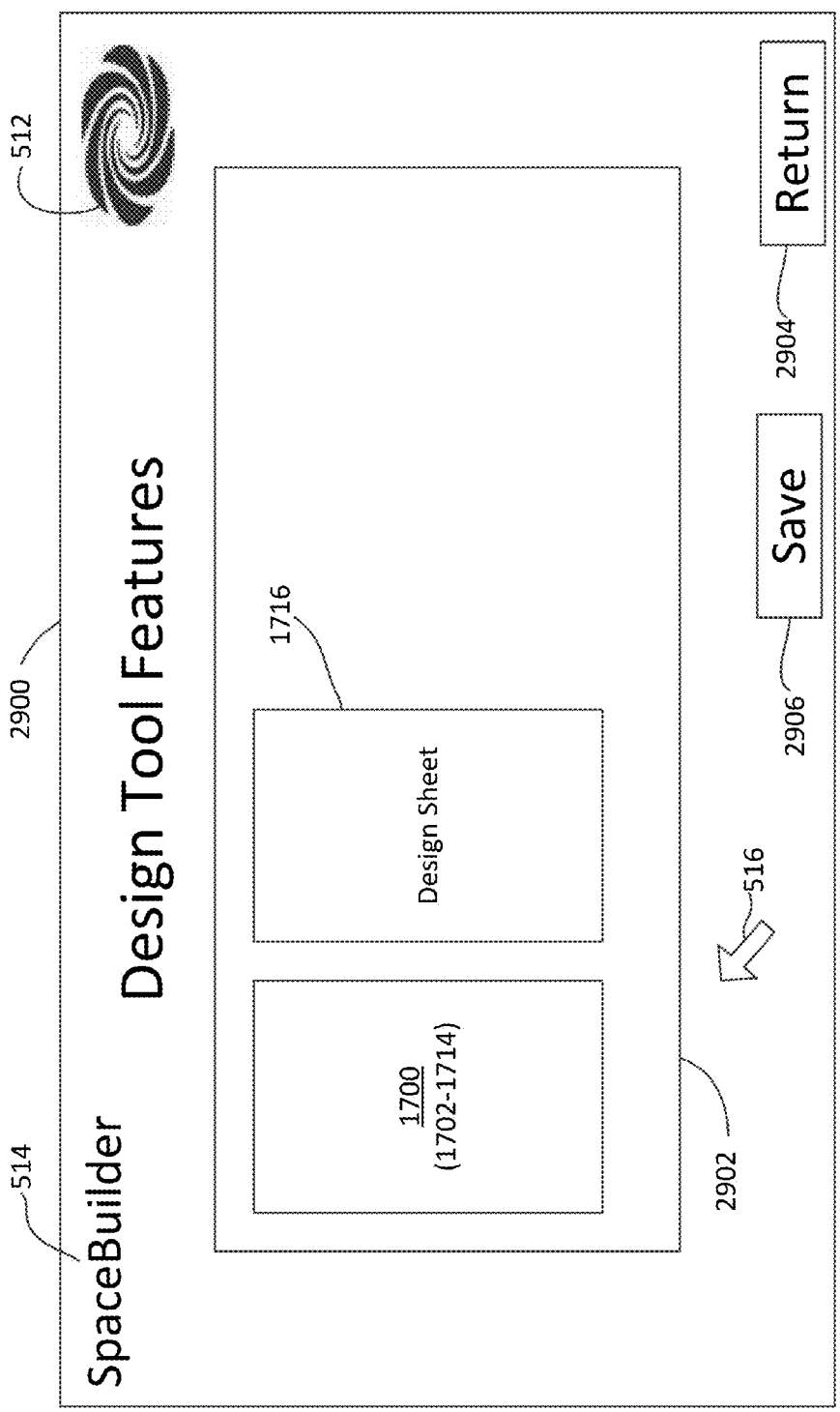

FIG. 29 illustrates a screenshot associated with an internet webpage and the method of FIG. 4 according to an embodiment.

Figure 30:
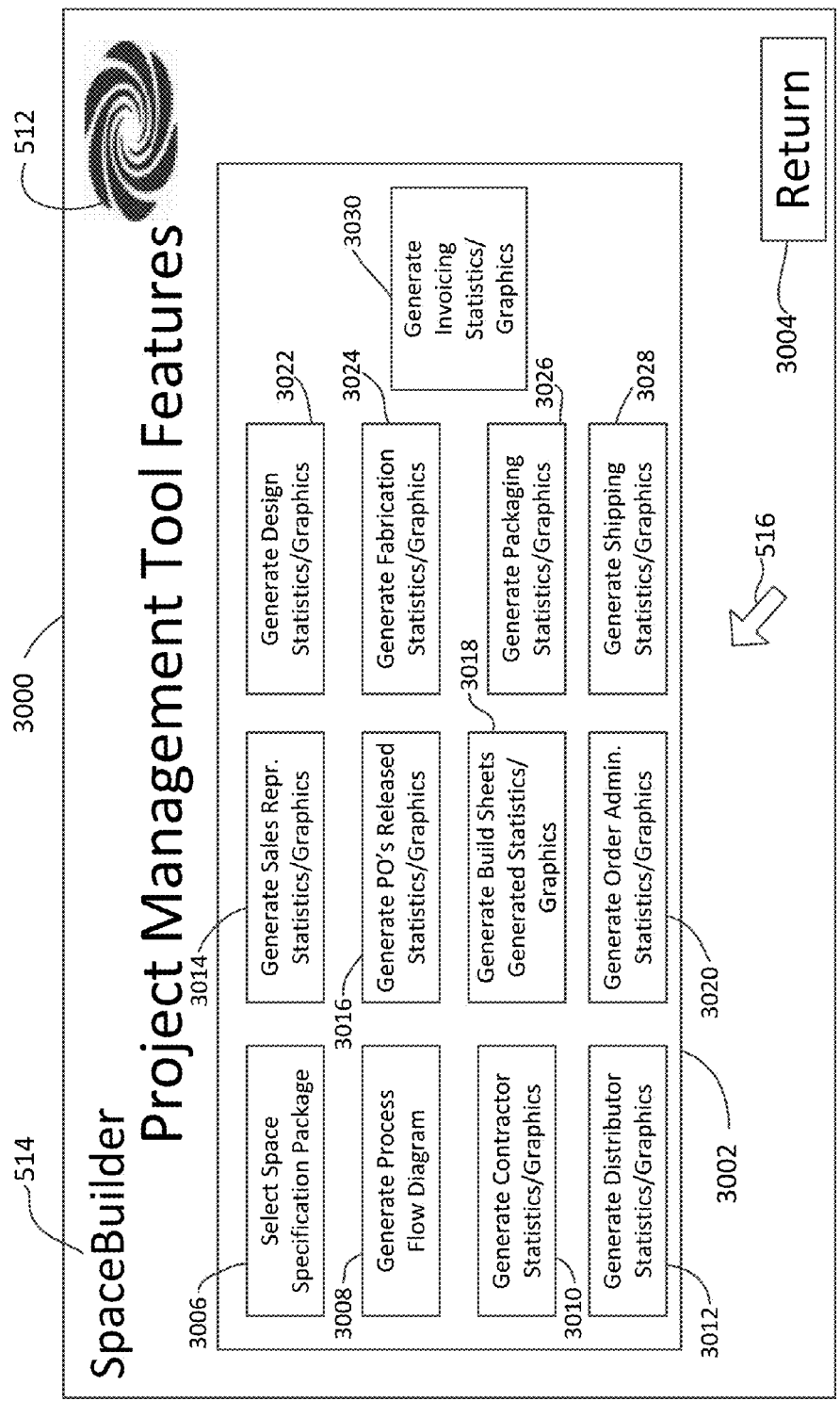

FIG. 30 illustrates a screenshot associated with an internet webpage and the method of FIG. 4 according to an embodiment.

Figure 31:
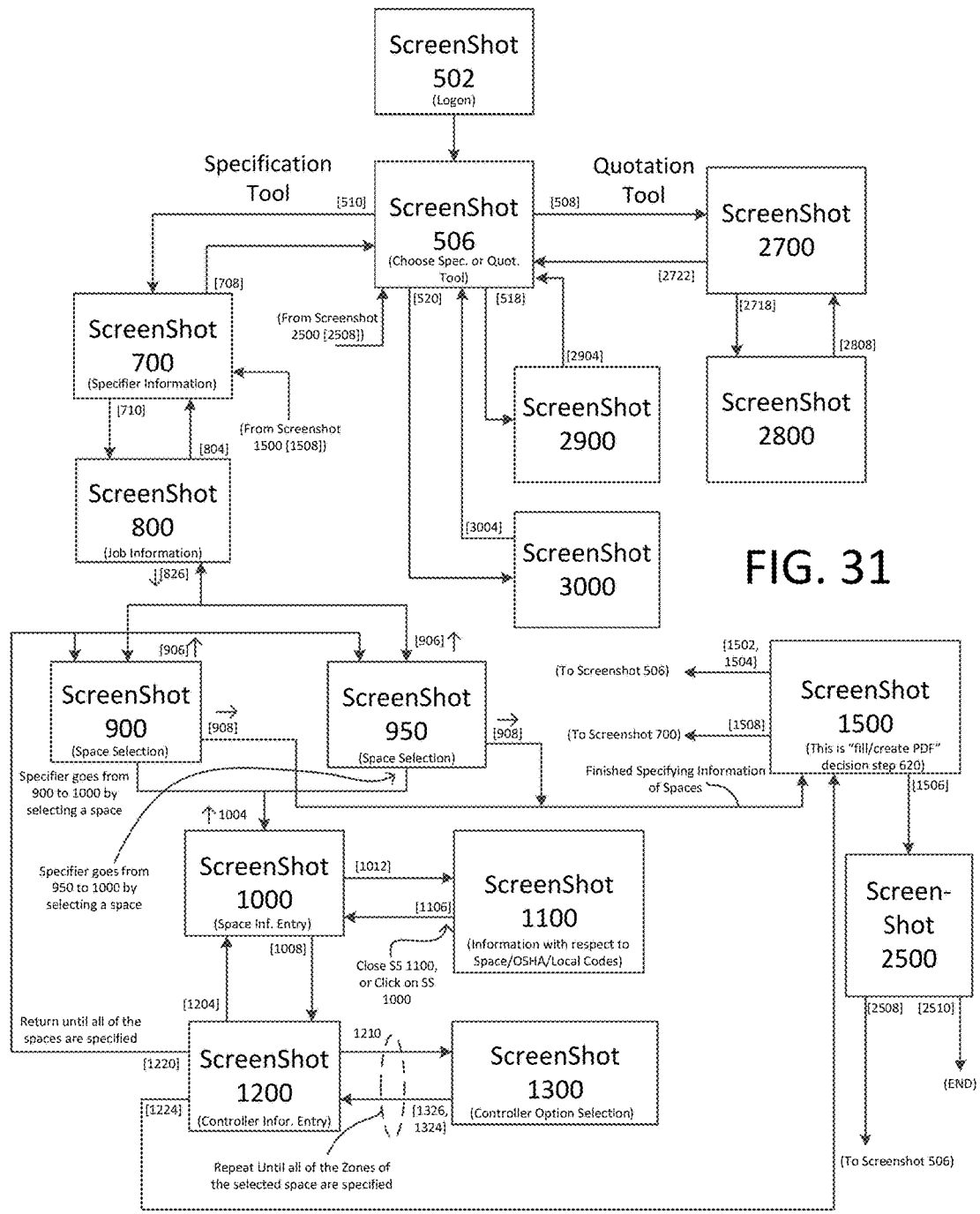

FIG. 31 illustrates a block diagram of a plurality of screenshots associated with the methods of FIGS. 4, 6A-6C, 26, and 30 and how a user can navigate between such screenshots according to further aspects of the embodiments.

Figure 32:
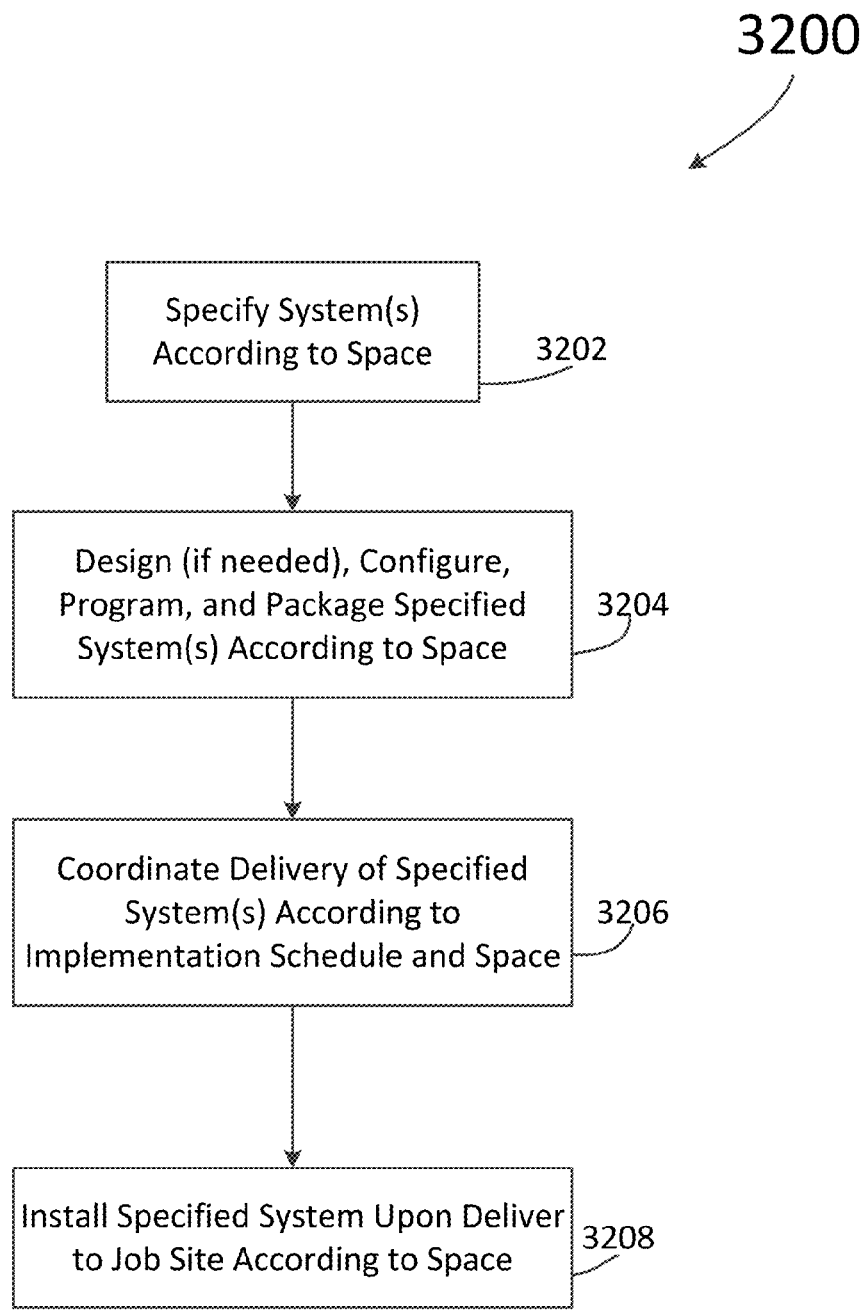

FIG. 32 illustrates a flow chart of a method for using space-based specifying and quotation software tools via an internet webpage to purchase and install a lighting control system according to an embodiment.

Figure 33:
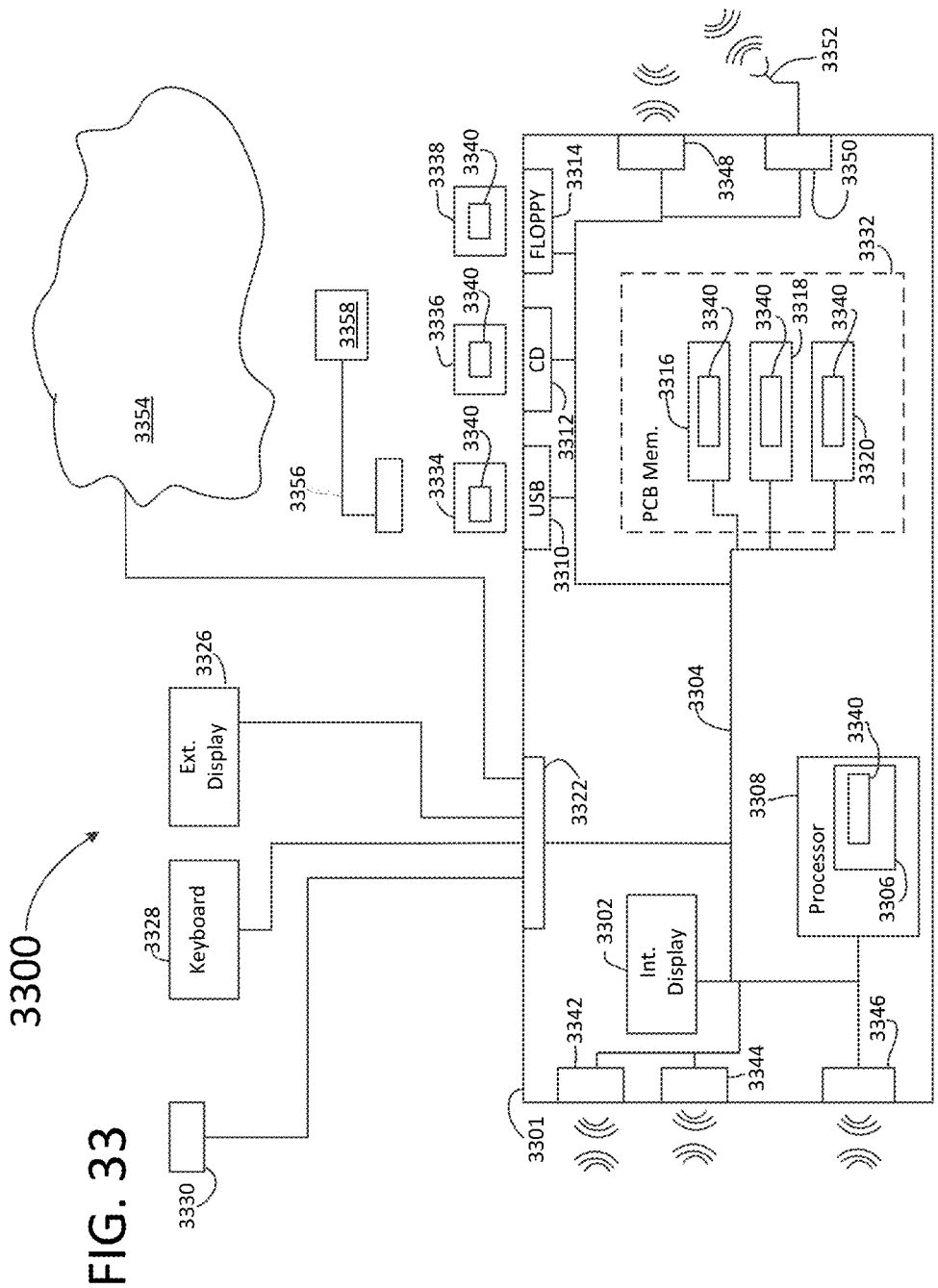

FIG. 33 illustrates a server suitable for use to implement the methods illustrated in FIGS. 4, 6A-6C, 26, and 30 for specifying lighting control systems according to space according to an embodiment.

Figure 34:
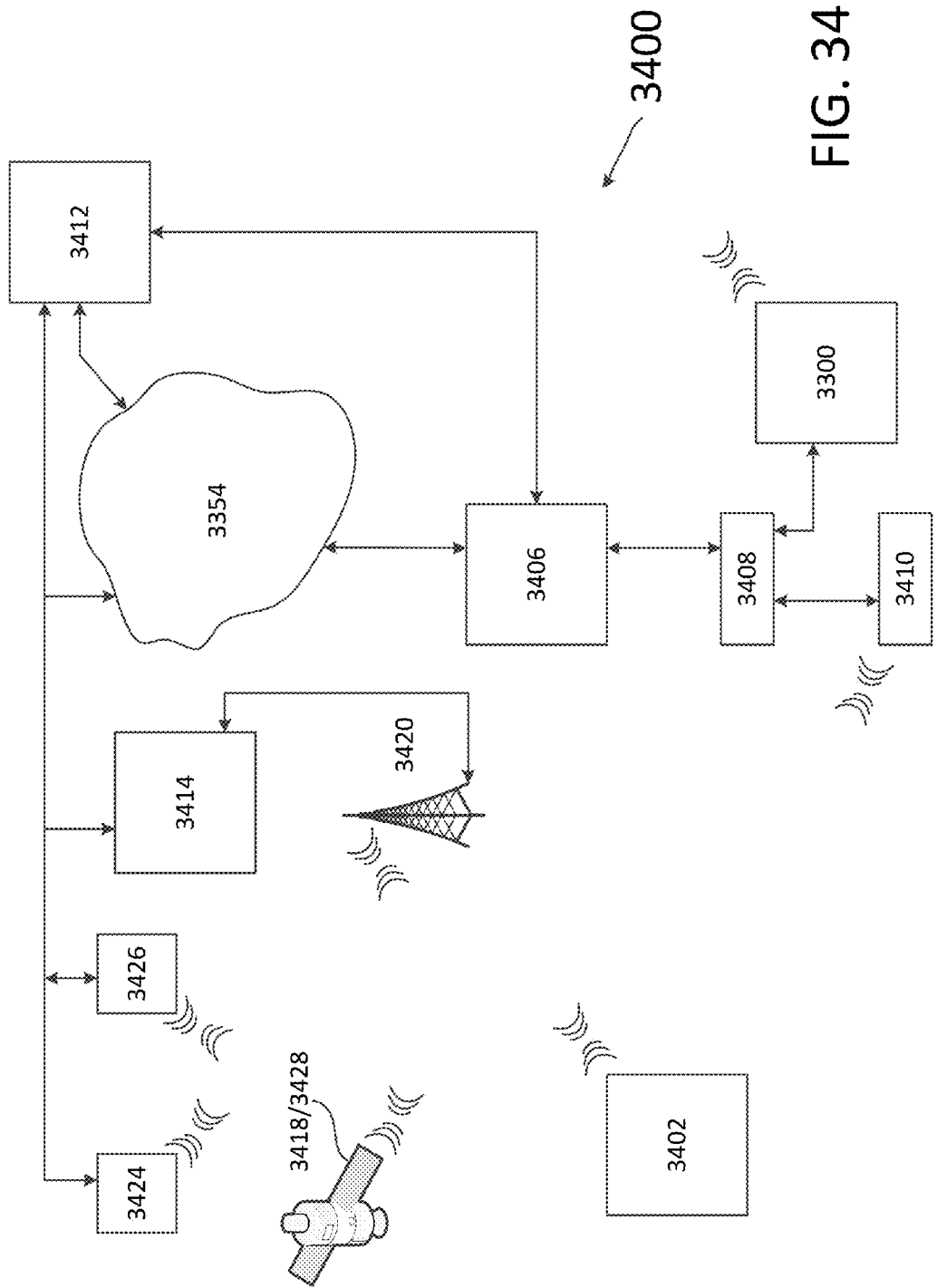

FIG. 34 illustrates a network system suitable for use with the server of FIG. 31 and in which the methods illustrated in FIGS. 4, 6A-6C, 26, and 30 for specifying lighting control systems according to space can be implemented according to an embodiment.

Figure 35A:
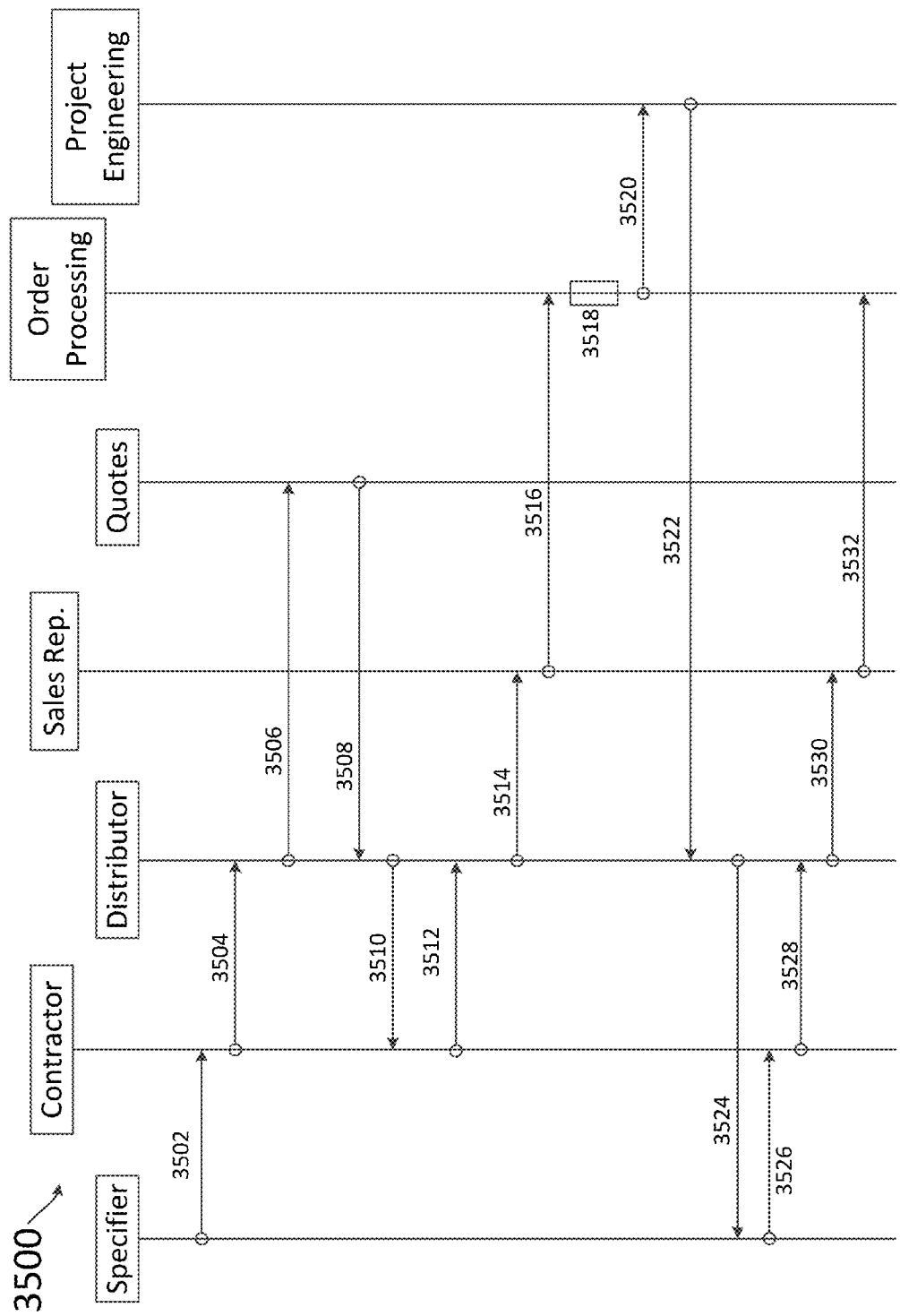
Figure 35B:
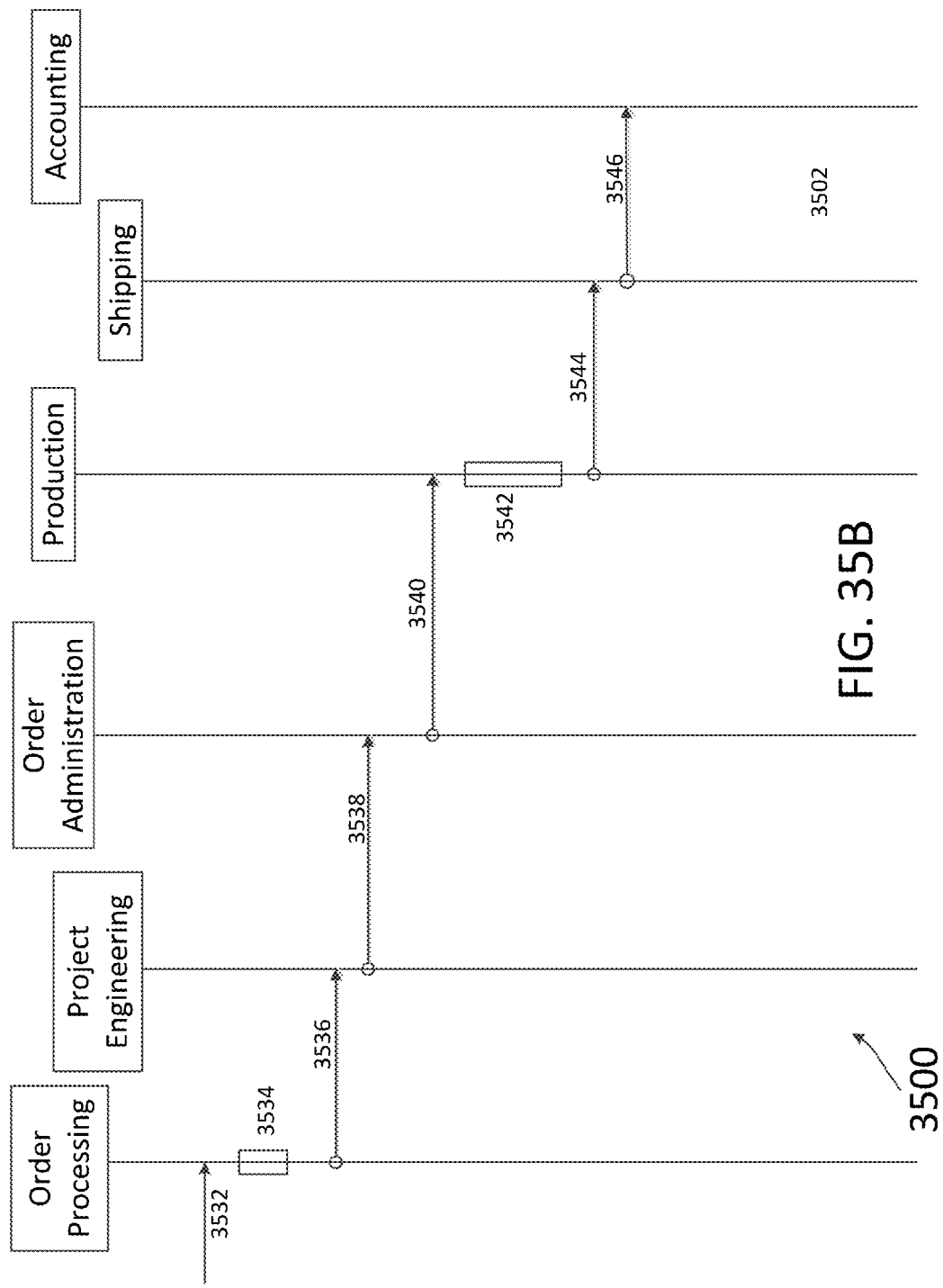

FIGS. 35A and 35B illustrate a portion of a conventional process flow diagram for specifying, designing, procuring, and delivering, among other process elements, of a lighting control system, according to aspects of the embodiments.

Figure 36:
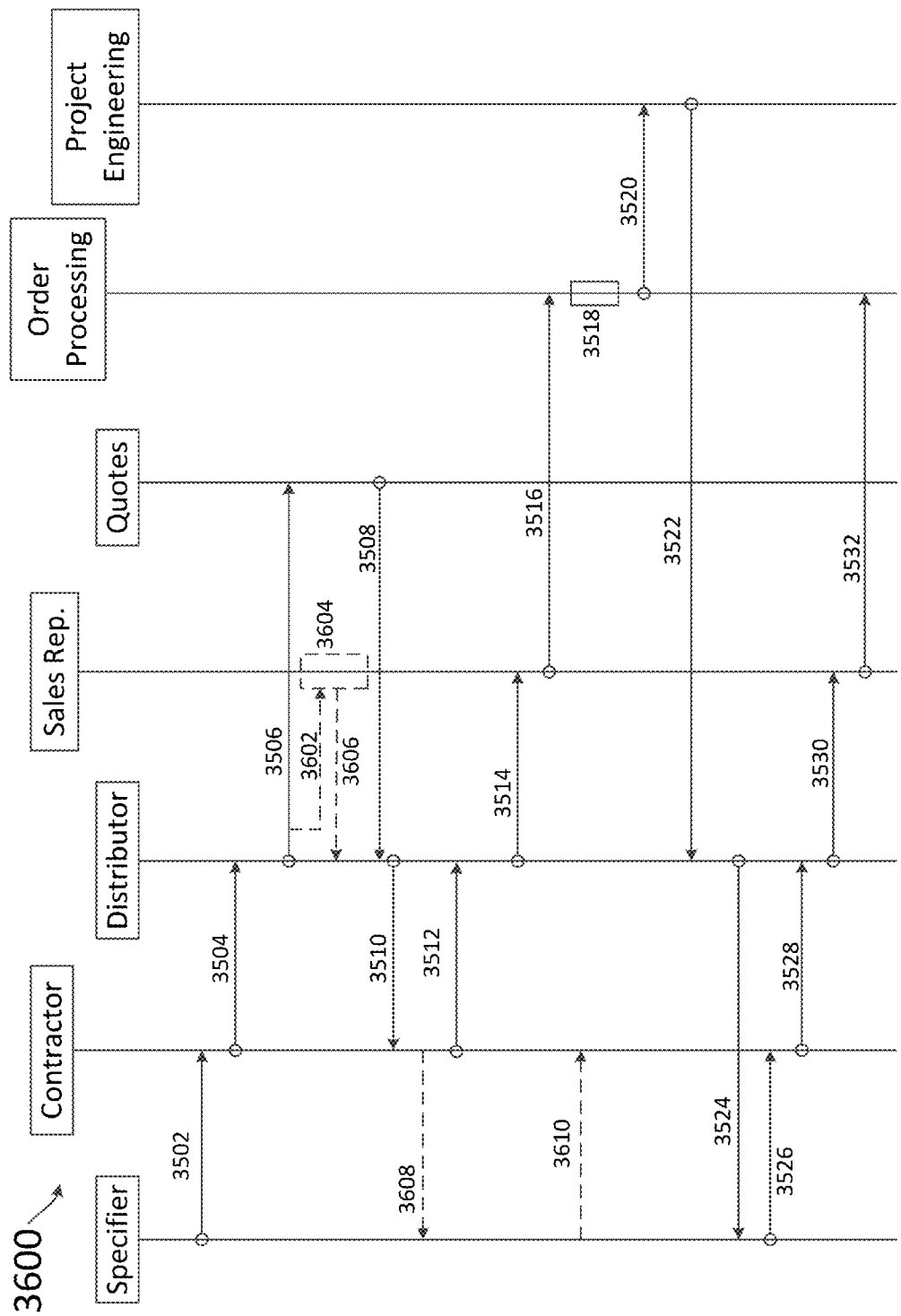

FIG. 36 illustrates a portion of the process diagram of FIG. 35A that is affected by the system and methods described herein according to aspects of the embodiments.

Figure 37:
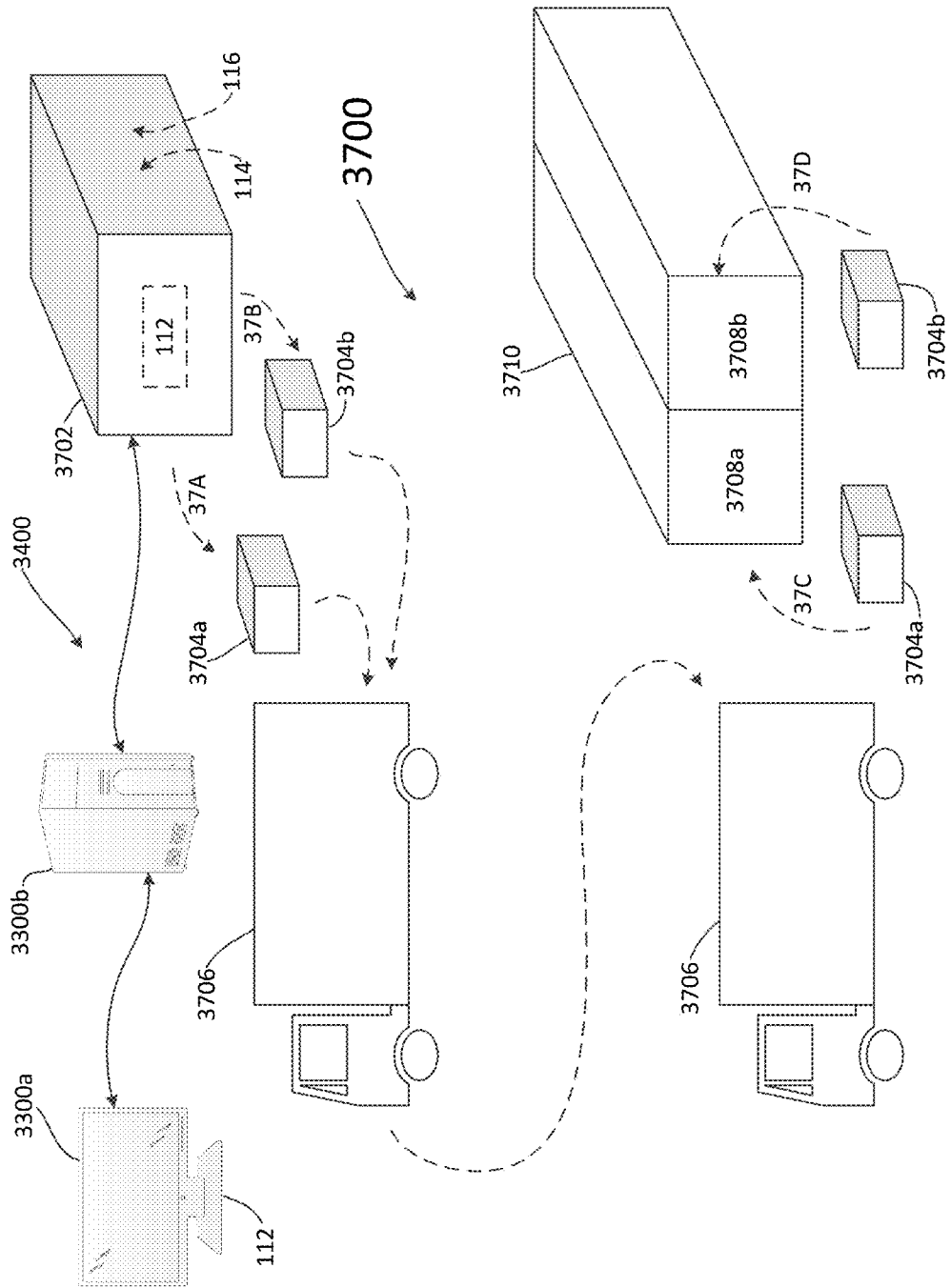

FIG. 37 illustrates a physical environment in which all of the systems, methods, and modes according to aspects of the embodiments, including methods 400, 600, 2600, and 3200, as described in regard to at least FIGS. 4, 6, 26, and 32, respectively, can be used to specify, assemble, package, deliver, and install a lighting control system, among other systems for use in enterprise locations, according to aspects of the embodiments.

FIG. 38 illustrates a representation of a graphical user interfaces that can be part of a webpage, illustrated herein in the form of screenshots, and which are used with the systems, methods, and modes of the various aspects of the embodiments.

DETAILED DESCRIPTION OF THE INVENTION

The embodiments are described more fully hereinafter with reference to the accompanying drawings, in which embodiments of the inventive concept are shown. In the drawings, the size and relative sizes of layers and regions may be exaggerated for clarity. Like numbers refer to like elements throughout. The embodiments may, however, be embodied in many different forms and should not be construed as limited to the embodiments set forth herein. Rather, these embodiments are provided so that this disclosure will be thorough and complete, and will fully convey the scope of the inventive concept to those skilled in the art. The scope of the embodiments is therefore defined by the appended claims. The detailed description that follows is written from the point of view of a control systems company, so it is to be understood that generally the concepts discussed herein are applicable to various subsystems and not limited to only a particular controlled device or class of devices, such as light control systems, shade control systems, or drapery control systems, but can further encompass a building management system (BMS). Those of skill in the art can appreciate that a BMS controls many aspects of the operations of an enterprise or building such as, but not limited to, scheduling of and controlling of turning lights on and off, building maintenance, alarms, heating and air conditioning, lock and unlocking of doors, power usage monitoring, among other aspects of building control.

Reference throughout the specification to "one embodiment" or "an embodiment" means that a particular feature, structure, or characteristic described in connection with an embodiment is included in at least one embodiment of the embodiments. Thus, the appearance of the phrases "in one embodiment" on "in an embodiment" in various places throughout the specification is not necessarily referring to the same embodiment. Further, the particular feature, structures, or characteristics may be combined in any suitable manner in one or more embodiments.

LIST OF REFERENCE NUMBERS FOR THE ELEMENTS IN THE DRAWINGS IN NUMERICAL ORDER

The following is a list of the major elements in the drawings in numerical order.
 100 Block Diagram Lighting Control System Specifying Entities
 102 End User/Property Owner
 104 Architect
 106 Interior Design Consultant
 108 Audi/Video Consultant
 110 Information Technology Consultant
 112 Mechanical Electrical Plumbing Consultant (Specifier)
 114 Agent
 116 Factory Representative
 200 Floor Layout
 300 Lighting Control System
 302 Shade Assembly
 304 Set-top Box
 306 Television
 308 High-Definition Multimedia Interface (HDMI) Cable
 310 Power-Over Ethernet Cable
 312 Electronic Drive Unit
 313 POE Power Supply
 314 Personal Computer (PC) Computer, Laptop, Tablet, Server,
 316 Universal Serial Bus (USB) Cable
 318 ZigBee Gateway
 320 Motion Sensor
 322 Light Dimmer
 324 Keypad
 326 Speakers
 328 Wi-Fi Gateway
 330 Room Controller
 332 Smoke Detector
 334 Door Lock
 336 Intelligent Hub (POE and ZigBee)
 338 Wide Area Network (WAN)
 340 Lights
 342 Shades
 346 Timing Device (Time Clock)
 348 Camera
 350 Display/Monitor
 400 Method For Specifying a Lighting Control System
 402-412 Steps of Method 400

502 Logon Screenshot
504 Logon Window
506 Tool Selection Screenshot
508 Quotation Tool Selection Button
510 Specification Tool Selection Button
512 Crestron Logo
514 SpaceBuilder Logo
516 Mouse Pointer (Pointer)
518 Design Tool Button
520 Project Management Tool Button
600 Method for Creating a Space Specific Part Number in a Lighting Control System
602-642 Steps of Method 600
700 Specifier Information Screenshot
702 Specifier Information Window
704 Username Field
706 Employee ID Field
708 Screenshot 700 Return Button
710 Specifier Information Enter Button
712 Password Field
714 Social Security Number Field
800 Job Information Screenshot
802 Job Information Window
804 Screenshot 800 Return Button
806 Job Number Field
808 Job Location Field
810 Specifier Name Field
812 Specifier Email Address and Cell Phone Number Field
814 Agent Name Field
816 Architect Name/Firm Field
818 Electrical Engineer Name Field
820 Electrical Contractor Name Field
822 Lighting Designer (LD) Name Field
824 Other(s) Name/Information Field
826 Job Information Screenshot Save Button
900 First Space Selection Screenshot
902 First Space Selection Window
904 Space Specification Verification Window
906 Space Selection Screenshot 900 Return Button
908 All Spaces Specified Verification (Yes) Button
910 Floor Selection Window
912 Floor Number Increment/Decrement Button
914 Floor Plan Graphical User Interface (GUI)
916 Office Space 5 GUI
950 Second Space Selection Screenshot
952 Second Space Selection Window
954 Page Selection Button
956 Page Selection Indicator
958 Space Description/Location GUI
1000 Space Information Entry Screenshot
1002 Selected Space Information Window
1004 Space Information Entry Screenshot 1000 Return Button
1006 Enter Lighting Control System (LCS) Information Window
1008 Enter LCS Information Button
1010 Enter No. of Zones Field
1012 Review Job Description Button
1014 Review Occupational Safety and Health Administration (OSHA) Information Button
1016 Space Name Field
1018 Job Name Field
1020 Space Area (ft$^2$) Field
1022 Number of Windows/Space Field
1024 Altitude of Space Field
1026 Available Power in Space Field
1028 Windows Compass Direction/Orientation Field
1030 Floor No. of Space Field
1100 Job Description Screenshot
1102 Job Description Window
1104 Space Description Window
1106 Job Description Screenshot 100 Return Button
1200 Space Specification Screenshot
1202 Space Specification Window
1204 Space Specification Screenshot 1200 Return Button
1206 Zone(s) Selection Entry Button
1208 Zone Control Type Selection Entry Button
1210 Option Selection(s) for Selected Zone Control Type Entry Button
1212 Zone Control Type Entry Field
1214 Description of Zone Control Location Entry Field
1216 Identification of Zone(s) Being Specified Entry Field
1220 Space Specification Information Save Button
1222 Space Specification Completion Button
1300 Zone Controller Options Entry Screenshot
1302 Selected Space Complete Part Number Window (Space Part Number Window)
1303 Selected Space Complete Part Number (Space Part Number)
1304 Zone/Controller Definition Window
1310 Zone Controller/Option Fields
1312 Date Field
1314 Quantity Field
1316 Space Number Field
1318 Job Number Field
1320 Space Name Field
1322 Zone Number(s) Field
1324 Zone Controller Options Entry Screenshot 1300 Return Button
1326 Selected Space Complete Part Number Save Button
1402 Number of Zones Field
1404 Keypad Type for a first Zone Designation Field
1406 Keypad Type for a second Zone Designation Field
1408 Keypad Type for a third Zone Designation Field
1410 Keypad Type for a fourth Zone Designation Field
1412 Occupancy Sensor(s) Type Field
1414 Daylight Sensor(s) Type Field
1416 Touch Panel Type Field
1418 Number of Shades (Shade Quantity) per Zone Field
1420 Shade Motor Type Field
1422 Implementation of Audio/Video Field
1424 Interface Color Field
1426 Power Monitoring Usage Field
1428 Chicago Plenum or Standard Plenum Field
1430 Networking Capability Field
1432 Add New Zone Field
1500 Space Specification Document Creation Screenshot
1502 Save Space Part Number Sheet Button
1504 Print Space Part Number Sheet Button
1506 Generate Space Specification Document Button
1508 Edit Fields Button
1600 Space Specification Part Number Document
1700 Space Specification Package
1702 Cover Sheet
1704 Summary Bill of Materials Section
1706 Space Specification P/N Section
1708 Line Drawing Section
1710 Construction Specifications Institute (CSI) Specification Section
1712 Sequence of Operations Section
1714 Cut Sheets Section
1716 Design Sheet

2500 Space Specification Package Screenshot
2502 Save as PDF Button
2504 Save and Print as PDF Button
2506 Save as CAD Button
2508 Save and Print as CAD Button
2510 Edit Space Specification Package Cover Sheet Button 1702
2512 Edit Space Specification Package Summary Bill of Materials Section 1 Button 1704
2514 Edit Space Specification Package Space Specification P/N Section Button 1706
2516 Edit Space Specification Package Line Drawing Section 1708
2518 Edit Space Specification Package Constructions Specifications Institute Specification Section Button 1710
2520 Edit Space Specification Package Sequence of Operations Section Button 1712
2522 Edit Space Specification Package Cut Sheets Section Button 1714
2523 Edit Design Sheet Section Button 1716
2524 Save as Other Button
2526 Save as Other and Print Button
2528 New Enterprise or Space Selection Button
2530 Quit Button
2600 Method for Providing A Quotation to a Purchaser of the Lighting Control System Using Software Tools and an Internet Webpage
2602-2616 Steps of Method 2600
2700 Quotation Generation Screenshot
2702 Specifier Name Field
2704 Specifier Select Button
2706 Job Number Field
2708 Job Number Select Button
2710 Space Part Number Field
2712 Space Part Number Select Button
2714 Space Part Number Quantity Field
2716 Enter Button
2718 Save/View Finalized Quotation Button
2720 More Spaces (to provide final quote for) Button
2722 Screenshot 2600 Return Button
2800 Finalized Quote Screenshot
2802 Finalized Quote Document
2804 Save Finalized Quote Button
2806 Print Finalized Quote Button
2808 Screenshot 2700 Return Button
2900 Design Tool Feature Screenshot
2902 Design Tool Window
2904 Screenshot 2900 Return Button
2906 Save Design Sheet Button
3000 Project Management Tool Feature Screenshot
3002 Project Management Tool (PMT) Window
3004 Screenshot 3000 Return Button
3006-3030 PMT Data Generation and Display Buttons
3200 Method for Using Space-Based Specifying and Quotation Software Tools via an Internet Webpage to Purchase and Install a Lighting Control System
3202-3208 Steps of Method 3200
3300 PC/laptop/Server (Server)
3301 Shell/Box
3302 Internal Display
3304 Internal Data/Command Bus (Bus)
3306 Memory
3308 Processor(s)
3310 Universal Serial Bus (USB) Port
3312 Compact Disk (CD)/Digital Video Disk (DVD) Read/Write (R/W) Drive
3314 Floppy Diskette Drive
3316 Hard Disk Drive (HDD)
3318 Read-Only Memory (ROM) Device
3320 Random Access Memory (RAM) Device
3322 Server Input/Output (I/O) Interface
3326 External Display
3328 Keyboard
3330 Mouse
3332 Data Storage Unit
3334 Flash Drive Memory Device
3336 CD/DVD Diskettes
3338 Floppy Diskettes
3340 Executable Software Programming Code/Application (Application, or "App")
3342 Wi-Fi Transceiver
3344 Bluetooth (BT) Transceiver
3346 Near Field Communications (NFC) Transceiver
3348 Third Generation/Fourth Generation (3G/4G) Transceiver
3350 Communications Satellite/Global Positioning System (Satellite) Transceiver Device
3352 Antenna
3354 Internet
3356 USB Cable
3358 External Storage Device
3400 Network System
3402 Mobile Device
3406 Internet Service Provider (ISP)
3408 Modulator/Demodulator (Modem)
3410 Wireless Router
3412 Plain Old Telephone Service (POTS) Provider
3414 Cellular Service Provider
3418 Communications Satellite
3420 Cellular Tower
3424 GPS Station
3426 Satellite Communication Systems Control Stations
3428 Global Positioning System (GPS) Satellite
3500 Conventional Process Flow Diagram for Specifying, Designing, Procuring, and Delivering a Lighting Control System
3502-3546 Process Flow Steps of Process 3500
3600 Process Flow Diagram for Specifying, Designing, Procuring, and Delivering a Lighting Control System According to an aspect of the Embodiments
3602-3610 Process Flow Steps of Process 3600 According to Aspects of the Embodiments
3700 Physical Environment
3702 Warehouse Facility
3704 SpaceBuilder Specified Package
3706 Delivery Vehicle
3708 First Delivery Space
3710 Enterprise Location
3800 Webpage/screenshot (SS)
3802 Window
3804 Icon
3806 Menu
3808 Monitor
3810 Desktop
3812 Image
3814 Text File
3816 Pointer
3818 Program
3820 Field
3822 Button
3825 Graphical User Interface

LIST OF ACRONYMS USED IN THE SPECIFICATION IN ALPHABETICAL ORDER

The following is a list of the acronyms used in the specification in alphabetical order.
App Application
3G Third Generation
4G Fourth Generation
App Application
App Executable Software Programming Code/Application
ASIC Application Specific Integrated Circuit
AV Audio/Video
BIOS Basic Input/Output Operating System
BMS Building Management System
BOM Bill of Materials
BT Bluetooth
CAD Computer Aided Design
CD Compact Disk
CLI Command Line Interface
CRT Cathode Ray Tube
CSI Constructions Specifications Institute
DVD Digital Video/Versatile Disk
EC Electrical Contractor
EDU Electronic Drive Unit
EE Electrical Engineer
EE-PROM Electrically Erasable Programmable Read Only Memory
FPGA Field Programmable Gate Array
GAN Global Area Network
GPS Global Positioning System
GUI Graphical User Interface
HDD Hard Disk Drive
HDMI High-Definition Multimedia Interface
HDMI High Definition Multimedia Interface
HFR PO Hold for Release Purchase Order
HVAC Heating-Ventilation and Air Conditioning
I/O Input/Output
ISP Internet Service Provider
IT Information Technology
LAN Local Area Network
LCD Liquid Crystal Display
LCS Lighting Control System
LD Lighting Designer
LTE Long Term Evolution
MEP Mechanical-Electrical-Plumbing
MS-DOS Microsoft Disk Operating System
MODEM Modulator Demodulator
NFC Near Field Communications
OSHA Occupational Safety and Health Administration
P/N Part Number
PC Personal Computer
PED Personal Electronic Device
PMT Project Management Tool
POE Power Over-Ethernet
PROM Programmable Read Only Memory
RAM Random Access Memory
ROM Read-Only Memory
RW Read/Write
SB SpaceBuilder
SS Screenshot
STB Set-top Box
TV Television
USB Universal Serial Bus (USB) Port
UV-PROM Ultra-Violet Light Programmable Read Only Memory
WAN Wide Area Network

MODE(S) FOR CARRYING OUT THE INVENTION

The different aspects of the embodiments described herein pertain to the context of a system and method for specifying, ordering, and delivering a lighting control system for home or commercial use, but is not limited thereto, except as may be set forth expressly in the appended claims.

Aspects of the embodiments are directed towards a system, method, and associated software tools for designing, building and implementing lighting control systems based on the needs and requirements of specific spaces within a building or "enterprise." The process described herein makes it easy to design and repeat lighting system design for individual spaces. Furthermore, the lighting control systems for each of the spaces not only operate autonomously, but can also be fully integrated with each other and are fully networkable with other control systems to unify different space solutions into one enterprise-level control system.

For 40 years Creston Electronics Inc., has been the world's leading manufacturer of advanced control and automation systems, innovating technology to simplify and enhance modern lifestyles and businesses. Crestron designs, manufactures, and offers for sale integrated solutions to control audio, video, computer, and environmental systems. In addition, the devices and systems offered by Crestron streamlines technology, improving the quality of life in commercial buildings, universities, hotels, hospitals, and homes, among other locations. Accordingly, the systems, methods, and modes of the aspects of the embodiments described herein can be used by Crestron to specify, order, and deliver products manufactured by Crestron Electronics Inc., located in Rockleigh, N.J.

Aspects of the embodiments include processes that guide specifiers through a sequence of steps to determine the correct lighting control system for a given space and then specifying the particular components that will go into the lighting control system (controller type, sensors, interfaces, among other devices). A specifier, as described in greater detail below, is a person that determines the requirements of the lighting control system for the particular space, and usually works with the architect, but can also work with the agent and factory representative. The end result will be a complete submittal package: e.g., a bill of materials (BOM), line drawing, specification sheets, and price quotation.

Displayed in one or more of the drawing Figures, and especially FIG. 38, are graphical user interfaces (GUIs) that can be part of a webpage (as illustrated in several instances of screenshots). A GUI is a human-computer interface (i.e., a way for humans to interact with computers) in the form of windows 3802, icons 3804, and menus 3806 that can be manipulated by pointer 3816 associated with use of a mouse (and often to a limited extent by a keyboard as well).

GUIs stand in sharp contrast to command line interfaces (CLIs), which use only text and are accessed solely by a keyboard. The most familiar example of a CLI to many people is Microsoft's disk operating system (MS-DOS), or some modes of Linux.

Referring now to FIG. 38, windows 3802*a-d* are contained portions of monitor screen 3808 that can display its contents (e.g., a program 3818, icons 3804, a text file 3814, or an image 3812; see, e.g., windows 3800*a-d* of FIG. 38) seemingly independently of the rest of display screen 3808.

Note that icons 3804 can be a GUI. A significant feature of GUIs is the ability for multiple windows 3802 to be open simultaneously. Each window 3802 can display a different application/program 3818, or each can display different files (e.g., text 3814, image(s) 3812, or other types of files/ documents) that have been opened or created with a single application. Menu 3806 of window 3802d is another example of a GUI.

Icon 3804 is a small picture or symbol in GUI 3825 that represents a program (or command), a file, a directory or a device (such as a hard disk or floppy). Icons 3804 are used both on desktop 3810 and within application programs. Those of skill in the art are familiar with the term "desktop 3810," which represents monitor screen 3808 when either no other programs are open, or open programs have been minimized or less than full screen. A non-limiting, non-exhaustive set of icons 3804 are also shown in FIG. 38, and include small rectangles (to represent files 3804a,b), file folders 3804d (to represent directories), a trash can 3804e (to indicate a place to dispose of unwanted files and directories) and buttons on web browsers (for navigating to previous pages, for reloading the current page, etc.; not shown in FIG. 38).

Commands are issued in a GUI by using a mouse, trackball, or touchpad to first move pointer 3816 on screen 3808 to, or on top of, icon 3804, menu item 3806, or window 3802 of interest in order to select that object. Then, for example, icons 3804 and windows 3802 can be moved by dragging (moving the mouse with the held down) and objects or programs can be opened by clicking on their icons. In addition, GUIs 3825 can include fields 3820 for entering data, and buttons 3822 for saving the entered data.

As those of skill in the art can appreciate, there are several advantages to the use of GUIs. One substantive advantage of the use of GUIs is that they make computer operation more intuitive, and thus easier to learn and use. For example, it is much easier for a new user to move a file from one directory to another by dragging its icon with the mouse than by having to remember and type seemingly arcane commands to accomplish the same task.

Adding to this intuitiveness of operation is the fact that GUIs generally provide users with immediate, visual feedback about the effect of each action. For example, when a user deletes icon 3804a representing a file, icon 3804a immediately disappears, confirming that the file has been deleted (or at least sent to trash can 3804e). This contrasts with the situation for a CLI, in which the user types a delete command (inclusive of the name of the file to be deleted) but receives no automatic feedback indicating that the file has actually been removed.

In addition, GUIs allow users to take full advantage of the powerful multitasking (the ability for multiple programs and/or multiple instances of single programs to run simultaneously) capabilities of modern operating systems by allowing such multiple programs and/or instances to be displayed simultaneously. The result is a large increase in the flexibility of computer use and a consequent rise in user productivity.

However, as those of the skill in the art can further appreciate, GUIs have become much more than a mere convenience. GUIs have also become the standard in human-computer interaction, and it has influenced the work of a generation of computer users. Moreover, it has led to the development of new types of applications and entire new industries. An example is desktop publishing, which has revolutionized (and partly wiped out) the traditional printing and typesetting industry. Many of the Figures discussed and described below are screenshots of webpages, which very often include one or more GUIs. Every screenshot, however, does not necessarily have to contain a GUI, though most do.

FIG. 1 illustrates a block diagram of lighting control system specifying entities (block diagram) 100 involved in specifying various system of a home or office space. Block diagram 100 of FIG. 1 is simplified, but detailed enough in regard to gaining an understanding of the various aspects of the embodiments. FIG. 1 shows the different "people" or entities that are involved in the later stages of developing or building an enterprise (e.g., a home or office space). It should be understood that FIG. 1 involves entities for homes and office space that typically are fairly expensive to own and operate. That is, most ordinary home owners do not consult with architects directly, but instead a builder or general contractor would have consulted with an architect, or have one on staff, and perhaps the contractor him- or herself would fulfill the functions of interior designer consultant, audio/video (AV) consultant, and so on. However, in very expensive homes, those perhaps that cost several million dollars or more, the end user-property owner would be expected to be consulting with an architect, or at least have their representative(s) consulting with an architect. In addition, the same applies to the purchase and development of commercial property. While all commercial properties will require an architect at the time of building, not all will require the same when a new owner/occupant takes over.

Thus, in the appropriate circumstances, owner/end user 102 (e.g., a tenant that takes over several or more floors of a large commercial building (e.g., 2 World Trade Center, NY, N.Y.), might employ their own architect 104, at least to some extent, and certainly some or all of the consultants that report to the architect 104—interior design consultant 106, audio/video consultant 108, information technology (IT) consultant 110, and mechanical-electrical-plumbing ("MEP") consultant 112. However, in the case of very large buildings in which the end user is a lessee of only a small percentage of the total space available, end user 102 probably would not be able to change the mechanical and plumbing aspects all that much. Other end users 102 may, however, use all of the consultants 106, 108, 110, and 112, shown in FIG. 1, including especially the MEP consultant 112. An agent 114 who represents a lighting control company will offer products that MEP consultant 112 will consider in the specification of the lighting and control systems for the property. Thus, MEP consultant 112 is also known as the "specifier" of the lighting control system. Further, it is known to those of skill in the art that a lighting control system includes lights, fixtures, control systems, shade and drapery systems, heating-ventilation and air conditioning (HVAC) control, security systems, and networking technologies, among others. Networking systems can be used to tie the lighting control system, environmental, HVAC (climate control), security and AV systems together with the IT system. Also shown in FIG. 1 is factory representative 116 who represents a factory, wherein the different products of the selected and specified lighting control system are manufactured, packaged, and shipped to the sight for installation.

In currently used methodologies of specifying lighting control systems, many, if not all, specifiers 112 take a global approach to the job, and determine the needs of the lighting control system based on the building or worksite as a whole. That is, specifiers 112 will look at floor layout 200 such as that shown in FIG. 2, and ascertain that there are about 27 classrooms, with a total floor space of about 625 ft$^2$ each (25'×25'), for a total of about 17,000 ft$^2$. Specifiers 112 will then repeat the same process for the other types of floor space (corridors, labs, offices, lunch room(s), gymnasium, among others). Notably, however, specifiers 112 will not take into account the specific "space" of each type of floor space, and instead specify a certain type of lighting control system for the entire set of floor space of that particular species of floor space. As a result, agent 114 will provide a quote that attempts to satisfy the requirements of specifier 112 per space type. In addition, presuming the order is placed, the product will be delivered in the same manner as it was ordered, i.e., 17,000 ft² of lights, control systems, shades, drapes, and so on. Accordingly, the installers will have pallets upon pallets of product at one central storage location from which they will take their materials to the individual floor space(s) and install it. Such specifying, ordering, packaging, and delivering systems and processes invite waste, breakage, and furthermore, increase the opportunity for mis-specifying the individual spaces in terms of their particular lighting control system requirements.

FIG. 3 depicts a typical lighting control system (LCS) 300 that includes a shading control network configured in a daisy-chain network topology, a lighting control network configured in a mesh network, and an intelligent hub configured in a star network, for use as a system suitable for control of a room in a home, hotel suite, or one or more rooms in a commercial enterprise. Lighting control system 300 includes power-over-Ethernet (POE) interconnections between intelligent hub 336 and electronic date units (EDUs) 312 of each of shade assemblies 302. Shade assembly 302 comprises EDU 312, shade 342, as well as shade control motor that is contained in the spindle and controlled by EDU 312 (but not shown). As the name POE implies, power is supplied to EDUs 312 via power over Ethernet (POE) cable 310 from POE power supply 313, located in intelligent hub 336. EDUs 312 control shade assemblies 302 in accordance with commands received over POE cables 310. In addition, intelligent hub 336 is connected via POE cables 310 to Wi-Fi gateway 328, which allows for communications to PC 314 wirelessly (which can be, as those of skill in the art can appreciate, personal computers/laptops or a central server), or to PC 314 via a wired connection (USB cable 316, or via WAN 338). In this manner, a user can use their PC 314, with specialized software or other applications (Apps) to control the shading and lighting within the room, wherever the room is located (hotel, home, or other commercial space). Intelligent hub 336 contains software/programming capabilities that make it capable of communicating with room controller 330, Wi-Fi gateway 328, WAN 338, and ZigBee gateway 318, and controlling lighting control system 300.

Intelligent hub 336 is further connected via POE cables 310 to room controller 330, and WAN 338. Room controller 330 can communicate with set-top box (STB) 304 and television (TV) 306 by wireless means, including infra-red, but not limited thereto, and can further communicate to all of the other devices within the room as shown in FIG. 3 through either a wired connection, i.e., POE cable 310 (including, for example, EDU 312), or through a wireless connection (e.g., via ZigBee gateway 318). Set top box 304 can communicate to television 306 via HDMI cable 308. As those of skill in the art can appreciate, other wireless means exist for communicating in a fashion similar to ZigBee, but few provide the combination of affordability and performance. Room controller 330 provides the main interface according to an embodiment between external control systems, such as front desk control system in an enterprise environment, and the individual systems/devices within the room as shown in FIG. 3. Room controller 330 can further include a timing function, i.e., timing device 346, for use in setting and executing stored settings and pre-programmed functions and operations. In addition, as discussed in greater detail below, keypad 324 can assume at least some of the functions of room controller 330, and so in some circumstances can be interchangeable. However, for purposes of this discussion, reference will only be made to room controller 330 as being capable of controlling all of the devices within the room shown in FIG. 3, and further the only device capable of bi-directional communications with external control systems per Wi-Fi gateway 328 and WAN 338.

WAN 338 allows for interconnection to other servers and computers (not shown) that, especially in use in a commercial and/or hotel environment, allows for remote monitoring and/or control of the operations of lighting control system 300. For purposes of example only, if lighting control system 300 was located in a large meeting hall, for example a large convention center, then it could be advantageous to remotely monitor and/or control operations therein as such rooms are very expensive to rent or lease, and the control of the lights, shades and other similar apparatus can be very important not only to the occupants but the owners in terms of security, energy costs, and other concerns.

In terms of a home or enterprise environment, WAN 338 and Wi-Fi gateway 328 allows for interconnection with the internet that allows for remote monitoring and/or control by a user or owner. Such remote operational capabilities provides for enhanced security, and conservation of resources. A user or owner can even control lighting and shade assemblies 302 by an App on their cell phone (e.g., 3G/4G (long term evolution (LTE) "smart phone") or other remote, personal communications devices; such operations can make it look like one or more people are in the house, when in reality the owners/occupants could be hundreds or thousands of miles away. To effectuate such command and control, intelligent hub 336 can be connected to ZigBee gateway 318.

As those of skill in the art can appreciate, ZigBee gateway 318 is but just one of a plurality of devices that can be used for low power, low data rate communications between intelligent hub 336 and shading/lighting and other types of devices 320, 322, 324, 326, 332, and 334. Each of these will be discussed in turn.

Through use of room controller 330, a user can be notified of detection of a person via motion sensor 320, or, room automation system can be programmed to turn on certain one or more lights 340 if detection of a person and/or movement occurs. This, of course, can provide additional security. If it is thought that no one should be in the room, then additional security measures can be taken, again via programming of lighting control system 300, to alert an alarm company as well as the owner or user.

Through use of room controller 330, an owner/operator can control lights 340 via light dimmer 322. Light dimmer 322 can communicate wirelessly with ZigBee gateway 318, and can receive/send commands/data there-between, or can communicate via a cable, such as USB cable 316 (not shown). This allows the owner/operator to control the lighting instantaneously, or via a programmed setting (i.e., turn the lights on full at 5:15 PM, then dim them at 10:30 PM, then turn them off at 02:00 AM, and so on).

Room controller 330 and intelligent hub 336 can also communicate via POE cable 310 and wirelessly via ZigBee gateway 318 to keypad 324, or can communicate via a cable, such as USB cable 316 (not shown). Keypads 324 can be used for many different applications, and can be both inside and outside a room. Keypad 324 can be used to receive a code that allows entrance into a room through use of door lock 334; or keypad 324 can receive a temperature setting from an owner/occupant and have that information transferred to room controller 330 (which can then transfer that information to a combined heating/air conditioning unit (not shown)); keypad 324 can also receive notifications from the owner/occupant as to what lights to illuminate, and at what brightness setting, and also open or close shade assemblies 302. As those of skill in the art can appreciate, there are numerous other uses of keypad 324 that are made easier and more productive via use of wireless communications with ZigBee gateway 318, intelligent hub 336, and room controller 330.

Smoke detectors (hereinafter generally referred to as "detectors"; the detectors can be smoke, fire, carbon monoxide, pathogen(s), nuclear, and other bio-hazard type detectors) 332, while not generally requiring or providing much user interface or controllability, can communicate to room controller 330 via wireless communications through ZigBee gateway 318 (or can communicate via a cable, such as USB cable 316 (not shown)), and can further communicate to a central control/monitoring system (not shown) that would be interested in the event of any one or more of the different types of detections. In addition, the same systems can communicate with detectors 332 to ascertain their state of readiness, and to provide false alarms to test the responsiveness of personal in different buildings and/or rooms.

Door lock 334 can receive wireless commands from intelligent hub 336 that have been transferred to it via either/both WAN 338 and Wi-Fi 328 (or can communicate via a cable, such as USB cable 316 (not shown); these commands can originate from a central control system, such as front desk in a hotel environment, and which provide control information such as a resettable lock combination (i.e., a resettable code), or to accept a certain programmed key card that are now ubiquitously used in hotels. Door lock can receive the encoded information from a programmable key card via keypad 324, or can receive a universal override code that might allow the management of the hotel facility to open any door. Further, door lock 334 can report failed attempt (and successful ones) to enter the room. In the near future, hotel rooms, or other enterprise space, will employ biometrics (fingerprints, retinal scans, among other types) that can be obtained and then used to allow entrance to certain locations.

As those of skill in the art can appreciate, lighting control system 300 can be programmed to control one or more of the subsystems described above. In general, the programming of shade assemblies 302, as well as other components of lighting control system 300 will include setting open and close limits for each of electronic drive units (EDUs) 312, assigning one or more EDUs 312 to respective room controllers 330 (it can be the case that in larger environments there could be multiple room controllers 330), when to turn on/off lights 340 and/or control the level(s) thereof, turn on/off audio/video systems, among other programmable functions. Also shown as part of LCS 300 is camera 348 and display/monitor 350, which can communicate wirelessly, or can communicate via a cable, such as USB cable 316. Camera 348 and monitor 350 can be used for security purposes, as those of skill in the art can appreciate. Further, devices 320, 322, 324, 326, 334 can communicate with intelligent hub 336 wirelessly as shown, or via, or can communicate via a cable, such as USB cable 316.

FIG. 4 illustrates method 400 for specifying a lighting control system (LCS) according to an embodiment. According to aspects of the embodiments, method 400 illustrates a top level set of steps that one or more different types of users of the method for specifying a lighting control system take to specify, order, package, and deliver a lighting control system on a space-by-space basis that overcomes the problems described above in regard to the conventional methods of specifying and delivering lighting control systems. Method 400 can be embodied in the form of a software program, or application (App) that can be used on so-called smart phones (3G, 4G (including advanced LTE devices, and future variants), laptop computers, desktop computers, and the like, and can work within one or more network systems, including the internet, a detailed discussion of the devices and network systems being provided below. According to further aspects of the embodiments, different portions of the overall program will reside in a server that can be accessed by the internet, or local area network, and the like. As such, a website has been developed for use by the users of the system and method for specifying a lighting control system according to an embodiment; such website, App, and other programs are collectively referred to as "SpaceBuilder" (e.g., the "SpaceBuilder" website, the "SpaceBuilder" App (for use on smart phones, laptops, and the like), among others. The development and implementation of websites, programs, and Apps is known to those of skill in the art, and as such the same will not be repeated herein in fulfillment of the dual purposes of clarity and brevity.

In addition, certain ones of the plurality of steps of method 400 can also be embodied in an environment in which applications, servers, personal computers, personal electronic devices and the like are not utilized in a programmed manner; that is many aspects of method 400 will occur in a paper form. In this latter case, new method 400' is substantially similar to that as shown in the flowchart of FIG. 4 and method 400, but there are some differences such as the absence/modification of step 402 (wherein a user logs into a website or App) or decision step 404 (wherein a user will manually, instead of through an App or website, access different tools), Further, substantially all the tools and documents can be accessed physically and/or manually, even though documents and specifications and tools may reside on a computer and be accessed via word processing or spreadsheet programs, among other types.

In method 400 a user begins by logging into a SpaceBuilder website, at SpaceBuilder logon webpage/screenshot (screenshot) 502 (shown in FIG. 5), in method step 402. Screenshot 502 includes SpaceBuilder logo 514, Crestron Electronics Inc. registered trademark swirl 512 (registration number 3250729), logon window 504, and mouse pointer (pointer) 516, which can be used to navigate logon screenshot 502 and logon window 504 to, as known to those of skill in the art, put a cursor (not shown) in a field in which data can be entered. Further, pointer 516 can be used in all of the screenshots, windows, and data entry fields as discussed herein. A previously provided username and password can be entered, in window 504, or a new user can apply for the same, and systems and methods known to those of skill in the art can certify that the user attempting to acquire a username and password is allowed to obtain the same, and be given permission to proceed. Or, a temporary username can be provided on a "guest" basis; such guests typically will have to provide their name, and some other identifying information (such as a valid email address) in order to obtain the temporary access. Sometimes those with temporary access are only given permission to access only certain ones of the features of the SpaceBuilder website, as known to those of skill in the art. However, for the purposes of this discussion, it will be presumed that the user is known user, and has access to all of the features of the SpaceBuilder website and App.

Following logon, method 400, which is embodied within SpaceBuilder website as SpaceBuilder webpage/screenshot 502 shown in FIG. 5, asks in decision step 404 what type of tool does the user want to access: The specification tool, quotation tool, design tool, or project management tool? In screenshot 506 (FIG. 5), this is shown as four graphical user interface (GUI) windows (buttons): Quotation button 508, Specification button 510, Design button 518, and Project Management button 520. If the user is agent 114, factory representative 116, or specifier 112, the user can choose the specification tool in decision step 404, which brings the user to the specification tool in step 406. If the user is an agent 114 or factory representative 116, the user can select the quotation tool in decision step 404, which brings the user to the quotation tool in step 410. That is, specifiers 112 are restricted from accessing the quotation tool, which likely contains company confidential and/or proprietary information, including wholesale and/or retail costs. A detailed discussion of the specification tool is made in reference to FIGS. 6A, 6B, and 6C, among others; and a detailed discussion of the quotation tool is made in reference to FIG. 26, among others. Alternatively, if the user is factory representative 116, the user can select design tool in decision step 404, which then brings the user to the design tool in step 408, and if the user is factory representative 116, the user can also select the project management tool in decision step 404, which then brings the user to the project management tool in step 412, according to aspects of the embodiments. As those of skill in the art can appreciate, in the ordinary course of events, specifier 112 would be the first to use the SpaceBuilder tool set, followed by the designer (if needed), and then the quoter (e.g., steps 404-406-408 then 410). The project management tool, accessible via step 412, can be accessed and utilized, as described in greater detail below, at virtually any time in the process of specifying through actual delivery and installation. Alternatively, different orders of users can be accommodated by method 400 according to various aspects of the embodiments, and those of skill in the art should appreciate that the aspects of the embodiments are not limited to any one order of process flow of method 400.

FIG. 29 illustrates design tool features screenshot (screenshot) 2900 associated with an internet webpage and the method of FIG. 4 according to an embodiment. Screenshot 2900 includes design tool window 2902, screenshot 2900 return button 2904, and save design sheet button 2906.

Design sheet 1716 is created through operation of the design tool as described in reference to FIG. 29. Design sheet 1716 can contain information about any design changes that might need to be made to any of the components of space specification part number 1303; for example, if there is programming required for any of the processors or controllers, the programming would be briefly described in design sheet 1716, and reference provided to file names and locations, and other details that could be useful as can be appreciated by those of skill in the art.

FIG. 30 illustrates project management tool features screenshot (screenshot) 3000 associated with an internet webpage and the method of FIG. 4 according to an embodiment. Screenshot 3000 includes project management tool window (project management tool (PMT)) 3002 and screenshot 3000 return button 3004. A user of the PMT 3002 features 3000 can perform certain actions using the GUI buttons shown thereon, beginning with finding a space specification package based on space specification part number 1303, customer name, address of the enterprise, or by specifier, among other methods known to those of skill in the art, through use of select space specification package button 3006. Each of buttons 3006-3030, when clicked on by the user with pointer 516, will open another screenshot (or screenshots), that can provide further options for data generation and display, again as can be appreciated by those of skill in the art.

Thus, for example, once a particular space specification number 1303 has been selected using space selection button 3006, the user of the project management tool set can select any one of buttons 3006-3030 to determine and display certain data. Beginning with generate process flow diagram button 3008, clicking on this will lead the SpaceBuilder program (as embodied in method 400) to generate a process diagram similar to that of FIGS. 35A and 35B, as described herein, which illustrates which portions of the process the selected space specification package has accomplished. Similarly, pressing any one of the buttons 3006-3030 will generate additional screenshots to open (not shown), that causes the SpaceBuilder program as embodied by method 400 to obtain data for the particular specification package selected, and generate statistics and graphics, as known to those of skill in the art, related to the selected process.

For example, pressing generate shipping statistics/graphics button 3028 will cause the SpaceBuilder program as embodied in method 400 to obtain all data as stored in one or more servers, computers, and/or other memory storage devices, and create statistics and graphical images related to those statistics, in forms known to those of skill in the art, for the shipping department as it relates to the selected space specification package. Such displays of statistics and graphical images can be saved, printed, sent via electronic email to others, or discarded, dependent upon the circumstances. Such actions are known to those of skill in the art.

Method 600, which embodies the specification software tool of method 400, begins with step 602 wherein a user— specifier 112—enters their specifier information. In order to get to method 600, specifier 112 has been transferred from screenshot 506, and pressed button 510, and this brings specifier 112 to specifier information screenshot (screenshot) 700, shown in FIG. 7. When presented with screenshot 700 as shown in FIG. 7, specifier 112 can provide a username (in username field 704) and password (in password field 712), or some other identifying information, such as an employee identification number (in employee ID field 706), or even a social security number (in social security number field 714), in specifier information window 702. Once the correct information for specifier 112 has been entered, specifier 112 can then position the pointer of the mouse to specifier information enter button 710, and click on it, causing the information placed in specifier window 702 to be entered and verified by the SpaceBuilder server. The SpaceBuilder server will then, according to further aspects of the embodiments, access one or more of a plurality of related or unrelated servers, via one or more of a plurality of websites and/or webpages, to access information contained therein to verify an identity of specifier 112. As those of skill in the art can appreciate, the processes of entering information, i.e., using a mouse pointer 516, or the "tab" button, are well known, and other processes exist that accomplish the same task, all of which are considered to be within the scope of the aspects of the embodiments. A detailed discussion thereof is not needed in fulfillment of the dual purposes of clarity and brevity.

If, for some reason, a person other than a specifier gets to screenshot 700 in error, or if specifier 112 simply wants to return to a previous screenshot, the person/specifier can return to screenshot 506 by pressing screenshot 700 return button 708, which is a return (to previous screen or webpage) button, as known and appreciated by those of skill in the art.

Figure 8:

In step 604, method 600 requests enterprise location job information (job information). Job information screenshot (screenshot) 800, which shows how job information can be entered, is shown in FIG. 8. Job information can include a job number (job number field 806), the agent associated with the job number (agent name field 814), the job location (job location field 808), specifier contact information (unless already on file with the system according to the embodiments; specifier name and cell phone number and email address fields 810, 812, respectively), architect information (name of architect and/or firm, and their job number; architect name/firm field 816)), electrical engineer (EE) information (EE name field 818), lighting designer (LD) information (LD name field 822), electrical contractor (EC) information (EC name field 820), among other job information (including, for example, other(s) name/information field 824), all of which are illustrated in screen shot 800 of FIG. 8, and are part of job information window 802 according to aspects of the embodiments. As those of skill in the art can appreciate, the term "webpage" and "screenshot" can be used interchangeably. As with other screenshots, screenshot 800 return button 804 exists to return the user to a previous screenshot or webpage if desired. Once all of the information has been entered, specifier 112 can press job information screenshot save button 826, and the information will be saved by method 600.

According to further aspects of the embodiments, network 3100, discussed in greater detail below, can be used to implement the methods described herein for modeling a space for a lighting control system in an enterprise. Further, as those of skill in the art can appreciate, means can exist for later retrieving any stored information and correcting the same should problems and/or errors be found to exist. Such operations are known to those of skill in the art and as such a detailed description of the same shall not be repeated herein in fulfillment of the dual purposes of clarity and brevity.

Figure 9A:
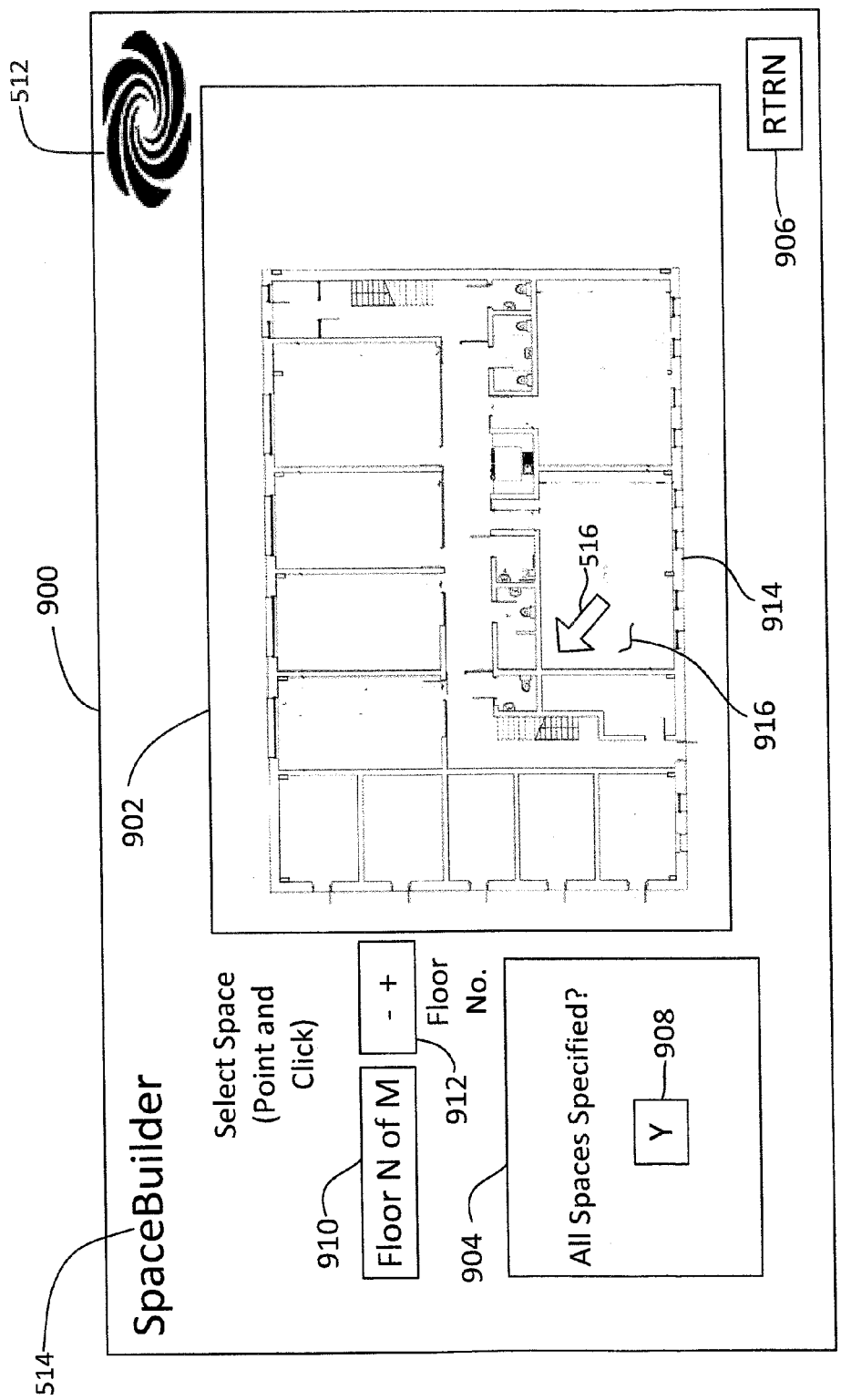
Figure 9B:
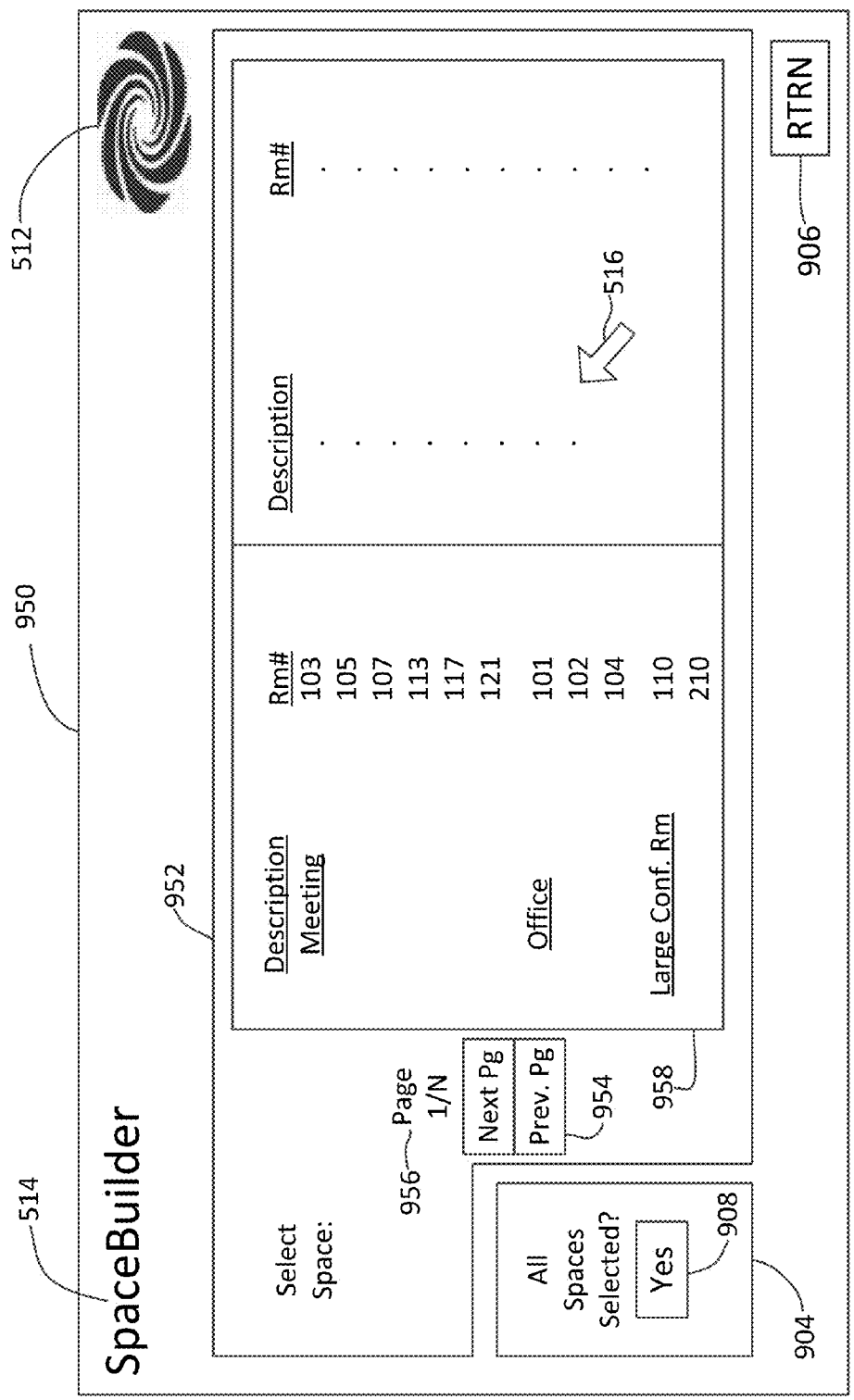

Following the entry of job information in method step 604, method 600 proceeds to step 606, wherein method 600 requests a space selection of the enterprise (enterprise being another name for "building" or "home", or collection of buildings, or some other property within which an LCS is being installed). Method 600 can present at least two different means for selecting the space to be modeled, as shown in FIGS. 9A, and 9B, which represent alternative means and methods for selection and subsequent specification of a space within an enterprise location. Once specifier 112 has saved the job specific information as shown in FIG. 8, and screenshot 800, method 600 will bring specifier 112 to screenshot 900 or 950. Each will be discussed in turn.

In screenshot 900 (FIG. 9A), specifier 112 is presented with floor plan GUI 914 in first space selection window 902 of the enterprise to be modeled. If there is more than one floor, floor selection window 910 and floor number increment/decrement button 912 will be shown, indicating a current selection of "1/N floors," and allow specifier 112 to select another floor to specify spaces within. Other methods of selecting one of multiple floors can also be used, as can be appreciated by those of skill in the art. Floor plan GUI 914 is a GUI object located in space selection window 902 according to methods and processes known to those of skill in the art. Each space can be selectable as a GUI, and in the view shown in FIG. 9A, office space 5 GUI 916 has located on it pointer 516 by which specifier 112 can select by clicking the mouse button (or some similarly equivalent action on a different type pointer device, the operation of which is known to those of skill in the art), and a subsequent screen is presented, screenshot 1000.

Figure 10:
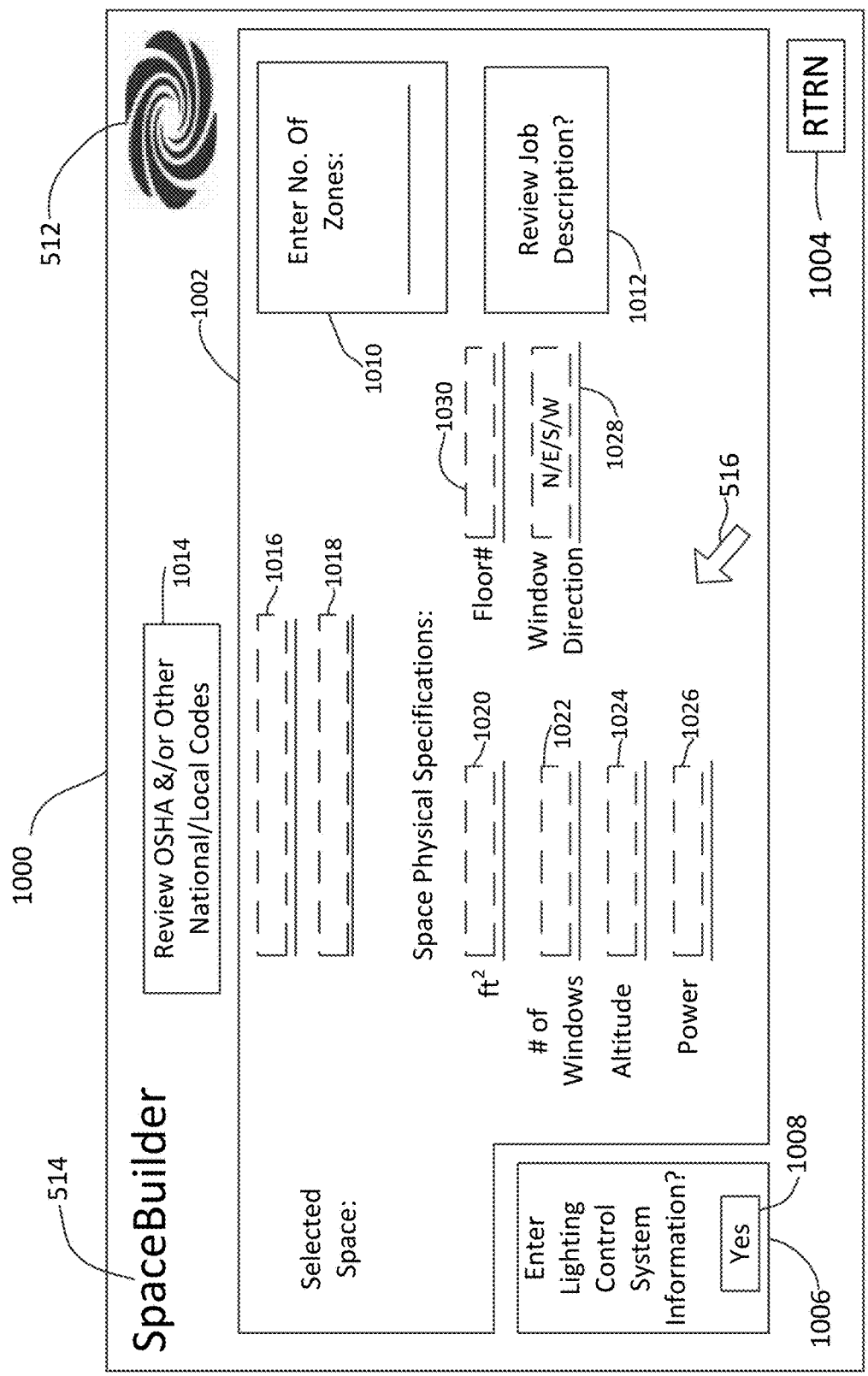

In screenshot 1000, shown in FIG. 10, specifier 112 is presented with information about the selected space, and from there, can start entering specifying information that will result in a detailed, space-specific part number that allows the system and method according to embodiments to model and quote an LCS, package the same according to space, and have the space-specific ordered package of materials delivered exactly to the space where it is needed. A detailed discussion of FIG. 10 and screenshot 1000 is presented below.

As described above, screenshot 950, shown in FIG. 9B, provides a means and method according to aspects of the embodiments for selecting a space and beginning the process of entering space-specific specifying information by specifier 112. In screenshot 950, specifier 112 is presented with a list of GUI enabled, alpha-numeric identifiers in space description/location GUI 958 in second space selection window 952 that lists the different spaces that are to be modeled according to aspects of the embodiments. The list of different spaces can be ordered in various manners, such as by room number, floor, description, among others, as can be appreciated by those of skill of the art. According to further aspects of the embodiments, screenshot 950 can also be used in conjunction with window 902 of FIG. 9A. If there are more descriptions/location identifier GUIs than can fit in the allotted space of space description/location GUI 958, a "Next Pg./Prev. Pg." button 954 can be appropriately pressed by pointer 516, and page selection indicator 956 will show "Page 1/N", in second space selection window 952. As with screenshot 900, specifier 112 selects a space by positioning pointer 516 of a mouse over the desired space, clicking the mouse button (or some similarly equivalent action on a different pointer device, the operation of which is known those of skill in the art), and a subsequent screen is presented, such as screenshot 1000, described in greater detail below, for entering the LCS information for that particular space.

FIG. 10 illustrates space information entry screenshot (screenshot) 1000 that shows information of a job as described in FIG. 8 and screenshot 800 and the space selected in either of FIGS. 9A and 9B (screenshots 900/950) and method steps 604, and 606 according to an embodiment. In screenshot 1000, specifier 112 is presented with information about the selected space, and from there, can enter specifying information that will result in a detailed, space-specific part number which allows the system and method according to embodiments to model and quote an LCS, package the same according to space, and have the space-specific ordered package of materials delivered exactly to the space where it is needed. Once all of the space specific information has been specified for the selected space, specifier 112 can enter additional space specific information for further selected spaces, upon return to screenshot 950.

Following selection of a space in method step 606 (screenshot 900 shown in FIG. 9A, or screenshot 950 shown in FIG. 9B), method 600 proceeds to method step 608; method step 608 is embodied as screenshot 1000 shown in FIG. 10. In screenshot 1000, selected space information window (window) 1002 is presented to specifier 112, wherein all or most of the fields of window 1002 are populated with information found in a database related to the specific job for the enterprise. For example, the information for each of space name field 1016, job name field 1018, space area ($ft^2$) field 1020, number of windows/space field 1022, altitude of space field 1024, available power in space field 1026, windows compass direction/orientation field 1028, and floor number of space field 1030 all come from screenshots 800, and 900 and/or 950, and are present as soon as specifier 112 opens screenshot 1000. Any of aforementioned fields of information pertaining to the selected space can be missing or erroneous and therefore can be corrected/filled in according to methods and processes known to those of skill in the art. In addition, space information entry screenshot 1000 return (return) button 1004 is provided to return specifier 112 to previous screenshot 900/950, if needed.

If specifier 112 wants to take a look at a description of the overall job, or a space description, specifier 112 can press review job description button (button) 1012 that takes specifier 112 from screenshot 1000 to job description screenshot (screenshot) 1100. In screenshot 1100 as shown in FIG. 11, job description window 1102 provides a global view-description of the entire job, and space description window 1104 provides a more detailed description of the particular space that specifier 112 is now specifying use the systems and methods according to the aspects of the embodiments. Once specifier 112 is done reviewing the information about the job and/or space, specifier 112 can return to screenshot 1000 shown in FIG. 10 using job description screenshot 1100 return button 1106. Furthermore, if specifier 112 is interested in view OSHA requirements and/or local code requirements, specifier 112 can press review OSHA information button (button) 1014 and specifier 112 will be directed to appropriate external links, such as the main OSHA website, https://www.osha.gov/law-regs.html, which can then be perused to find the appropriate regulations for the soon-to-be specified LCS.

In method step 608, specifier 112 enters the number of zones using enter number of zones field (field) 1010 that can be provided for the specific space being reviewed; this is the first instance in which space-specific data is being specified for the selected space. A zone can be defined as a set of homogeneous lighting fixtures with similar control intent. As those of skill in the art can appreciate, the specification of the number of zones depends on the size of the space and other factors, as presented in window 1002, and upon the knowledge of industry standards (such OSHA, among others) that described what safe and/or necessary levels of illumination are required, in addition to whatever special features the customer (end user or property owner) wants for the space.

The special features information can be found, for example, in screenshot 1100 as shown in FIG. 11. The standards for OSHA and perhaps other national and/or local standards can be obtained by pressing button 1014 ("Review OSHA and/or other National/Local Codes"), which directs specifier 112 to external websites, as described above. The screenshot that lists that information, not shown, will also have a return button to bring specifier 112 back to screenshot 1000 and FIG. 10, or, because they generally are unique websites, they will open in a separate and new instance of the web browser.

The number of zones that is entered in step 608 in field 1010 sets a zone counter that is later checked with respect to method step 615. While it is possible to specify a subset of zones that is less than the total number of zones for a particular space, the zone counter keeps track for specifier 112, and will not let specifier 112 exceed the zone count for the space. However, according to further aspects of the embodiments, it is possible, using known processes in screenshot and webpage design, to provide means and functionality to correct incorrectly entered information. Such method steps do not need to be discussed herein in fulfillment of the dual purposes of clarity and brevity.

According to further aspects of the embodiments, it is known to those of skill in the art that a space can have such a number of zones that it require a plurality of controllers, wherein the plurality of controllers can include a number (greater than one) of the same type of controllers, or one or more of each of different types of controllers. For example, a specifier can specify a space to warrant 30 zones; 24 zones for a first type of controller (controller-1), 4 zones for a second type of controller (controller-2), and 2 zones for a third type of controller (controller-3). Thus, in summary, specifier 112 could determine that for the space named "X", six controller-1 types are needed (4 zones/controller-1), one controller-2 type is needed (4 zones/controller-2), and two controller-3 types are needed (one zone/controller-3).

After entering the number of zones in field 1010, specifier 112 then has to define or model each of the zones with particular sets of equipment. This begins with the pressing of enter lighting control system button (button) 1008 in enter LCS information window 1006 (FIG. 10, screenshot 1000), which asks specifier 112 to enter lighting control system information. Upon pressing button 1008, specifier 112 is taken to FIG. 12, and space specification screenshot (screenshot) 1200.

Screenshot 1200, shown in FIG. 12, provides a gateway for specifier 112 to start entering space specific information that can be used to create the complete part number used in the different aspects of the embodiments for modeling a light control system, shown in FIG. 13. In space specification screenshot (screenshot) 1200, there is space specification window 1202 within which is located space number field 1316 that illustrates the selected "N" of at least two spaces that are currently being specified. Further in screen shot 1200 are an identification of zone(s) being specified, entry field (zone entry field) 1216, which allows specifier 112 to identify which zones are currently being specified at the present time. According to an embodiment, zone entry field 1216 can be in the form as shown, "N of M" wherein "M," the total number of zones, is obtained from previously entered information, specifically enter number of zones field 1010, described above. According to other aspects of the embodiments, the zone number information can be presented in different forms, the methods of which can be appreciated by those of skill in the art.

According to further aspects of the embodiments, the data that is entered in zone entry field 1216 can be a single zone, or a plurality of zones. By way of non-limiting example, method 600 can obtain the total number of zones entered enter number of zones field 1010 as described above to indicate the total number of zones that need to be specified, and then specifier 112 indicates which ones of those total number of zones is being specified (e.g., "1 of 28" or "1-4 of 28" and so on) in zone entry field 1216. According to further aspects, specifier 112 does not need to specify the zones in any particular order; method 600 retains which zones have been specified, and will alert specifier 112 if an attempt is made to re-specify a particular zone, and will allow specifier 112 to do so, albeit with the prerequisite amount of warnings ("Re-specify zones "X of Y"?). In addition, specifier 112 can also provide a description of the location of each zone as is also shown in description of zone control location entry field 1214.

Once the zone or zones being specified has been identified in field 1216, specifier 112 then presses zone selection entry button 1206 and that information is stored. Then, for the zone or zones being specified, specifier 112 selects a control type in zone control type entry field 1212. Examples of control types include, but are not limited to, 0-10v controllers, DALI controllers, Forward Phase controllers, Reverse Phase controllers, and Switched User Interfaces, which can be defined as keypads, and touch panels. According to further aspects of the embodiments, other examples of controllers include GLPAC, GLPP, GL-iPac-SW8, iLux, GLDALI, GLFLV, GLILUX, and GLNET, all controller products manufactured by Crestron Electronics Inc., of Rockleigh, N.J. For example GLPAC is a 4 or 8 zone controller, and can control switching loads, and 0-10V dimming loads.

Once a control type is selected and entered, specifier 112 can then press zone control type selection entry button 1208 to associate the specified control type with the zone or zones being specified. For each specific type of zone control type, there are at least one or more options that can be selected for the zone control type. The options can be selected through option selection(s) for selected zone control type entry buttons $1210_{1-N}$.

Referring again to FIG. 6, it can be appreciated that what has thus-far been described above are method steps 610, wherein a specific zone is selected, and then decision step 612 and step 614, wherein one or more of a plurality of options for the selected zone control type are selected and associated with the zone or zones being specified. Selection of any one of the buttons $1210_{1-N}$ brings specifier 112 to zone controller options entry screenshot (screenshot) 1300, shown in FIG. 13.

FIG. 13 illustrates zone controller options entry screenshot (screenshot) 1300 that shows all of the fields of a complete part number being specified by method 600 according to an aspect of the embodiments. That is, the net result of the steps of method 600 is to fill in all of the fields of screenshot 1300 as is desired, to create a complete part number that is space specific, and which provides the advantages of the aspects of the embodiments described herein. In FIG. 13, screenshot 1300 includes selected space complete part number window (space part number window) 1302, which includes zone controller/option field 1310, date field 1312 (which automatically contains the current date (and can include the time)), quantity (of the controller type 1212) field 1314, space number field 1316, wherein the space number being defined in method step 606 "Job information" and screenshots 900, 950, FIGS. 9A and 9B; and further wherein the space number is defined as being N/M, wherein N is the particular space number being specified, and M is the total number of spaces of the enterprise location, and still further wherein M is 2 or greater according to aspects of the embodiments. As can be appreciated by those of skill in the art, the access of screenshots 900, 950 and selecting a space to specify creates the "N of M" data point that is then automatically filled into space number field 1316. Further, other information is presented such as job number field 1318 (from step 604, FIG. 8 and screenshot 800), space name field 1320 (from step 606, FIG. 9 or 9A (this information is automatically populated, if known by the system according to aspects of the embodiments, as is space name field 1016 of FIG. 10, described above), and screenshots 900, 950), and zone number(s) field 1322 (which uses the number of zone(s) entered into field 1010, from FIG. 10, and screenshot 1000). According to further aspects of the embodiments, certain pieces of information are entered by specifier 112 once screenshot 1300 is encountered; that is, quantity field 1314 is entered manually by specifier 112, and the particular zone of the space ("N") is entered manually by specifier 112; according to further aspects of the embodiments, if "M" of field 1322 is equal to "1" then there will be no "'N' of M" to enter in field 1322. Once all of the information is entered in the fields of space part number window 1302, including the options in zone controller/option field 1310), and the specifier presses selected space complete part number save button (save button) 1326, the information in space part number window 1302 is saved in a data file, and can be used in further processing including the remaining steps of method 600. Once the save process occurs by pressing save button 1326, the saved part number is defined as selected space complete part number (space part number) 1303, and this contains all of the information as shown in space part number window 1302. According to aspects of the embodiments, space part number 1303 is a space-centric part number, meaning that the part number uniquely identifies all of the components of the system being installed, e.g., an LCS (but not so limited thereto), the location of the installation of the components so specified (e.g., a zone number), including, among other information, optional information such as enterprise name, address, specifier identifying information, geographical information (compass directions windows face, among other types), and other information, if so desired, according to aspects of the embodiments.

In addition, although not part of space part number window 1302, also shown in screenshot 1300 is zone/controller definition window 1304, which itself contains information from zone control type entry field 1212, and information from identification of zone(s) being specified entry field 1216. The information for fields 1212 and 1216 originate in entries made in regard to screenshot 1200 according to further aspects of the embodiments. According to further aspects of the embodiments, pressing zone controller options entry screenshot 1300 return button 1324 brings the user from screenshot 1300 to screenshot 1200.

According to further aspects of the embodiments, as part of step 614, and the selection of options with regard to a selected controller in step 610, is the inclusion of one or more programming options for the controller. That is, according to aspects of the embodiments, specifier 112, working with agent 114 and factory representative 116, among others, can include one or more externally prepared and provided programs that can control the controllers and all or substantially all of the devices selected in the different options. This provides the systems, modes, and methods according to the aspects of the embodiments with the ability to provide a truly "ready to operate" LCS, or other type of system, upon installation.

Attention is now directed towards FIG. 14, which illustrates a detailed example of a partial space specification part number 1303 specified in accordance with use of the method of FIGS. 6A and 6B and the screenshots of FIGS. 7-12 according to an embodiment. FIG. 14 illustrates a partially filled zone controller/option field 1310 prior to the completion of decision step 612 and step 614 for a GLPAC type controller, and what a specifier would see from screenshot 1200 as the options are being filled in. Those of skill in the art can appreciate that different part number fields 1400 exist for different types of controller/option combinations, and each could look substantially different from each other. Therefore, the example of FIG. 14 is but one of many different part number fields 1400 that can be created in accordance with the aspects of the embodiments, and as such should not be taken in limiting manner. According to further aspects of the embodiments, the portion of space specification part number 1303 shown in FIG. 14 omits the space-related portion (space number field 1316).

Zone/controller option field 1310 is defined in the manner shown in FIG. 14 because the controller (in this case, a GLPAC controller, manufactured by Crestron Electronics Inc., of Rockleigh, N.J.) that defines the fields of controller option fields 1310 dictates those fields. Thus, a different set of zone controller/option field 1310b could contain more option categories, less option categories (herein labelled 1402-1432), or the same number of option categories as those shown in FIG. 14 (but could be the same or different types of fields). Furthermore, the options of different controllers or other devices that can be specified using the systems and methods described herein can be the same or different than those shown in FIG. 14. Nonetheless, for the purposes of illustrating the aspects of the embodiments, discussion is made of part number field 1400 to show how the different options can be filled to generate a complete part number (through the completion of method 600). According to further aspects of the embodiments, entry of the plurality of options can be entered separately and independently of the other options, and can further include accessing other websites, webpages, and databases, to determine the characteristics and part numbers of the plurality of components that make up the different options.

In the case of FIG. 14, a GLPAC controller includes at least sixteen different options fields, 1402-1432. Option field 1402 corresponds to the number of zones (which is dependent on the type of controller that is initially specified, e.g., "GLPAC"), option fields 1404-1410 corresponds to the types of keypads for each zone, option field 1412 corresponds to the type of occupancy sensors that can be used, option field 1414 corresponds to the type of daylight sensors, option field 1416 corresponds to the use of a touch panel or not, option field 1418 corresponds to the number of shades for the zone(s) in question, option field 1420 corresponds to the type of motor to use with the shades, option field 1422 corresponds to the implementation of "AV" or not, option field 1424 corresponds to an interface color, option field 1426 corresponds to the use of power monitoring or not, option field 1428 corresponds to the use of a Chicago plenum or standard plenum, option field 1430 corresponds to whether the controller needs networking capability (or not), and option field 1432 corresponds to whether a new zone can be added to this zone, and if yes, whether it provides forward phase, reverse phase, or 120 VAC, 20A plug load capability.

Those of skill in the art can appreciate that not all options need to be specified. According to further aspects of the embodiments, however, method 600 will not allow a user to prematurely leave the option specifying steps unless and until all of the required options have been specified; according to further aspects of the embodiments, un-specified options can exist that are truly "optional" (e.g., like air conditioning can be considered to be truly optional in some cars)).

Once all of the required and desired options have been added via decision step 612 and step 614, ("No" path from decision step 612), method 600 proceeds to decision step 616, wherein it is determined whether there are more zones to specify for the selected space. The transition from decision step 612 to decision step 616 occurs when save button 1326 of FIG. 13 is pressed; this means the specifier has completed entry of all of the options for the selected zone controller (as shown in FIG. 14). This returns the specifier from screenshot 1300 to screenshot 1200. If there are additional zones to specify ("Yes" path from decision step 616), method 600 returns to step 610, wherein a new zone or range of zones is chosen or selected (screenshot 1200), and method 600 repeats steps 610, 612, and 614 for each additional zone or range of zones.

Then, if there are no additional zones for the selected space ("No" path from decision step 616), method 600 proceeds to decision step 618. In decision step 618, method 600 determines whether there are more spaces to specify. If there are additional spaces to specify ("Yes" path from decision step 618), method 600 returns to step 606 and either of screen shots 900 and 950, and specifier 112 selects a new space, and method 600 proceeds from there, as before. In order to return from screenshot 1200 to screenshot 1000, the user would press space specification screenshot 1200 return button 1204.

In addition to the above, method 600 can transition from decision step 616 to decision step 618 when either of buttons 1220 or 1222 are pressed; the pressing of space specification completion button 1222 is the equivalent of determining that the answer to decision step 618 is "No," and method 600 then proceeds from decision step 616 to decision step 620. The pressing of button 1220 is the equivalent of determining that there are no new zones for this space, but that there are more spaces to be specified. This then causes method 600 to return the specifier to step 606, and perform a selection of a new space. Method 600 would then repeat all of step 606-618 until no spaces are left to specify.

When the specifier is returned to FIG. 9A, specifier 112 can enter additional space specific information for further selected spaces, upon return to screenshot 900. Once all of the spaces have been specified, the user can save/store the information by pressing "Yes" button 908 in space specification verification window 904, which asks if all the spaces have been selected. As those of skill in the art can appreciate, such "saving" does not mean that data entered is lost if button 908 has not been pressed. "Yes" button 908 indicates that specifier 112 has completed the space-specific specifying process ("No" path from decision step 618 (described in greater detail below)), and method 600 proceeds to additional steps in the modeling process as described below. Space selection screenshot 900 return (return) button 906 is provided to return specifier 112 to previous screenshot 800 if needed.

When the specifier is returned to FIG. 9B, specifier 112 can save/store the information by pressing "Yes" button 908 in window 904, which asks if all the spaces have been selected. As those of skill in the art can appreciate, such "saving" does not mean that data entered is lost if button 908 has not been pressed. "Yes" button 908 indicates that specifier 112 has completed the space-specific specifying process ("No" path from decision step 618), and method 600 proceeds to additional steps in the modeling process as described below. Return button 906 is provided to return specifier 112 to previous screenshot 802 if needed.

If there are no additional spaces to specify, then method 600 proceeds to decision step 620, embodied as space specification document creation screenshot (screenshot) 1500, shown in FIG. 15, along with several options that can be chosen according to different aspects of the embodiments: step 622 (which is chosen by pressing save space part number sheet button 1502), wherein the space specification part number is saved as a document (space specification part number document 1600, shown in FIG. 16), and the process ends; step 624 (which is chosen by pressing print space part number sheet button 1504), wherein the space specification part number is saved as a document and printed; or step 626 (which is chosen by pressing generate space specification package button 1506), wherein the process of creating space specification package 1700 begins. Also shown in FIG. 15, is edit fields button 1508. Pressing edit fields button 1508 returns specifier 112 to screenshot 700 and step 602 of method 600. As those of skill in the art can appreciate, other methods exist for editing specific fields of a document such as those embodied by space specification part number document 1600; however, such detailed discussion is not needed in order to understand the different aspects of the embodiments, and as such, in fulfillment of the dual purposes of clarity and brevity, have been omitted from this discussion.

In step 622 ("Save" path from decision step 620), the space specification part number is saved as space specification part number document 1600 as shown in FIG. 16. As those of skill in the art can appreciate, space specification part number document 1600 can be generated and saved in many different electronic formats, such as, but not limited to a Microsoft Word document, an Adobe pdf document, a Microsoft Excel spreadsheet, as well as in Apple based formats, or text files, or any other suitable word processing or data processing program formats. Step 622 of method 600 is embodied in screenshot 1500 by pressing save space part number sheet button 1502 as shown in FIG. 15, which saves space specification part number document 1600. Following step 622, method 600 ends, and returns specifier 112 to screenshot 506, shown in FIG. 4, method 400, and method step 404.

In step 624 ("Print and Save" path from decision step 620), the space specification part number is saved as space specification part number document 1600 as shown in FIG. 16 and printed. As those of skill in the art can appreciate, space specification part number document 1600 can be generated and saved in many different electronic formats, such as, but not limited to a Microsoft Word document, an Adobe pdf document, a Microsoft Excel spreadsheet, as well as in Apple based formats, or text files, or any other suitable word processing or data processing program formats. Step 624 is embodied in screenshot 1500 by pressing save and print button 1504, which saves and prints space specification part number document 1600. Following step 624, method 600 ends, and returns specifier 112 to screenshot 506, shown in FIG. 4, method 400, and method step 404.

In step 626, however ("Create Space Spec. Pack." path from decision step 620), method 600 proceeds with several other steps in creating a new document with additional subject matter than that which is shown in space specification part number document 1600 in FIG. 16. Step 626 is embodied in screenshot 1500 by pressing generate space specification document button (button) 1506. Pressing button 1506 causes steps 622-642 to occur to create space specification package 1700. Each of steps 622-642 will be discussed in turn. As discussed above, specifier 112 can press edit fields button 1508 if it is desired to check/change one or more of the fields of space specification part number document 1600 prior to completing space specification package 1700.

The new document, space specification package 1700, is shown in FIG. 17. Space specification package 1700 comprises several parts, including cover sheet 1702 (which is essentially the same information as shown in space specification part number document 1600 in FIG. 16), summary bill of materials (BOM) section 1704, space specification P/N section 1706, line drawing section 1708, construction specification institute (CSI) specification section 1710, sequence of operations section 1712, cut sheets section 1714, and design sheet 1716. Each will be described in turn.

An example of cover sheet 1702 that is part of space specification package 1700 is shown in FIG. 18. Cover sheet 1702 can include such information as job name, SO number, references to engineering documents, job information, among other types of information pertinent to a specification cover sheet.

An example of summary bill of materials (BOM) section 1704 that is part of space specification package 1700 is shown in FIG. 19. Summary BOMs section 1704 can include such information as quantity of each item ordered, space location (space #), SpaceBuilder (SB) part number, destination location, project name, location, quote #, sales rep., and other pertinent information that can be part of a bill of materials as known to those of skill in the art.

An example of space specification P/N section 1706 that is part of space specification package 1700 is shown in FIG. 20. Space specification p/n section 1706 can include such information as general system type (GLPAC, GLPP, GLDALI, among others, all manufactured by Crestron Electronics, of Rockleigh, N.J.) that is based on load control type. Other information can include the number of control zones, and emergency zones, if required, as well as specific sensors and numbers of sensors, touchscreen options, and other options such as interfaces to shades, AV, control of plug loads, and energy management. The part number then follows the interface types and sequence of operation.

An example of line drawing section 1708 that is part of space specification package 1700 is shown in FIG. 21 (FIG. 21 shows a portion of a line drawing, not the complete page). Line drawing section 1708 can include such information as the total number of high voltage zones, control devices such as keypads and sensors, and network connections to the GLNET, among other information. Line drawing section 1708 illustrates one or both of a location of installation of devices and a method of installation of devices.

An example of a cover sheet of a CSI specification section 1710 that is part of space specification package 1700 is shown in FIG. 22. CSI specification section 1710 can include such information that includes how the lighting control system will be designed and what products are to be utilized. In a SpaceBuilder CSI specification, certain items such as packaging rooms in their own box, and units arriving preprogrammed are included, in addition to the technical details of the Crestron product offering. This allows the consultant to specify a more efficient lighting control system in design, install, and commissioning and pass along these benefits to their customer.

An example of sequence of operations section 1712 that is part of space specification package 1700 is shown in FIG. 23 (FIG. 23 illustrates a portion of a complete sequence of operations section 1712 for a particular installation). Sequence of operations section 1712 can include such information as how each button press will control the lighting zones in each space, whether the control will be switching, dimming or a preset, as well as sensor timing and global integration to BAS systems or other BMS, BAS, or PMS systems for building management.

An example of cut sheets section 1714 that is part of space specification package 1700 is shown in FIG. 24. Cut sheets section 1714 can include such information as detailed specification information for individual products that make up the SpaceBuilder project according to aspects of the embodiments. According to aspects of the embodiments, such cut sheet information, as shown in FIG. 24, includes generalized information that highlights the features of a particular controller, or other components of the system being installed, e.g., an LCS, but not so limited thereto. For example, cuts sheet 1714 shown in FIG. 24 includes such generalized information about a keypad, C2N-CBD-P, as manufactured by Crestron Electronics, Incl., of Rockleigh, N.J., including that it can be connected wirelessly to other components using CrestNet, a proprietary wired connectivity platform for use with many devices manufactured by Crestron Electronics, Inc.

Design sheet 1716 is created through operation of the design tool as described in reference to FIG. 29. Design sheet 1716 will contain information about any design changes that might need to be made to any of the components of space specification part number 1303; for example, if there is programming required for any of the programmers, the programming would be briefly described in design sheet 1716, and reference provided to file names and locations, and other details that could be useful as can be appreciated by those of skill in the art.

In step 626, as described above, the process of creating space specification package 1700 begins. In step 626, method 600 assembles the information needed to create cover sheet 1702. The information needed to create cover sheet 1702 is obtained from data that is entered by the system designer or engineer. Cover sheet information can include job name, job location, sales order number (provided by order processing), the source of the specification of the job, including plan numbers, and specification dates. Additional information can include the design team and project manager from the factory. As those of skill in the art can appreciate, the acquisition of data and information can be performed by programs and applications, and the data obtained therefrom can then be stored and used afterwards in generation of cover sheet 1702. The generation of cover sheet 1702 can be accomplished by any one of a plurality of word processing or data processing programs that are either available commercially (e.g., Microsoft Word, Excel, among others), or can be done by proprietary programs developed especially for this process.

In step 628, method 600 assembles the information needed to create summary of BOMs section 1704. The information needed to create summary of BOMs section 1704 is obtained from a review of the electrical plans and CSI specifications. Such information can include fixture type, fixture specs, zone configurations, sensor and user interface locations and quantity, among other information. As those of skill in the art can appreciate, the acquisition of data and information for the creation of summary of BOMs section 1704 can be performed by programs and applications, and the data obtained therefrom can then be stored and used afterwards in generation of summary of BOMs section 1704. The generation of summary of BOMs section 1704 can be accomplished by any one of a plurality of word processing or data processing programs that are either available commercially (e.g., Microsoft Word, Excel, among others), or can be done by proprietary programs developed especially for this process.

In step 630, method 600 assembles the information needed to create space specification P/N section 1706. The information needed to create space specification P/N section 1706 can be obtained, according to an embodiment, from the preceding steps of method 600, as described above. According to further aspects of the embodiments, space specification P/N section 1706 contains, among other information, space specification part number document 1600, which itself includes the information contained or entered into selected space complete part number window 1302, which includes space complete part number 1303, which itself contains the zone control type part number as entered into zone control type entry field 1212, as well as the options selected for that zone controller, as entered into option selection(s) for selected zone control type entry button(s) 1210$_1$-1210$_N$, according to aspects of the embodiments (see, FIGS. 12, 13, 16 and 17).

In step 632, method 600 assembles the information needed to create line drawing 1708. The information needed to create line drawing 1708 is obtained from a review of the bill of materials. As those of skill in the art can appreciate, the acquisition of data and information for the creation of line drawing 1708 can be performed by programs and applications, and the data obtained therefrom can then be stored and used afterwards in generation of line drawing 1708. The generation of line drawing 1708 can be accomplished by any one of a plurality of word processing or data processing programs that are either available commercially (e.g., Microsoft Word, Excel, among others), or can be done by proprietary programs developed especially for this process.

In step 634, method 600 assembles the information needed to create CSI specification section 1710. The information needed to create CSI specification section 1710 are generated by the electrical engineer and are created based upon the specific needs of the project and around the required energy, electrical codes and the specific needs of the project. As those of skill in the art can appreciate, the acquisition of data and information for the creation of CSI specification section 1710 can be performed by programs and applications, and the data obtained therefrom can then be stored and used afterwards in generation of CSI specification section 1710. The generation of CSI specification section 1710 can be accomplished by any one of a plurality of word processing or data processing programs that are either available commercially (e.g., Microsoft Word, Excel, among others), or can be done by proprietary programs developed especially for this process.

In step 636, method 600 assembles the information needed to create sequence of operations section 1712. The information needed to create sequence of operations section 1712 is obtained from a review of local, state and federal energy codes as well as specific discussions with the construction team and end user. As those of skill in the art can appreciate, the acquisition of data and information for the creation of sequence of operations section 1712 can be performed by programs and applications, and the data obtained therefrom can then be stored and used afterwards in generation of sequence of operations section 1712. The generation of sequence of operations section 1712 can be accomplished by any one of a plurality of word processing or data processing programs that are either available commercially (e.g., Microsoft Word, Excel, among others), or can be done by proprietary programs developed especially for this process.

In step 638, method 600 assembles the information needed to create or obtain cut sheets section 1714. The information needed to create cut sheets section 1714 is obtained from the bill of materials. As those of skill in the art can appreciate, the acquisition of data and information for the creation of cut sheets section 1714 can be performed by programs and applications, and the data obtained therefrom can then be stored and used afterwards in generation of cut sheets section 1714. The generation of cut sheets section 1714 can be accomplished by any one of a plurality of word processing or data processing programs that are either available commercially (e.g., Microsoft Word, Excel, among others), or can be done by proprietary programs developed especially for this process.

In step 640, all of cover sheet 1702, summary BOM section 1704, space specification P/N section 1706, line drawing section 1708, CSI specification section 1710, sequence of operations section 1712, and cut sheets section 1714 are merged into one document, and presented to specifier 112 in space specification package screenshot (screenshot) 2500, as shown in FIG. 25. A representation of space specification package 1700 is shown in FIG. 25 as package section buttons 2510-2523 (each of which corresponds to space specification package sections 1702-1716, respectively). That is, by pressing package section button 2510, cover sheet 1702 opens up, for example, and can be viewed and edited. Such word documentation processes are known to those of skill in the art and need not be repeated or discussed in detail in fulfillment of the dual purposes of clarity and brevity.

Once space specification package screenshot 2500 has been generated and presented to specifier 112, edits to the various sections as discussed above can occur, or saving or save and print functions can occur through operation of buttons 2502, 2504 ("Save (& Print) as PDF"), 2506, 2508 ("Save (& Print) as CAD") (CAD being "computer aided design," meaning using a format recognized by a known application that aids in drawing designs), and 2524, 2526 ("Save (& Print) as Other") (in step 642). Following the saving or saving and printing steps, method 600 returns again to screenshot 2500, and therein specifier can press quit button 2530 to end operation of method 600, or new enterprise or space button 2528 can be pressed that returns specifier 112 to method 400, screenshot 506, and method step 506, wherein the process of specifying enterprise spaces begins again.

In addition, as with method 400, certain ones of the plurality of steps of method 600 can also be embodied in an environment in which applications, servers, personal computers, personal electronic devices and the like are not utilized in a programmed manner; that is many aspects of method 600 will occur in a paper form. In this latter case, the new method 600' is substantially similar to that as shown in the flowchart of FIG. 6 and method 600, but there are some differences such as the absence/modification of step 640 (wherein merging occurs manually, and not via an App or other software program or function), and further wherein substantially everything is accessed physically and/or manually, even though documents and specifications and tools may reside on a computer and be accessed via word processing or spreadsheet programs, among other types.

FIG. 26 illustrates a flow chart of method 2600 for providing a quotation to a purchaser of the lighting control system using software tools and an internet webpage according to an embodiment. Use of method 2600 occurs as a result of a user—in this case an agent, or factory representative (from hereon in referred to as the "quoter")—selecting quotation tool selection button 508 in tool selection screenshot 506 (FIG. 5), which represents the selection of the "quotation" path from decision step 404 of method 400, as shown in FIG. 4. Quotation generation screenshot (screenshot) 2700, as shown in FIG. 27, appears as a result of selecting quotation tool selecting button 508.

Method 2600 begins with decision step 2602 wherein the quoter chooses to either review and process a new quote ("New Quote" path from decision step 2602), or review an existing quote ("Existing Quote" path from decision step 2602). If the new quote path is selected, method 2600 proceeds to step 2604. In step 2604, embodied as screenshot 2700 (FIG. 27), specifier 112 information is entered into specifier name field 2702. The specifier name can be selected from a pop-up window by pressing or clicking on specifier select button 2704, and highlighting the correct name. This will automatically enter the selected specifier name into specifier name field 2702. In step 2606, job information is entered into job number field 2706. The correct job number can be selected from a pop-up window by pressing or clicking on job number select button 2708, and highlighting the correct job number. This will automatically enter the selected job number into job number field 2706.

In step 2608 space part number 1303 is entered into space part number field 2710. A list of space part numbers 1303 is available by pressing or selecting space part number select button 2712, wherein a pop-up window appears and the correct space part number 1303 can be selected. In step 2610 a quantity is entered. This is embodied in screenshot 2700 by entering a quantity in space part number quantity field 2714, and by pressing enter button 2716, wherein the quantity is stored with the other entered information in screenshot 2700.

In decision step 2612, method 2600 (i.e., the quoter) determines whether additional spaces are to be quoted. If yes, then method 2600 proceeds to step 2608, wherein the space sheet part number for the new space is chosen and entered (space part number field 2710). In screenshot 2700, the return "yes" path is embodied by the quoter pressing more spaces button 2720. That is, if a specifier had additional spaces to provide quantities and quotations for, the specifier would press more spaces button 2720 to enter and temporarily store the information entered in fields 2702, 2706, 2710, and 2714. If, however, no additional spaces are to be quoted, method 2600 proceeds to step 2614 (i.e., the quoter presses save/view button 2718) wherein the quote is generated, finalized, and can be viewed in FIG. 28. "Finalizing," as those of skill in the art can appreciate, means that final approval for the quotation is provided by a person whose authority within an organization includes providing such approval.

FIG. 28 illustrates finalized quotation screenshot (screenshot) 2800 associated with an internet webpage of a finalized bill of materials/quotation document 2802 generated in accordance with the method flow chart as illustrated in FIG. 26 according to an embodiment. While in screenshot 2800, the quoter can save the finalized quote (save finalized quote button 2804), print the finalized quote (print finalized button 2806), and then return to screenshot 2700 via return button 2808. If, at any time, the quoter elects to return to previous screenshot 506 while in screenshot 2700, the quoter can press return button 2722.

If, however, the person using method 2600 wanted to see an existing quote, they would be directed to method step 2616 wherein a specification number is loaded and a bill of materials is then populated. A "populated" BOM means, as those of skill in the art can appreciate, that a blank or empty bill of materials has been filled or entries made for a particular project.

In addition, certain ones of the plurality of steps of method 2600 can also be embodied in an environment in which applications, servers, personal computers, personal electronic devices and the like are not utilized in a programmed manner; that is, many aspects of method 2600 will occur in a paper form. In this latter case, new method 2600' is substantially similar to that as shown in the flowchart of FIG. 26 and method 2600, but there are some differences such as the absence/modification of step 2616, wherein a user loads a specification number to populate a BOM; in the case of new method 2600' (the manual version), this would be done manually and without the benefit of a website App or program. Further, substantially all the tools and documents can be accessed physically and/or manually, even though documents and specifications and tools may reside on a computer and be accessed via word processing or spreadsheet programs, among other types The system and method for specifying, ordering, delivering, and installing a lighting control system according to the aspects of the embodiments as described herein, includes at least several aspects: 1) systems are specified by spaces within the enterprise wherein unique part numbers can be provided for each space within a home or building (enterprise); 2) devices are pre-programmed and ready for network installation prior to packaging; 3) devices are grouped and packaged according to space and ready to be installed and connected to an existing network, out of the box; and 4) deliveries are coordinated according to spaces.

FIG. 31 illustrates a block diagram of a plurality of screenshots associated with the methods of FIGS. 4, 6A-6C, 26, and 30 and how a user can navigate between such screenshots according to further aspects of the embodiments. In FIG. 31, the arrows indicate "movement" or transitions from one screenshot to the next in a manner as known and understood to those of skill in the art. The numbers in brackets indicate the button that must be pressed to cause the transfer or movement, with the numbers indicating which screenshot they belong to. Further, notes have been added to aid in explaining how transitions occur, and also how the flow of the associated methods operate.

FIG. 32 illustrates a flow diagram of method 3200 for using space-based specifying and quotation software tools via an internet webpage to purchase and install a lighting control system according to an embodiment. Method 3200 begins with step 3202 wherein a system is specified on a space-by-space basis. In step 3204, the specified systems can incur additional design effort, if needed, and then are configured, programmed (again, if necessary), and packaged according to their space. According to aspects of the embodiments, the additional design and programming can be performed use the SpaceBuilder product as shown in FIG. 4, and method 400, in method step 406, using the design tool, as further shown and described in regard to FIG. 29 and screenshot 2900. According to still further aspects of the embodiments, the programming that occurs, or is noted to have occurred in method step 3204 can include a simple programming of the controllers that merely illustrates a bare level of functionality that an electrician can substantially readily test. In method step 3206 the delivery of the new specified system is coordinated in delivery according to an implementation schedule and space. According to further aspects of the embodiments, the delivery can further be specified in accordance with several different phases including rough-in, trim, and finish. As those of skill in the art can appreciate, the aforementioned "phases" are terms of art associated with the industry; thus, "rough-in" generally means the first steps following construction of the foundation or walls or floors of a new enterprise (this could mean, for example, wall studs, power panels, and HVAC ductwork has been installed). The "trim" phase can mean after rough-in has been completed, and prior to painting and installation and carpeting, switches, fine-woodwork, and other "finishing" touches, and "finish" means those aforementioned finishing touches. Then, in step 3208, the specified system is installed upon delivery to the job site according to space.

By specifying a lighting control system according to a particular space and not the entire home or building (i.e., the "enterprise"), the process of designing, specifying, ordering and delivering a lighting control system is simplified. Similar spaces are repeated throughout buildings and across buildings, which allows repeatable lighting control systems to be specified, ordered, delivered, and used.

According to aspects of the embodiments as described herein, the software tool(s) can create a part number that will represent the lighting control system for an individual space, although such spaces and lighting control systems as specified can be re-used, especially within the same enterprise (e.g., a school building with a plurality of same-dimensioned classrooms). The devices that correspond to the part number can be pre-configured, pre-programmed, and packaged in a single box (whenever space permits). The lighting control system as specified by the systems and methods herein can be workable out of the box and able to be networked with other spaces or larger systems within the enterprise location according to aspects of the embodiments. According to further aspects of the embodiments, additional programming tools have been developed that provides for the configuration of a space or zone using one or more different types of electronic devices following installation. Such configuration can include initial installation of programs to making small adjustments, as required.

By delivering all devices in the same space at the same time, this will ensure that parts are better organized in the field and available when needed. Further, the tool can coordinate delivery of different spaces according to an implementation schedule or some other factor.

FIGS. 35A and 35B illustrate a portion of a conventional process flow diagram for specifying, designing, procuring, and delivering, among other process elements, of a lighting control system (process diagram) 3500. Process flow diagram 3500 would begin with a specifier creating a specification of a proposed lighting control system, which is then given to an electrical contractor in process step 3502. Upon review, the contractor would forward the specification as a request for quotation to one or more distributors in process step 3504. As those of skill in the art can appreciate, the electrical contractor would generally only forward the bill of materials to the distributor. The distributor(s) could then contact their sales representatives and forward the bill of materials to the sales representatives (in process step 3506), who then generates a quotation for the costs of the materials on the bill of materials.

Following process step 3506, process 3500 proceeds to process step 3608, wherein the quotation is returned to the distributor; following that, the distributor forwards the quotation to the contractor in process step 3510. The contractor, upon review of the quotation, then generates a "hold-for-release" purchase order (HFR PO). As those of skill in the art can appreciate, a hold-for-release order is an order in which stock has been allocated for a future ship date. Orders marked "hold-for-release" are not put into production until a firm release date has been given. Special components not normally stocked will not be procured until a firm release date has been established. Other terms can apply according to the contract, or course of business between the supplier and purchaser.

In process step 3512, the contractor forwards the HFR PO to the distributor, who then forwards the HFR PO to the sales representative in process step 3514, who then forwards it (in this case, by electronic mail, though that need not necessarily always be the case) to an order processing department of the supplier. In internal processing step 3518, which is represented by a box, the HFR PO is processed, and then sent to project engineering in process step 3520. The project engineering department reviews the HFR PO and generates a submittal, that then goes back to the distributor (step 3522), who then forwards the submittal for final review by the specifier in process step 3524. Following specifier final approval in process step 3524, the specifier forwards the submittal to the contractor, for final review and purchasing signature, in process step 3526. It can be appreciated by those of skill in the art that the aforementioned steps including 3512 through 3526 can take up to fifteen business days, or three entire work-weeks.

In process step 3528, the released PO is sent to the distributor who then forwards it to the sales representative (step 3530), who then forwards it to the order processing department in step 3532. Referring now to FIG. 35B (note that arrow A in FIGS. 35A and 35B represent the same point in the process embodied in FIGS. 35A and 35B, according to aspects of the embodiments), in process step 3534, the order processing department processes and releases the PO, then forwarding it to project engineering in process step 3536. Project engineering creates the build sets, and forwards those to order administration in process step 3538. Order administration uses the build sets to create pick material lists, that are then forwarded to production in process step 3540. Production, in internal steps 3542, generates programs that may be needed, fabricates assemblies that may need to be fabricated, and then packs all of the created product. In process step 3544, production forwards the assembled products to shipping, who then ships the assembled product, and also sends a notice to accounting in process step 3546, who can then generate a bill.

FIG. 36 illustrates that portion of the process diagram of FIG. 35A that is affected by the system and methods described herein, thereby providing process flow diagram for specifying, designing, procuring, and delivering, among other process elements, of a lighting control system according to aspects of the embodiments (process diagram) 3600. That is, FIG. 36 illustrates a first portion of the process steps of FIGS. 35A and 35B; since the steps of FIG. 35B applies equally to process diagram 3600, they have been omitted from the discussion thereof in fulfillment of the dual purposes of clarity and brevity.

Process diagram 3600 differs from process diagram 3500 in the following manner: Initially, the specifier uses method 600, among others, in process step 3502, described herein to generate space specification package 1700; in lieu of hard, physical paper documents, users of process diagram 3600 will access specific one or more portions of space specification package 1700. Thus, in process step 3502, the specifier would produce space specification package 1700, which is then forwarded to the contractor. The specifier would access and use screenshots 506, 700, 800, 900, and 950, among others, to generate space specification package 1700. Referring to method 400 of FIG. 4, this is shown as method step 406. FIG. 5 illustrates the choice of the different tools 508, 510, 516, and 518 a user can select from to perform the appropriate actions. Selecting specification tool 510, for example, leads the agent, factory representative, or specifier to transition from screenshot 506 to screenshot 700.

As described above, process step 3506 causes the specification to be forwarded to the person or entity responsible for generating the quotation; in the case of use of space specification package 1700, the agent or factory representative would selected quotation tool 508 (method step 410 of method 400), which causes the agent or factory representative to transition from screenshot 506 to screenshot 2700, and then eventually screenshot 2800, wherein finalized quotation document 2802 is shown.

Referring now to FIG. 36, in process step 3602, when the distributor releases space specification package 1700, an estimate is automatically generated (process step 3604), which is quotation document 2802, and which the distributor receives (process step 3604) and approves, and then forwards to the contractor for review in process step 3510.

Following receipt by the contractor of space specification package 1700 in process step 3510, when using method 600, space specification package 1700 is forwarded to the specifier in process step 3608; in process step 3610 the space specification package 1700 is automatically released to the contractor. Referring to the discussion above in regard to FIG. 35A, and method 3500, process steps 3608 and 3610 omits process steps 3512-3524, and about 15 days of delay. The balance of process 3500 is substantially similar with or without use of method 600, and space specification package 1700.

As should be apparent now to those of skill in the art, the different aspects of the embodiments provides a plurality of systems and methods to increase the efficiency, productivity, and cost-effectiveness of specifying one or more lighting control systems for an enterprise location. Less waste results because only those space-specific parts are packaged, delivered to and installed in the specified space. It should be further clear that the descriptions included herein should not be construed as being limited to only lighting control systems; other types of systems that can be specified and delivered in the manner as described herein include audio systems, computer network systems, heating ventilation and air conditioning systems, distance-based learning/educational systems, among many others.

FIG. 37 illustrates physical environment 3700 in which all of the systems, methods, and modes according to aspects of the embodiments, including methods 400, 600, 2600, and 3200, can be used to specify, assemble, package, deliver, and facilitate installation of an LCS, among other systems for use in enterprise locations, according to aspects of the embodiments. In FIG. 37, specifier 112 can receive information from one or more of agent 114 and factory representative 116, and use PC 3300a and server 3300b to create a unique SpaceBuilder space part numbers 1303a,b using the systems, modes, and methods, as well as the screenshots, as described above, according to aspects of the embodiments. Space part numbers 1303a,b can then be transmitted to warehouse facility 3702 via network 3400. At warehouse 3702, one or more workers, or automated "pick and place" machines, can then receive space part numbers 1303a,b and assemble the different components specified in space part number 1303 into SpaceBuilder specified packages 3704a,b. These are loaded into delivery vehicles 3706 (shown by arrows 37A,B), which are used to delivery SpaceBuilder specified packages 3704a,b to enterprise location 3710. In this case, enterprise location 3710 has at least two different spaces 3708a,b that are going to be populated with the components that make up each of packages 3704a,b, respectively. As described above, part of space part number 1303 is an identification of the zone (in this case spaces 3708a,b) to which the packages are to be delivered. Once delivered to their respective spaces 3708a,b, as indicated by arrows 37C,D, respectively, the components within each of packages 3704a,b can be installed by technicians, with a minimum of waste and loss, as described above according to aspects of the embodiments.

FIG. 33 illustrates a PC/laptop/Server (herein after, "server") 3300 suitable for use to implement methods 400, 600, 2600, and 3200 for specifying lighting control systems according to space according to an embodiment. Server 1500 includes, among other items, shell/box 3301, internal data/command bus (bus) 3304, processor(s) 3308 (those of ordinary skill in the art can appreciate that in modern server systems, parallel processing is becoming increasingly prevalent, and whereas a single processor would have been used in the past to implement many or at least several functions, it is more common currently to have a single dedicated processor for certain functions (e.g., digital signal processors) and therefore could be several processors, acting in serial and/or parallel, as required by the specific application), universal serial bus (USB) port 3310, compact disk (CD)/digital video disk (DVD) read/write (R/W) drive 3312, floppy diskette drive 3314 (though less used currently, many servers still include this device), and data storage unit 3332.

Data storage unit 3332 itself can comprise hard disk drive (HDD) 3316 (these can include conventional magnetic storage media, but, as is becoming increasingly more prevalent, can include flash drive memory device 3334, among other types), read-only memory (ROM) device(s) 3318 (these can include electrically erasable (EE) programmable ROM (EEPROM) devices, ultra-violet erasable PROM devices (UVPROMs), among other types), and random access memory (RAM) devices 3320. Usable with USB port 3310 is USB cable 3356 that can connect server 3300 via USB port 3310 to external storage device 3358. External storage device 3358 can be conventional external hard disk drive, or a flash drive type memory storage device, among others. Also usable with USB port 3310 is flash drive memory device 3334, and usable with CD/DVD R/W drive 3312 are CD/DVD diskettes 3336 (which can be both read and write-able). Usable with floppy diskette drive 3314 are floppy diskettes 3338. Each of the memory storage devices, or the memory storage media (3316, 3318, 3320, 3334, 3336, and 3338, among other types), can contain parts or components, or in its entirety, executable software programming code or application (application, or "App") 3340, which can implement part or all of the portions of methods 400, 600, 2600, and 3200 described herein. Further, processor 3308 itself can contain one or different types of memory storage devices (according to a non-limiting example), RAM device 3320) that can store all or some of the components of App 3340.

In addition to the above described components, server 3300 also comprises keyboard 3328, external display 3326, and mouse 3330. All of these components are known to those of ordinary skill in the art, and this description includes all known and future variants of these types of devices. Display 3326 can be any type of known display or presentation screen, such as liquid crystal displays (LCDs), light emitting diode displays (LEDs), plasma displays, cathode ray tubes (CRTs), among others. In addition to the above interface devices, server 3300 can include one or more user interface mechanisms such as a microphone, touch pad, touch screen, voice-recognition system, among other interactive inter-communicative devices.

User console 3324, and its components if separately provided, interface with server 3300 via server input/output (I/O) interface 3322, which can be an RS232, Ethernet, USB or other type of communications port, or can include all or some of these, and further includes any other type of communications means, presently known or further developed. Server 3300 can further include communications satellite/global positioning system (satellite) transceiver device 3350 to which is electrically connected at least one antenna 3352 (according to an embodiment, there can be at least one GPS receive-only antenna, and at least one separate satellite bi-directional communications antenna). Server 3300 can access internet 3354, either through a hard wired connection, via I/O interface 3322 directly, or wirelessly via Wi-Fi transceiver 3342, 3G/4G transceiver 3348 and/or satellite transceiver device 3350 (and their respective antennas) according to an embodiment. Server 3300 can also be part of a larger network configuration as in a global area network (GAN) (e.g., internet 3354), which ultimately allows connection to various landlines.

According to further embodiments, user console 3324 provides a means for personnel to enter commands and configuration into server 3300 (e.g., via a keyboard, buttons, switches, touch screen and/or joy stick). External display 3326 can be used to show visual representations of acquired data, and the status of applications that can be running, among other things.

Bus 3304 provides a data/command pathway for items such as: the transfer and storage of data/commands between processor 3308, Wi-Fi transceiver 3342, BT transceiver 3344, NFC transceiver 3346, internal display 3302, I/O interface 3322, USB port 3310, CD/DVD R/W drive 3312, floppy diskette drive 3314, data storage unit 3332, 3G/4G transceiver 3348 and satellite transceiver device 3350. Through bus 3304, data can be accessed that is stored in data storage unit 3332. Processor 3308 can send information for visual display to external display 3326, and the user can send commands to system operating programs/software/Apps 3340 that might reside in either processor 3308.

Server 3300, and either memory 3306 or the memory devices that comprise data storage unit 3332, can be used to implement methods 400, 600, 2600, and 3200 for specifying a lighting control system according to space according to an embodiment. Hardware, firmware, software or a combination thereof may be used to perform the various steps and operations described herein. According to an embodiment, App 3340 for carrying out the above discussed steps can be stored and distributed on multi-media storage devices such as memory devices 3316, 3318, 3320, 3334, 3336 and/or 3338 (described above) or other form of media capable of portably storing information, and storage media 3334, 3336 and/or 3338 can be inserted into, and read by, devices such as USB port 3310, and disk drives 3312, 3314, and 3316, among other types of software storage devices.

As also will be appreciated by one skilled in the art, the various functional aspects of the embodiments may be embodied in a wireless communication device, a telecommunication network, or as a method or in a computer program product. Accordingly, the embodiments may take the form of an entirely hardware embodiment or an embodiment combining hardware and software aspects. Further, the embodiments may take the form of a computer program product stored on a computer-readable storage medium having computer-readable instructions embodied in the medium. Any suitable computer-readable medium may be utilized, including hard disks, CD-ROMs, digital versatile discs (DVDs), optical storage devices, or magnetic storage devices such a floppy disk or magnetic tape. Other non-limiting examples of computer-readable media include flash-type memories or other known types of memories.

Further, those of ordinary skill in the art in the field of the embodiments can appreciate that such functionality can be designed into various types of circuitry, including, but not limited to field programmable gate array structures (FPGAs), application specific integrated circuitry (ASICs), microprocessor based systems, among other types. A detailed discussion of the various types of physical circuit implementations does not substantively aid in an understanding of the embodiments, and as such has been omitted for the dual purposes of brevity and clarity. However, as well known to those of ordinary skill in the art, the systems and methods discussed herein can be implemented as discussed, and can further include programmable devices.

Such programmable devices and/or other types of circuitry as previously discussed can include a processing unit, a system memory, and a system bus that couples various system components including the system memory to the processing unit. The system bus can be any of several types of bus structures including a memory bus or memory controller, a peripheral bus, and a local bus using any of a variety of bus architectures. Furthermore, various types of computer readable media can be used to store programmable instructions. Computer readable media can be any available media that can be accessed by the processing unit. By way of example, and not limitation, computer readable media can comprise computer storage media and communication media. Computer storage media includes volatile and nonvolatile as well as removable and non-removable media implemented in any method or technology for storage of information such as computer readable instructions, data structures, program modules or other data. Computer storage media includes, but is not limited to, RAM, ROM, EEPROM, flash memory or other memory technology, CDROM, digital versatile disks (DVD) or other optical disk storage, magnetic cassettes, magnetic tape, magnetic disk storage or other magnetic storage devices, or any other medium which can be used to store the desired information and which can be accessed by the processing unit. Communication media can embody computer readable instructions, data structures, program modules or other data in a modulated data signal such as a carrier wave or other transport mechanism and can include any suitable information delivery media.

The system memory can include computer storage media in the form of volatile and/or nonvolatile memory such as read only memory (ROM) and/or random access memory (RAM). A basic input/output system (BIOS), containing the basic routines that help to transfer information between elements connected to and between the processor, such as during start-up, can be stored in memory. The memory can also contain data and/or program modules that are immediately accessible to and/or presently being operated on by the processing unit. By way of non-limiting example, the memory can also include an operating system, application programs, other program modules, and program data.

The processor can also include other removable/non-removable and volatile/nonvolatile computer storage media. For example, the processor can access a hard disk drive that reads from or writes to non-removable, nonvolatile magnetic media, a magnetic disk drive that reads from or writes to a removable, nonvolatile magnetic disk, and/or an optical disk drive that reads from or writes to a removable, nonvolatile optical disk, such as a CD-ROM or other optical media. Other removable/non-removable, volatile/nonvolatile computer storage media that can be used in the operating environment include, but are not limited to, magnetic tape cassettes, flash memory cards, digital versatile disks, digital video tape, solid state RAM, solid state ROM and the like. A hard disk drive can be connected to the system bus through a non-removable memory interface such as an interface, and a magnetic disk drive or optical disk drive can be connected to the system bus by a removable memory interface, such as an interface.

The embodiments discussed herein can also be embodied as computer-readable codes on a computer-readable medium. The computer-readable medium can include a computer-readable recording medium and a computer-readable transmission medium. The computer-readable recording medium is any data storage device that can store data which can be thereafter read by a computer system. Examples of the computer-readable recording medium include read-only memory (ROM), random-access memory (RAM), CD-ROMs and generally optical data storage devices, magnetic tapes, flash drives, and floppy disks. The computer-readable recording medium can also be distributed over network coupled computer systems so that the computer-readable code is stored and executed in a distributed fashion. The computer-readable transmission medium can transmit carrier waves or signals (e.g., wired or wireless data transmission through the Internet). Also, functional programs, codes, and code segments to, when implemented in suitable electronic hardware, accomplish or support exercising certain elements of the appended claims can be readily construed by programmers skilled in the art to which the embodiments pertains.

FIG. 34 illustrates network system 3400 within which the system and method for specifying lighting control systems according to space can be implemented according to an embodiment. Much of the network system infrastructure shown in FIG. 34 is or should be known to those of skill in the art, so, in fulfillment of the dual purposes of clarity and brevity, a detailed discussion thereof shall be omitted.

According to an embodiment, a user of the system and method for specifying lighting control systems according to space according to an embodiment would have an App on their mobile device 3402; mobile devices 3402 can include, but are not limited to, so-called smart phones, tablets, personal digital assistants, notebook and laptop computers, and essentially any device that can access the internet and/or cellular phone service or can facilitate transfer of the same type of data in either a wired or wireless manner. For purposes of this discussion, the user shall be discussed as using only mobile device 3402, i.e., a smartphone, though such discussion should be understand to be in a non-limiting manner in view of the discussion above about the other types of devices that can access, use, and provide such information.

In FIG. 34, the user has mobile device 3402, which can access cellular service provider 3414, either through a wireless connection (cellular tower 3420) or via a wireless/wired interconnection (a "Wi-Fi" system that comprises, e.g., modulator/demodulator (modem) 3408, wireless router 3410, personal computer (PC) 3300, internet service provider (ISP) 3406, and internet 3354). Further, mobile device 3402 can include near field communication (NFC), "Wi-Fi," and Bluetooth (BT) communications capabilities as well, all of which are known to those of skill in the art. To that end, network system 3400 further includes, as many homes (and businesses) do, one or more PCs/servers 3300 that can be connected to wireless router 3410 via a wired connection (e.g., modem 3408) or via a wireless connection (e.g., Bluetooth). In addition, as those of skill in the art can appreciate, mobile device 3402 and PC 3300 are substantially similar in terms of processing, components, and communications capabilities. Modem 3408 can be connected to ISP 3406 to provide internet based communications in the appropriate format to end users (e.g., PC 3300), and which takes signals from the end users and forwards them to ISP 3406. Such communication pathways are well known and understand by those of skill in the art, and a further detailed discussion thereof is therefore unnecessary.

Mobile device 3402 can also access global positioning system (GPS) satellite 3428, which is controlled by GPS station 3424, to obtain positioning information (which can be useful for different aspects of the embodiments), or mobile device 3402 can obtain positioning information via cellular service provider 3414 using cellular tower(s) 3420 according to one or more well-known methods of position determination. Some mobile devices 3402 can also access communication satellites 3418 and their respective satellite communication systems control stations 3426 (the satellite in FIG. 34 is shown common to both communications and GPS functions) for near-universal communications capabilities, albeit at a much higher cost than convention "terrestrial" cellular services. Mobile device 3402 can also obtain positioning information when near or internal to a building (or arena/stadium) through the use of one or more of NFC/BT devices, the details of which are known to those of skill in the art. FIG. 34 also illustrates other components of network system 3400 such as plain old telephone service (POTS) provider 3412.

According to further aspects of the embodiments, network system 3400 also contains SpaceBuilder server 3300, wherein one or more processors, using known and understood technology, such as memory, data and instruction buses, and other electronic devices, can store and implement code that can implement the system and method for specifying lighting control systems according to space according to an embodiment.

The disclosed embodiments provide a system and method for specifying, ordering, pre-programming, making network-compatible, packaging, delivering, and installing a lighting control system based on a use within a space, as opposed to a plurality of spaces or based on general building/home requirements. It should be understood that this description is not intended to limit the embodiments. On the contrary, the embodiments are intended to cover alternatives, modifications, and equivalents, which are included in the spirit and scope of the embodiments as defined by the appended claims. Further, in the detailed description of the embodiments, numerous specific details are set forth to provide a comprehensive understanding of the claimed embodiments. However, one skilled in the art would understand that various embodiments may be practiced without such specific details.

Although the features and elements of aspects of the embodiments are described being in particular combinations, each feature or element can be used alone, without the other features and elements of the embodiments, or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

The above-described embodiments are intended to be illustrative in all respects, rather than restrictive, of the embodiments. Thus the embodiments are capable of many variations in detailed implementation that can be derived from the description contained herein by a person skilled in the art. No element, act, or instruction used in the description of the present application should be construed as critical or essential to the embodiments unless explicitly described as such. Also, as used herein, the article "a" is intended to include one or more items.

As described above, an encoding process is discussed in reference to methods 400, 600, 2600, and 3200, and FIGS. 4, 6, 26, and 32. The encoding process is not meant to limit the aspects of the embodiments, or to suggest that the aspects of the embodiments should be implemented following the encoding process. The purpose of the following encoding process is to facilitate the understanding of one or more aspects of the embodiments and to provide the reader with one or many possible implementations of the processed discussed herein. FIGS. 4, 6, 26, and 32 illustrate flowcharts of various steps performed during the different encoding processes. The steps of FIGS. 4, 6, 26, and 32 are not intended to completely describe the encoding process but only to illustrate some of the aspects discussed above.

As described herein are systems, modes, and methods, provided, in some embodiments, as software code (programs) that are rooted in computer technology to overcome problems specifically arising in the realm of computer networks and the physical delivery of product in regard to the specification of lighting control systems, among other types of control systems, for the use in the home, business, or other enterprise locations. That is, according to the aspects of the embodiments, the encoding provided herein provides a means for the user to acquire disparate information, and prepare a unique space part number 1303 that substantially completely specifies a control system (LCS in this case), that is unique to the particular location or zone of the enterprise location for which it is intended. Coding is provided that builds electronic relationships between different sources of information, such as control system requirements (e.g., such as those specified by the owner of the enterprise location, and other designers/engineers, among others), building layout, OSHA requirements, local regulations, environmental aspects (e.g., amount of natural light based on elevation and facing direction of windows), the capabilities of the components, and other factors, to enable the user, in this case specifier 112, to build a part number that uniquely identifies the components of the LCS that will be assembled, packaged, delivered, and then installed, all based substantially wholly on space part number 1303, according to aspects of the embodiments. Accordingly, the systems, modes, and method of the aspects of the embodiments are not merely the routine or conventional use of computer technology, including internet or other network technology.

INDUSTRIAL APPLICABILITY

To solve the aforementioned problems, the aspects of the embodiments are directed towards a system and method for specifying a lighting control system based on space.

ALTERNATE EMBODIMENTS

Alternate embodiments may be devised without departing from the spirit or the scope of the different aspects of the embodiments.

INCORPORATION BY REFERENCE

All United States patents and applications, foreign patents, and publications discussed above are hereby incorporated herein by reference in their entireties.

What is claimed is:

1. A computer implemented method for specifying two or more lighting control systems (LCS) by a specifier of an enterprise location, the enterprise location including two or more spaces, the method comprising:
    (a) receiving log-in information from the specifier at a first server on a webpage;
    (b) verifying an identity of the specifier using the received log-in information;
    (c) receiving enterprise location job information from the specifier;
    (d) receiving a space number from the specifier, wherein the space number represents a selected space of the two or more total number of spaces of the enterprise location;
    (e) receiving a controller type part number for the selected space as specified by the specifier, wherein
        the controller is adapted to control at least one of one or more of zones of the selected space of the enterprise location;
    (f) receiving a plurality of additional part numbers each of which corresponds to a plurality of additional components that can be used with the controller type, as specified by the specifier, and wherein
        each of the plurality of options represents a plurality of additional components for the selected space, and further wherein
        each of the plurality of options are entered separately and independently of each other option, and still further wherein
        each of the plurality of additional components is adapted to provide additional lighting features for the selected space of the enterprise location;
    (g) generating a unique LCS space specification part number based, in part, on the received controller type part number, the received space number of the selected space, and the plurality of options that represent the plurality of additional components;
    (h) repeating each of steps (d)-(g) for each of the total number of spaces of the enterprise location; and
    (i) creating a job specification package, wherein the step of creating a job specification package comprises
        separately packaging, by a packaging entity, each of the two or more lighting control systems for the selected two or more spaces of the enterprise location, and
        separately delivering, by a delivery entity, each of the two or more lighting control systems for the selected two or more spaces of the enterprise location to the respective spaces of the enterprise location.

2. The method according to claim 1, wherein the job specification package can be further used to quote, order, and install the lighting control systems for the selected spaces of the enterprise location.

3. The method according to claim 1, wherein the step of verifying an identity of the specifier comprises:
    using an identity verification application that accesses one or more of additional websites, and databases stored in one or more different servers to determine the identity of the specifier.

4. The method according to claim 1, wherein the enterprise location job information comprises one or more of an enterprise name and address, a job number, agent name, job location, specifier contact information, architect information, electrical engineer information, lighting designer information, and electrical contractor information.

5. The method according to claim 1, wherein the step of creating the job specification packages comprises:
    creating a cover sheet;
    creating a summary bill of materials section;
    creating an LCS space specification part number section that lists each of the two or LCS space specification part numbers for each of the two or more spaces of the enterprise location;
    creating a line drawing section for each of the two or more spaces of the enterprise location;
    creating a construction specifications institute section (CSI) for each of the two or more spaces of the enterprise location;
    creating a sequence of operations section for each of the two or more spaces of the enterprise location;
    creating a cut sheets section for each of the two or more spaces of the enterprise location, wherein
        for each of the steps of creating sections of the job specification package a computer based word processing application is used; and
    merging each of the respective sections according to a predetermined order into a single job specification package document.

6. The method according to claim 5, further comprising:
    saving and printing the job specification package.

7. The method according to claim 5, wherein the step of creating a bill of materials comprises:
    creating a list of parts as determined by the respective LCS space specification part number, wherein the LCS space specification part number is uniquely associated with a specific one of a plurality of spaces of the enterprise location, such that a substantially complete list of parts for the respective space can be uniquely identified for the space, and can be purchased, programmed, packaged, and delivered for and to the space.

8. The method according to claim 5, wherein the LCS space specification part number uniquely identifies the physical space of the enterprise location to which it is associated.

9. The method according to claim 5, wherein the line drawing section of the job specification package comprises:
    a unique line drawing for each of the two or more spaces of the enterprise location, wherein the line drawing illustrates locations of installation of each of the components of the lighting control system, any changes to or installation of power wiring of the space, any changes to or installation of control wiring of the space.

10. The method according to claim 5, wherein the sequence of operations section of the job specification package comprises:
    an order of installation of the parts for the respective space to which it is associated.

11. The method according to claim 5, wherein the cut sheets section comprises:
    a list and description thereof of one or more features of a components that is specified in the unique LCS space specification part number.

12. The method according to claim 1, further comprising:
    (j) receiving the web-page created job specification package by an LCS manufacturer as an order, and wherein the LCS manufacturer uses the web-page created job specification package to manufacture the specified LCS, as specified in the LCS space specification part number, to deliver the specified LCS, and to invoice a customer of the specified LCS, and further wherein the web-page created job specification package can be used by a project management tool of the LCS manufacturer, wherein the project management tool is adapted to access one or more of a plurality of databases created and modified as the LCS specified by the LCS space specification part number proceeds from a first of a plurality of steps of specification of the LCS, to delivery to a customer, and a last step of payment by the customer.

13. The method according to claim 1, further comprising:
(k) receiving a zone number from the specifier for the space number, wherein the zone number represents a selected zone of one or more total number of zones for the received space number, and wherein the zone number becomes part of the LCS space specification part number.

14. A system for specifying two or more lighting control systems (LCS) by a specifier of an enterprise location, the enterprise location including two or more spaces, the system comprising:
at least two or more computers, each of the two or more computers being network accessible, and wherein a first computer of the two or more computers includes a lighting control system specifying application that is accessible by the second computer through the network, and further wherein the lighting control system specifying application is adapted to
(a) receive log-in information from the specifier through a specification tool webpage;
(b) verify an identity of the specifier;
(c) receive enterprise location job information from the specifier;
(d) receive a space number from the specifier, wherein the space number represents a selected space of the two or more total number of spaces of the enterprise location;
(e) receive a controller type part number for the selected space as specified by the specifier, wherein
the controller is adapted to control at least one of one or more of zones of the selected space of the enterprise location;
(f) receive a plurality of additional part numbers each of which corresponds to a plurality of additional components that can be used with the controller type, as specified by the specifier, and wherein
each of the plurality of options represents a plurality of additional components for the selected space, and further wherein
each of the plurality of options are entered separately and independently of each other option, and still further wherein
each of the plurality of additional components is adapted to provide additional lighting features for the selected space of the enterprise location;
(g) generate and store a unique LCS space specification part number based, in part, on the received controller type part number, the received space number of the selected space, and the plurality of options that represent the plurality of additional components;
(h) repeat each of (d) (g) for each of the total number of spaces of the enterprise location; and
(i) create a job specification package adapted to
separately package, by a packaging entity, each of the two or more lighting control systems for the selected two or more spaces of the enterprise location, and further wherein the job specification package is to be used to
separately deliver, by a delivery entity, each of the two or more lighting control systems for the selected two or more spaces of the enterprise location to the respective spaces of the enterprise location.

15. The system according to claim 14, wherein the job specification package created by the job specification tool can be further used to order and invoice the lighting control systems for the selected spaces of the enterprise location via other components of the job specification tool and lighting control system specifying application.

16. The system according to claim 15, wherein the job specification package can be used to install the lighting control systems for the selected spaces of the enterprise location.

17. The system according to claim 14, wherein the job specification tool is further adapted to use an identity verification application that accesses one or more additional websites and respective webpages to determine the identity of the specifier.

18. The system according to claim 14, wherein the enterprise location job information comprises one or more of an enterprise name and address, a job number, agent name, job location, specifier contact information, architect information, electrical engineer information, lighting designer information, and electrical contractor information.

19. The system according to claim 14, wherein the job specification tool is further adapted, when creating the job specification package, to
create a cover sheet;
create a summary bill of materials section;
create an LCS space specification part number section that lists each of the two or LCS space specification part numbers for each of the two or more spaces of the enterprise location;
create a line drawing section for each of the two or more spaces of the enterprise location;
create a construction specifications institute section (CSI) for each of the two or more spaces of the enterprise location;
create a sequence of operations section for each of the two or more spaces of the enterprise location;
create a cut sheets section for each of the two or more spaces of the enterprise location, wherein
for each of the processes of creating sections of the job specification package a computer based word processing application is used, and wherein the job specification tool is further adapted to
merge each of the respective sections according to a predetermined order into a single job specification package document.

20. The system according to claim 19, wherein the job specification tool is further adapted to
save and print the job specification package.

21. The system according to claim 19, wherein the job specification tool is further adapted, when creating a bill of materials, to
create a list of parts as determined by the respective LCS space specification part number, wherein the LCS space specification part number is uniquely associated with a specific one of a plurality of spaces of the enterprise location, such that a substantially complete list of parts for the respective space can be uniquely identified for the space, and can be purchased, assembled, and delivered for and to the space.

22. The system according to claim 19, wherein the LCS space specification part number uniquely identifies the physical space of the enterprise location to which it is associated.

23. The system according to claim 19, wherein the line drawing section of the job specification package comprises:

a unique line drawing for each of the two or more spaces of the enterprise location, wherein the line drawing illustrates locations of installation of each of the components of the lighting control system, any changes to or installation of power wiring of the space, any changes to or installation of control wiring of the space.

24. The system according to claim 19, wherein the sequence of operations section of the job specification package comprises:
an order of installation of the parts for the respective space to which it is associated.

25. The system according to claim 19, wherein the cuts sheet section comprises:
a list and description thereof of one or more features of a components that is specified in the unique LCS space specification part number.

26. The system according to claim 14, wherein the lighting control system specifying application is further adapted to
(j) receive the web-page created job specification package by an LCS manufacturer as an order, and wherein the LCS manufacturer uses the web-page created job specification package to manufacture the specified LCS, as specified in the LCS space specification part number, to deliver the specified LCS, and to invoice a customer of the specified LCS, and further wherein the web-page created job specification package can be used by a project management tool of the LCS manufacturer that is part of the lighting control system specifying application, wherein
the project management tool is adapted to access one or more of a plurality of databases created and modified as the LCS specified by the LCS space specification part number proceeds from a first of a plurality of steps of specification of the LCS, to delivery to a customer.

27. The system according to claim 14, wherein the job specification tool is further adapted to
(k) receive a zone number from the specifier for the space number (608), wherein the zone number represents a selected zone of one or more total number of zones for the received space number, and wherein the zone number becomes part of the LCS space specification part number, and further wherein
the network is the Internet.

28. The system according to claim 14, wherein the lighting control system specifying application further comprises:
a quotation tool for use by one or more of an agent and factory representative, wherein the quotation tool is in the form of an application accessible via a quotation tool webpage, as a separate webpage, and wherein the quotation tool is adapted to access and utilize the job specification package and the information contained therein stored on the lighting control system server via the Network, and create a quotation document that illustrates a cost for each LCS that is part of the job specification package;
a design tool for use by a factory representative, wherein the design tool is in the form of one or more applications accessible via a design tool webpage, as separate webpages, and wherein the design tool is adapted to is adapted to access and utilize the job specification package and the information contained therein stored on the lighting control system server via the Network, and create, if necessary, design modification to one or more of the components of one or more of the LCSs that are part of the job specification package; and
a project management tool for use by a factory representative, wherein the project management tool is in the form of one or more applications accessible via a project management tool webpage, as separate webpages, and wherein the project management tool is adapted to access and utilize the job specification package and the information contained therein, as well as information provided by the design tool and quotation tool that is stored on the lighting control system server via the Network.

29. A non-transitory computer-readable medium for specifying two or more lighting control systems (LCS) by a specifier of an enterprise location, the enterprise location including two or more spaces, comprising instructions stored on one or more computers that when executed on one or more processors associated with the one or more computers, perform:
(a) receiving log-in information from the specifier at a first server on a webpage;
(b) verifying an identity of the specifier using the received log-in information;
(c) receiving enterprise location job information from the specifier;
(d) receiving a space number from the specifier, wherein the space number represents a selected space of the two or more total number of spaces of the enterprise location;
(e) receiving a controller type part number for the selected space as specified by the specifier, wherein
the controller is adapted to control at least one of one or more of zones of the selected space of the enterprise location;
(f) receiving a plurality of additional part numbers each of which corresponds to a plurality of additional components that can be used with the controller type, as specified by the specifier, and wherein
each of the plurality of options represents a plurality of additional components for the selected space, and further wherein
each of the plurality of options are entered separately and independently of each other option, and still further wherein
each of the plurality of additional components is adapted to provide additional lighting features for the selected space of the enterprise location;
(g) generating a unique LCS space specification part number based, in part, on the received controller type part number, the received space number of the selected space, and the plurality of options that represent the plurality of additional components;
(h) repeating each of steps (d)-(g) for each of the total number of spaces of the enterprise location; and
(i) creating a job specification package, wherein the step of creating a job specification package comprises
separately packaging, by a packaging entity, each of the two or more lighting control systems for the selected two or more spaces of the enterprise location, and
separately delivering, by a delivery entity, each of the two or more lighting control systems for the selected two or more spaces of the enterprise location to the respective spaces of the enterprise location, and wherein
the one or more computers are connected to a network.

\* \* \* \* \*